US012725546B2

(12) United States Patent
Lee

(10) Patent No.: US 12,725,546 B2
(45) Date of Patent: Sep. 1, 2026

(54) DISPLAY APPARATUS AND METHOD OF DETECTING CRACK IN DISPLAY APPARATUS

(71) Applicant: LG Display Co., Ltd., Seoul (KR)

(72) Inventor: SeungJin Lee, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 19/286,085

(22) Filed: Jul. 30, 2025

(65) Prior Publication Data

US 2026/0073823 A1 Mar. 12, 2026

(30) Foreign Application Priority Data

Sep. 10, 2024 (KR) ........................ 10-2024-0123101

(51) Int. Cl.

| | |
|---|---|
| ***G09G 3/00*** | (2006.01) |
| ***H10H 29/37*** | (2025.01) |
| ***H10H 29/41*** | (2025.01) |
| ***H10H 29/49*** | (2025.01) |
| ***H10W 90/00*** | (2026.01) |

(52) U.S. Cl.

CPC ............. *G09G 3/006* (2013.01); *H10H 29/37* (2025.01); *H10H 29/41* (2025.01); *H10H 29/49* (2025.01); *H10W 90/00* (2026.01); *G09G 2330/021* (2013.01); *G09G 2330/12* (2013.01)

(58) Field of Classification Search

CPC ............. G09G 3/006; G09G 2330/021; G09G 2330/12; H10H 29/37; H10H 29/41; H10H 29/49; H10W 90/00

See application file for complete search history.

(56) References Cited

U.S. PATENT DOCUMENTS

| | | | | |
|---|---|---|---|---|
| 8,791,474 | B1 | 7/2014 | Bibl et al. | |
| 11,011,085 | B2 * | 5/2021 | Lee | G09G 3/006 |
| 11,824,138 | B2 * | 11/2023 | Beak | H10H 20/814 |
| 2019/0213935 | A1 * | 7/2019 | Jung | G09G 3/006 |
| 2021/0335974 | A1 * | 10/2021 | Zhou | G09G 3/3233 |

FOREIGN PATENT DOCUMENTS

| | | | | |
|---|---|---|---|---|
| CN | 111384110 A | * | 7/2020 | H10K 50/844 |

* cited by examiner

*Primary Examiner* — Pegeman Karimi

(74) *Attorney, Agent, or Firm* — Birch, Stewart, Kolasch & Birch, LLP

(57) ABSTRACT

A display apparatus and a method of detecting a crack in the display apparatus are discussed. The display apparatus can include a substrate having a display area and a non-display area, a plurality of drive circuits disposed in a matrix form on the substrate in the display area, a plurality of insulation layers disposed on the plurality of drive circuits, a plurality of banks disposed on the plurality of insulation layers in the display area, a plurality of micro-LEDs disposed on the banks, a plurality of first crack detection lines disposed on the plurality of drive circuits in the display area and extending in a first direction, and a plurality of second crack detection lines disposed on the plurality of drive circuits in the display area and extending in a second direction intersecting the first direction.

20 Claims, 27 Drawing Sheets

S110

S130

S110

S130

DISPLAY APPARATUS AND METHOD OF DETECTING CRACK IN DISPLAY APPARATUS

CROSS-REFERENCE TO RELATED APPLICATIONS

This application claims priority to Korean Patent Application No. 10-2024-0123101 filed on Sep. 10, 2024, in the Korean Intellectual Property Office, the entire disclosure of which is hereby expressly incorporated by reference into the present application.

BACKGROUND

Field

The present disclosure relates to a display apparatus with improved crack detectability, and a method of detecting a crack in a display apparatus.

Discussion of the Related Art

Display apparatuses are being applied to various electronic apparatuses such as TVs, mobile phones, notebook computers, and tablet computers.

As the display apparatuses, there are an organic light-emitting display (OLED) configured to autonomously emit, and a liquid crystal display (LCD) that requires a separate light source.

Recently, a display apparatus including a light-emitting diode (LED) has attracted attention as a next-generation display apparatus. Since the light-emitting diode is made of an inorganic material instead of an organic material, the light-emitting diode can be quickly turned on or off, have excellent luminous efficiency, and display high-luminance images in comparison with the liquid crystal display apparatus or the organic light-emitting display apparatus.

SUMMARY OF THE DISCLOSURE

An object to be achieved by the present disclosure is to provide a display apparatus with improved crack detectability.

Another object to be achieved by the present disclosure is to provide a display apparatus, in which a crack is easily detected, which can minimize a potential defect that may be caused by the crack, improve a lifespan of the display apparatus, and operate the display apparatus with low power consumption in terms of a reduction in power consumption.

Still another object to be achieved by the present disclosure is to provide a display apparatus capable of improving reliability by minimizing or preventing impurity permeation caused by a crack.

Objects of the present disclosure are not limited to the above-mentioned objects, and other objects, which are not mentioned above, can be clearly understood by those skilled in the art from the following descriptions.

A display apparatus according to an embodiment of the present disclosure includes a substrate including a display area, and a non-display area configured to surround the display area; a plurality of drive circuits disposed in the form of a matrix on the substrate in the display area; a plurality of insulation layers disposed on the plurality of drive circuits; a plurality of banks disposed on the plurality of insulation layers in the display area; a plurality of micro-LEDs (micro light-emitting diodes) disposed on the banks; a plurality of first crack detection lines disposed on the plurality of drive circuits in the display area and extending in a first direction; and a plurality of second crack detection lines disposed on the plurality of drive circuits in the display area and extending in a second direction intersecting the first direction, in which the plurality of first crack detection lines electrically connect the plurality of drive circuits disposed in the first direction, and in which the plurality of second crack detection lines electrically connect the plurality of drive circuits disposed in the second direction.

A method of detecting a crack in a display apparatus another embodiment of the present disclosure includes a sampling signal application step of transmitting a sampling signal of a crack detection circuit to a plurality of drive circuits disposed in a display area of a display panel; a drive circuit communication step of identifying whether the plurality of drive circuits, which receive the sampling signal, each communicate with the adjacent drive circuit connected by the crack detection line and outputting a communication result as crack data; a crack data transmission step of transmitting the crack data to the adjacent drive circuit disposed in at least any one of a row direction and a column direction; and a crack detection step of transmitting the crack data to the crack detection circuit so that the crack detection circuit reads out the crack data and detects a crack occurring in the display area. Therefore, it is possible to improve crack detectability.

Other detailed matters of the example embodiments are included in the detailed description and the drawings.

According to aspects of the present disclosure, the crack detection line is disposed even in the display area, such that a crack occurring in the display area can be easily detected.

According to aspects of the present disclosure, the plurality of crack detection lines are connected to the drive circuit, such that whether the plurality of crack detection lines are cracked can be easily detected on the basis of whether the drive circuits communicate with one another.

According to aspects of the present disclosure, the region in which a crack occurs can be coordinate-mapped by positional coordinates of the drive circuits, such that even the position at which the crack can occur can be detected.

According to aspects of the present disclosure, it is possible to minimize a potential defect caused by the occurrence of a crack, improve the lifespan of the display apparatus, and operating the display apparatus with low power consumption in terms of the reduction in power consumption.

According to aspects of the present disclosure, it is possible to improve the crack detectability, minimize/prevent impurity permeation caused by a crack, and improve the reliability of the display apparatus.

The effects according to the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
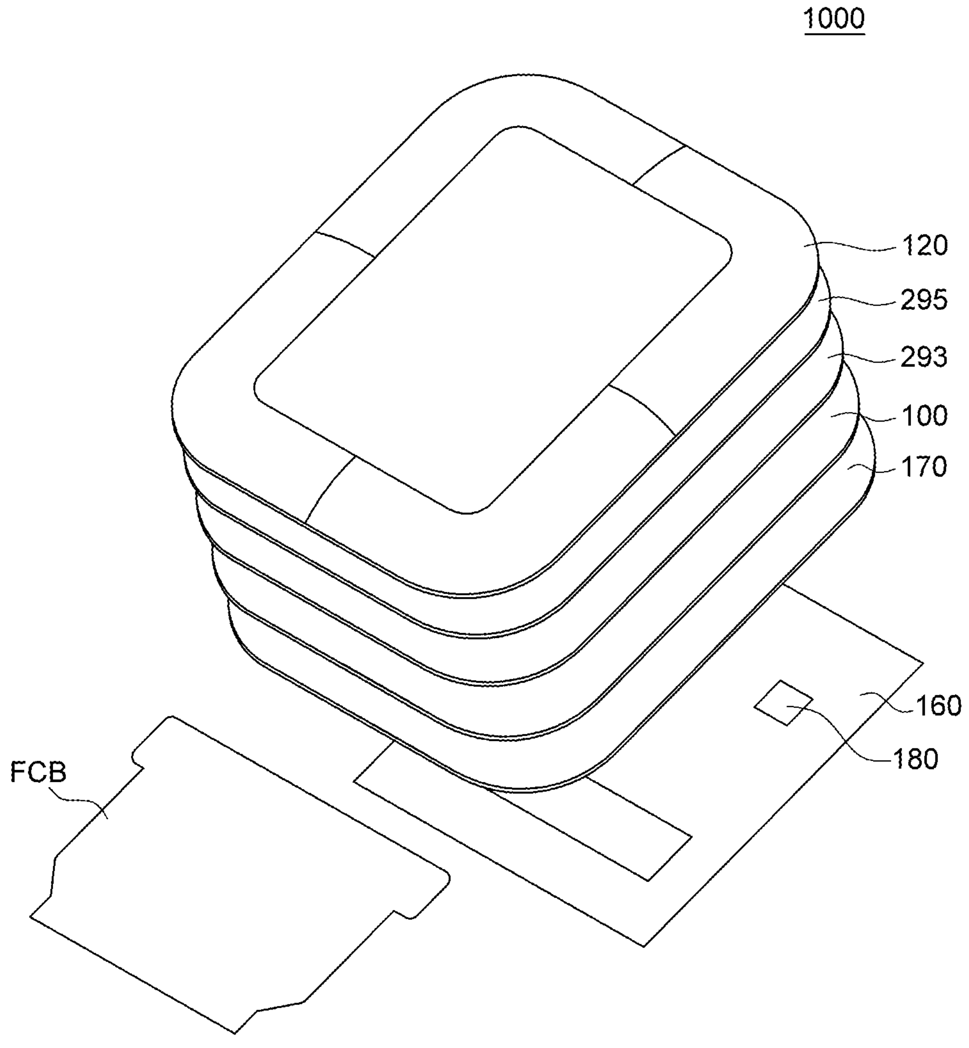
FIG. 1 is an exploded perspective view of a display apparatus according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the disclosure. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When explaining temporal relationships, terms such as "after," "following," "subsequent to," or "before," etc., can include non-consecutive cases unless terms like "immediately" or "directly" are used.

Terms such as "first," "second," etc. are used to describe various components, but these components are not limited by these terms. These terms are merely used to distinguish one component from another. Therefore, a first component mentioned herein could be a second component within the technical scope of the present disclosure.

In describing the components of the present disclosure, terms such as first, second, A, B, (a), or (b) can be used. These terms are only intended to distinguish that one component from other components, and the nature, order, sequence, or number of the respective component is not limited by these terms.

When a component is described as being "connected," "coupled," "joined," or "attached" to another component, it should be understood that the component can be directly connected, coupled, joined, or attached to the other component, but unless explicitly specified otherwise, it can also be indirectly connected, coupled, joined, or attached with another component intervening between each component.

When a component or layer is described as being "in contact with" or "overlapping" another component or layer, the component or layer can directly contact or overlap the other component or layer, but unless explicitly specified otherwise, it should be understood that it can also indirectly contact or overlap with another component intervening between each component.

The term "at least one" should be understood to include all combinations of one or more of the associated components. For example, "at least one of first, second, and third components" means not only the first, second, or third component, but also includes all combinations of two or more components from among the first, second, and third components.

The terms such as "first direction", "second direction", "third direction", "X-axis direction", "Y-axis direction", and "Z-axis direction" should not be interpreted solely as geometric relationships perpendicular to each other, but can indicate broader directionality within the range where the configuration of the present disclosure can function. Further, the term "can" fully encompasses all the meanings and coverages of the term "may" and vice versa.

The features of various embodiments in the present disclosure can be partially or wholly combined or associated with each other, various technical interlocking and operations are possible, and each embodiment can be implemented independently of each other or can be implemented together in an associated relationship.

When the relation of a time sequential order is described using the terms such as "after", "continuously to", "next to", and "before", the order may not be continuous unless the terms are used with the term "immediately" or "directly".

In describing components of the example embodiment of the present disclosure, terminologies such as first, second, A, B, (a), (b), and the like can be used. These terminologies are used to distinguish a component from the other component, but a nature, an order, or the number of the components is not limited by the terminology. When a component is "linked", "coupled", or "connected" to another component, the component can be directly linked or connected to the other component. However, unless specifically stated otherwise, it should be understood that a third component can be interposed between the components which can be indirectly linked or connected.

It should be understood that "at least one" includes all combinations of one or more of associated components. For example, "at least one of first, second, and third components" means that not only a first, second, or third component, but also all combinations of two or more of first, second, and third components are included.

In the present disclosure, a "display apparatus" can include a display apparatus which includes a display panel and a driver for driving the display panel, in a narrow sense, such as a liquid crystal module (LCM), an organic light emitting module (OLED module), and a quantum dot module (QD module). Further, the "display apparatus" can further include a set electronic apparatus or a set apparatus (or a set apparatus) which is a complete product or a final product including an LCM, an OLED module, a QD module, etc., such as a notebook computer, a television, or a computer monitor, an automotive display apparatus or equipment display apparatus including another type of vehicle and a mobile electronic apparatus including a smart phone or an electronic pad.

Accordingly, the display apparatus of the present disclosure can include not only a display apparatus itself in a narrow sense such as an LCM, an OLED module, a QD module, etc., but also an applied product or a set apparatus which is a final consumer apparatus including the LCD, the OLED module, the QD module, etc.

Further, in some cases, the LCM, the OLED module, or the QD module which is configured by a display panel and a driver can be represented as "a display apparatus" in a narrow sense and an electronic apparatus as a complete product including the LCM, the OLED module, and the QD module can be represented as a "set apparatus". For example, the display apparatus in the narrow sense includes a liquid crystal (LCD) display panel, an OLED display panel, or a quantum dot display panel and a source PCB which is a controller for driving the display panel. In contrast, the set apparatus can be a concept further including a set PCB which is a set controller which is electrically connected to the source PCB to control the entire set apparatus.

As a display panel used in the example embodiment of the present disclosure, any type of display panel such as a liquid crystal display panel, an organic light emitting diode (OLED) display panel, a quantum dot (QD) display panel, and an electroluminescent display panel can be used. The display panel of the present example embodiment is not limited to a specific display panel in which a bezel is bent with a flexible substrate for the organic light emitting diode (OLED) display panel and aback plate support structure therebelow. Further, a display panel used for the display apparatus according to the example embodiment of the present disclosure is not limited to a shape or a size of the display panel.

For example, when the display panel is an OLED display panel, the display panel can include a plurality of gate lines, data lines, and pixels formed at intersecting areas of the gate lines and/or data lines. Further, the display panel can be configured to include an array including a thin film transistor which is an element to selectively apply a voltage to each pixel, a light emitting diode layer on the array, an encapsulation substrate or an encapsulation layer, and the like disposed on the array so as to cover the light emitting diode layer. The encapsulation layer can protect the thin film transistor the light emitting diode layer, and the like from external impacts and can suppress the permeation of moisture or oxygen into the light emitting diode layer. Further, a layer formed on the array can include an inorganic light emitting layer, for example, a nano-sized material layer quantum dots, or the like.

The features of various example embodiments of the present disclosure can be partially or entirely coupled to or combined with each other and can be interlocked and operated in technically various ways, and the example embodiments can be carried out independently of or in association with each other.

Scales of components illustrated in the accompanying drawings are different from the real scales for the purpose of description, so that the scales are not limited to those illustrated in the drawings.

Hereinafter, example embodiments of the present disclosure will be described in detail with reference to the drawings. All the components of each display device/apparatus according to all embodiments of the present disclosure are operatively coupled and configured.

Figure 2:
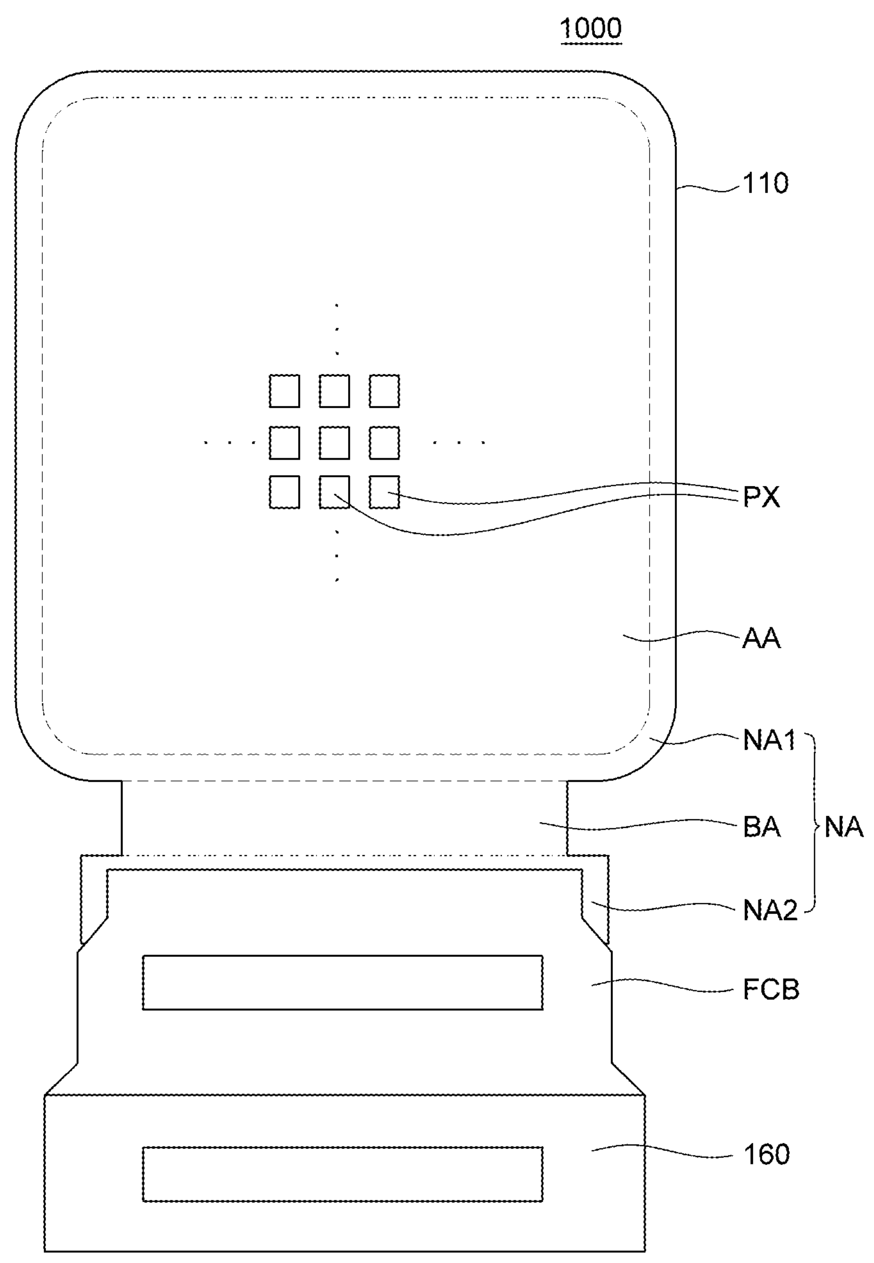
FIG. 2 is a top plan view of the display apparatus according to the embodiment of the present disclosure.
Figure 3:
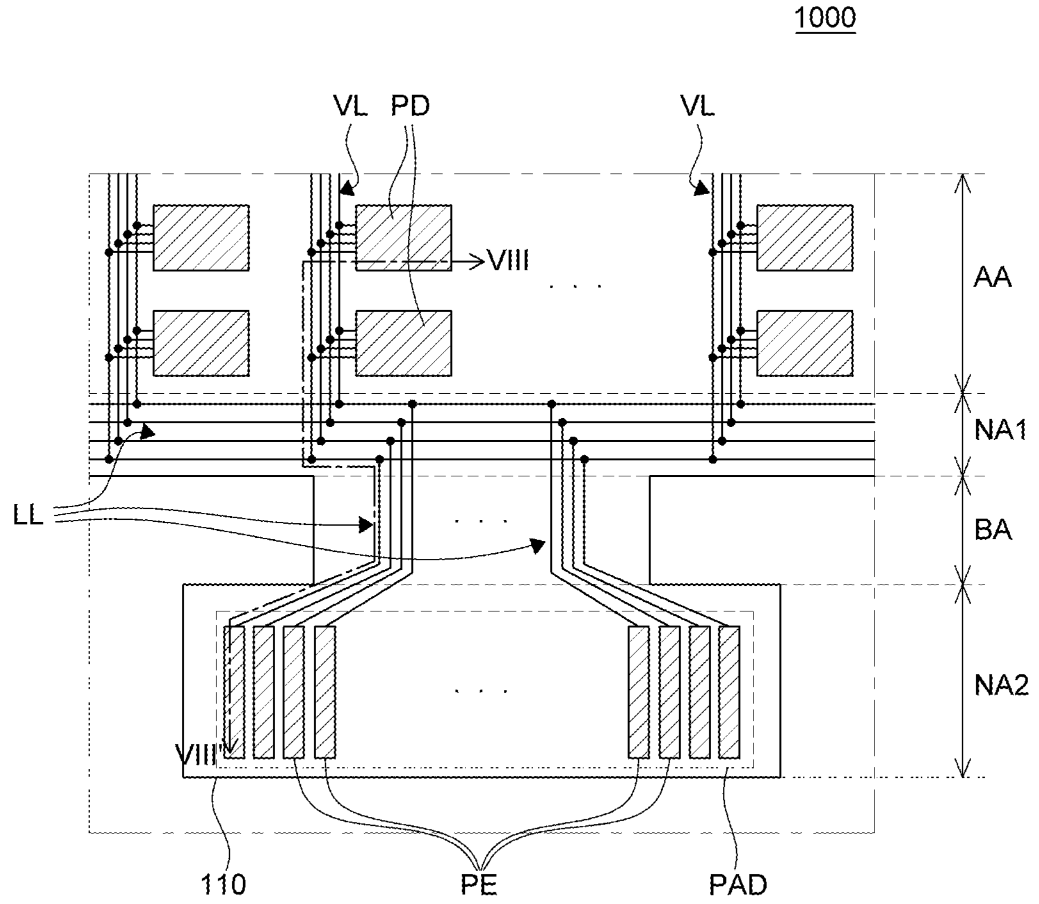
FIG. 3 is an enlarged view of the display apparatus according to the embodiment of the present disclosure.

FIG. 1 is a perspective view illustrating a display apparatus according to an embodiment of the present disclosure. FIG. 2 is a top plan view of the display apparatus according to the embodiment of the present disclosure. FIG. 3 is an enlarged view of the display apparatus according to the embodiment of the present disclosure.

With reference to FIGS. 1 to 3, a display apparatus 1000 according to an embodiment of the present disclosure can include a display panel 100, a polarizing layer 293, a bonding layer 295, a cover member 120, a support substrate 170, a flexible circuit board FCB, and a printed circuit board 160.

For example, the display panel 100 of the display apparatus 1000 can include a substrate 110. The substrate 110 can be a member configured to support other constituent elements of the display apparatus 1000. The substrate 110 can be made of an insulating material. For example, the substrate 110 can be made of glass, resin, or the like. In addition, the substrate 110 can be made of a material having flexibility. For example, the substrate 110 can be made of a plastic material, such as polyimide (PI), having flexibility. However, the embodiments of the present disclosure are not limited thereto.

The display panel 100 can implement information, videos, and/or images to be provided to a user. For example, the display panel 100 can include a display area AA (or active area) and a non-display area NA (or non-active area). For example, the substrate 110 can include the display area AA and the non-display area NA. The display area AA and the non-display area NA may not be described as being limited to the substrate 110, but the display area AA and the non-display area NA can be described for the entire display apparatus 1000.

The display area AA can be an area in which images are displayed. The display area AA can include a plurality of pixels PX. The plurality of pixels PX can each include a plurality of subpixels. A plurality of micro light emitting diodes (micro-LEDs) can be respectively disposed in the plurality of subpixels.

The non-display area NA can be an area in which no image is displayed. Various lines and circuits for operating the plurality of pixels PX in the display area AA can be disposed in the non-display area NA. For example, various types of lines and drive circuits can be mounted in the non-display area NA, and a pad part PAD, to which an integrated circuit, a printed circuit, and the like are connected, can be disposed. However, the embodiments of the present disclosure are not limited thereto.

For example, the drive circuits can be a data drive circuit and/or a gate drive circuit. However, the embodiments of the present disclosure are not limited thereto. Lines for supplying control signals for controlling the drive circuits can be disposed. For example, the control signals can include various types of timing signals including clock signals, input data enable signals, and synchronizing signals. However, the embodiments of the present disclosure are not limited thereto. The control signal can be received through the pad part PAD. For example, link lines LL for transmitting signals can be disposed in the non-display area NA. For example, drive components, such as the flexible circuit board FCB and the printed circuit board 160, can be connected to the pad part PAD.

According to the present disclosure, the non-display area NA can include a first non-display area NA1, a bending area BA, and a second non-display area NA2. For example, the first non-display area NA1 can be an area that surrounds at least a part of the display area AA. The bending area BA can be a bendable area extending from at least any one of a plurality of sides of the first non-display area NA1. The second non-display area NA2 can be an area extending from the bending area BA, and the pad part PAD can be disposed in the second non-display area NA2. For example, the bending area BA can be in a curved state, and the remaining area of the substrate 110, except for the bending area BA, can be in a flat state. In this case, as the bending area BA is curved, the second non-display area NA2 can be positioned on a rear surface of the display area AA. However, the embodiments of the present disclosure are not limited thereto.

The display area AA of the substrate 110 or the display apparatus 1000 can have various shapes in accordance with the design of the display apparatus 1000. For example, the display area AA can have a rectangular shape having four corners with round shapes. However, the embodiments of the present disclosure are not limited thereto. In another example, the display area AA can have a circular shape or a rectangular shape having four corners with right-angled shapes. However, the embodiments of the present disclosure are not limited thereto.

According to the present disclosure, a width of the second non-display area NA2 in which a plurality of pad electrodes PE is disposed can be larger than a width of the bending area BA in which only the plurality of link lines LL is disposed. In addition, a width of the display area AA in which the plurality of subpixels is disposed can be larger than a width of the bending area BA in which the plurality of link lines LL is disposed. The drawing illustrates that the width of the bending area BA can be smaller than a width of another area of the substrate 110. However, the shape of the substrate 110 including the bending area BA is illustrative, and the embodiments of the present disclosure are not limited thereto.

With reference to FIG. 3, a plurality of drive circuits PD can be disposed in the display area AA. The plurality of drive circuits PD can be circuits for operating the micro-LEDs of the plurality of subpixels. The plurality of drive circuits PD can each include a plurality of transistors including a driving transistor, and a plurality of storage capacitors. The plurality of drive circuits PD can control light-emitting operations of the plurality of micro-LEDs by supplying control signals, power, and drive currents to the micro-LEDs of the plurality of subpixels. For example, the drive circuit PD can include a power line, and a signal line for controlling light-emitting on/off operations and/or light emission time of the micro-LED. For example, the plurality of drive circuits PD can be operation drivers manufactured on a semiconductor substrate by using a metal-oxide-silicon field effect transistor (MOSFET) manufacturing process. However, the embodiments of the present disclosure are not limited thereto. The operation driver can include the plurality of drive circuits PD and operate the plurality of subpixels.

With reference to FIGS. 1 and 2 together, the flexible circuit board FCB and the printed circuit board 160 can be disposed below the display panel 100. The flexible circuit board FCB and the printed circuit board 160 can be disposed at least at one side edge of the display panel 100. However, the embodiments of the present disclosure are not limited thereto. One side of the flexible circuit board FCB can be attached to the display panel 100, and the other side of the flexible circuit board FCB can be attached to the printed circuit board 160. However, the embodiments of the present disclosure are not limited thereto. The flexible circuit board FCB can be a flexible film. However, the embodiments of the present disclosure are not limited thereto.

The pad part PAD including the plurality of pad electrodes PE can be disposed in the second non-display area NA2. The drive components including one or more flexible circuit boards (or flexible films) FCB and the printed circuit board 160 can be attached or bonded to the pad part PAD. The plurality of pad electrodes PE of the pad part PAD can be electrically connected to one or more flexible circuit boards (or flexible films) FCB and transmit various types of signals (or power) to the plurality of drive circuits PD in the display area AA from the printed circuit board 160 and the flexible circuit board (or flexible film) FCB.

The flexible circuit board (or flexible film) FCB can be a film having various types of components disposed on a base film having flexibility. For example, a drive IC, such as a gate driver IC or a data driver IC, and a timing controller configured to supply various signals to the drive IC can be disposed on the flexible circuit board (or flexible film) FCB. However, the embodiments of the present disclosure are not limited thereto. The drive IC can be a component configured to process data and driving signals for displaying images. The drive IC can be disposed in ways such as a chip-on-glass (COG) method, a chip-on-film (COF) method, or a tape carrier package (TCP) method depending on how the drive IC is mounted. However, the embodiments of the present disclosure are not limited thereto. The flexible circuit board (or flexible film) FCB can be attached or bonded to the plurality of pad electrodes PE by means of a conductive bonding layer. However, the embodiments of the present disclosure are not limited thereto.

The printed circuit board 160 can be a component electrically connected to one or more flexible circuit boards (or flexible films) FCB and configured to supply a signal to the drive IC. The printed circuit board 160 can be disposed at one side of the flexible circuit board (or flexible film) FCB and electrically connected to the flexible circuit board (or flexible film) FCB. Various types of components for supplying various signals to the drive IC can be disposed on the printed circuit board 160. For example, various components, such as a timing controller, a power source, a memory, or a processor, can be disposed on the printed circuit board 160. For example, the printed circuit board 160 can include a power management integrated circuit (PMIC). However, the embodiments of the present disclosure are not limited thereto.

The printed circuit board 160 can include at least one hole 180. However, the embodiments of the present disclosure are not limited thereto. Internal components can be disposed in an area corresponding to at least one hole 180 and detect ambient light, a temperature, or the like that can be provided to the plurality of sensors. For example, the internal components can include an ambient light sensor (ALS), a temperature sensor, or the like. However, the embodiments of the present disclosure are not limited thereto. For example, the hole 180 can be a transmission hole or the like. However, the embodiments of the present disclosure are not limited thereto.

With reference to FIG. 1, the polarizing layer 293 can be disposed on the display panel 100. The polarizing layer 293 can suppress or reduce a situation in which light generated from the external light source is introduced into the display panel 100 and affects the micro-LED or the like.

The cover member 120 can be disposed on the polarizing layer 293. The cover member 120 can be a member for protecting the display panel 100. The bonding layer 295 can be disposed between the polarizing layer 293 and the cover member 120. The cover member 120 can be attached to the display panel 100 by using the bonding layer 295. The bonding layer 295 can include an optically clear adhesive (OCA), an optically clear resin (OCR), a pressure-sensitive adhesive (PSA), or the like. However, the embodiments of the present disclosure are not limited thereto.

The support substrate 170 can be disposed between the display panel 100 and the printed circuit board 160. The support substrate 170 can reinforce the rigidity of the display panel 100. The support substrate 170 can be a backplate. However, the embodiments of the present disclosure are not limited thereto.

With reference to FIGS. 1 to 3, the plurality of link lines LL can be disposed in the non-display area NA. The plurality of link lines LL can be lines configured to transmit various types of signals to the display area AA from one or more flexible circuit boards (or flexible films) FCB and the printed circuit board 160. The plurality of link lines LL can extend from the plurality of pad electrodes PE of the second non-display area NA2 toward the bending area BA and the first non-display area NA1 and be electrically connected to a plurality of drive lines VL in the display area AA. The plurality of drive circuits PD can operate by receiving signals from one or more flexible circuit boards (or flexible films) FCB and the printed circuit board 160 through the drive lines VL in the display area AA and the link lines LL in the non-display area NA.

For example, the plurality of drive lines VL can be lines configured to transmit signals, which are outputted from the flexible circuit board (or flexible film) FCB and the printed circuit board 160, to the plurality of drive circuits PD together with the plurality of link lines LL. The plurality of drive lines VL can be disposed in the display area AA and respectively electrically connected to the plurality of drive circuits PD. The plurality of drive lines VL can extend from the display area AA toward the non-display area NA and be electrically connected to the plurality of link lines LL. Therefore, the signals outputted from the flexible circuit board (or flexible film) FCB and the printed circuit board 160 can be transmitted to the plurality of drive circuits PD through the plurality of link lines LL and the plurality of drive lines VL.

When the bending area BA is bent, the plurality of link lines LL can also be partially bent. Stress can be concentrated on a part of the bent link line LL, and therefore, the link line LL can crack. Therefore, the plurality of link lines LL can be made of an electrically conductive material that is excellent in flexibility in order to reduce the occurrence of a crack when the bending area BA is bent. For example, the plurality of link lines LL can be made of an electrically conductive material, such as gold (Au), silver (Ag), or aluminum (Al), that is excellent in flexibility. However, the embodiments of the present disclosure are not limited thereto. In addition, the plurality of link lines LL can be made of one of various electrically conductive materials used for the display area AA. For example, the plurality of link lines LL can be made of molybdenum (Mo), chromium (Cr), titanium (Ti), nickel (Ni), neodymium (Nd), copper (Cu), and an alloy of silver (Ag) and magnesium (Mg), or an alloy thereof. However, the embodiments of the present disclosure are not limited thereto. The plurality of link lines LL can have a multilayer structure including various electrically conductive material. For example, the plurality of link lines LL can have a triple layer structure made of titanium (Ti), aluminum (Al), and titanium (Ti). However, the embodiments of the present disclosure are not limited thereto.

The plurality of link lines LL can have various shapes to reduce stress. At least a part of each of the plurality of link lines LL disposed in the bending area BA can extend in a direction identical to an extension direction of the bending area BA or extend in a direction different from the extension direction of the bending area BA to reduce stress. For example, in case that the bending area BA extends in one direction from the first non-display area NA1 toward the second non-display area NA2, at least a part of the link line LL disposed in the bending area BA can extend in a direction inclined with respect to the direction along which the bending area BA extends. In another example, at least a part of each of the plurality of link lines LL can have patterns with various shapes. For example, at least a part of each of the plurality of link lines LL disposed in the bending area BA can have a shape in which conductive patterns having at least one of a diamond shape, a rhombic shape, a trapezoidal wave shape, a triangular wave shape, a serrated wave shape, a sine wave shape, a circular shape, and an omega (Ω) shape are repeatedly disposed. However, the embodiments of the present disclosure are not limited thereto. Therefore, in order to minimize stress concentrated on the plurality of link lines LL and minimize the occurrence of a crack caused by the stress, the plurality of link lines LL can have various shapes including the above-mentioned shapes. However, the embodiments of the present disclosure are not limited thereto.

Figure 4:
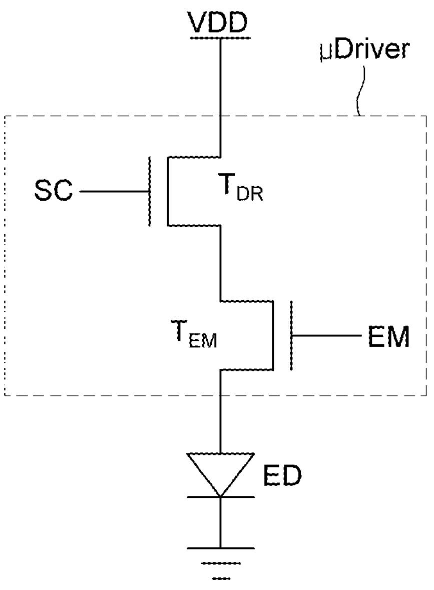
FIG. 4 is a view illustrating a circuit structure according to the embodiment of the present disclosure.

FIG. 4 is a view illustrating a circuit structure according to the embodiment of the present disclosure.

Referring to FIG. 4, the drive circuit PD can include a micro-driver μDriver. A micro-LED ED can be electrically connected to the micro-driver μDriver of the drive circuit PD and operated. FIG. 4 illustrates that one micro-LED ED is connected to the micro-driver μDriver. However, the present disclosure is not limited thereto. For example, eight micro-LEDs ED can be connected to one micro-driver μDriver. In another example, sixteen micro-LEDs ED can be connected to one micro-driver μDriver, or thirty-two micro-LEDs ED or sixty-four micro-LEDs ED can be simultaneously connected to one micro-driver μDriver.

One micro-driver μDriver can include a driving transistor $T_{DR}$ and a light-emitting transistor $T_{EM}$. However, the embodiments of the present disclosure are not limited thereto.

For example, a high-potential power voltage VDD can be applied to a first electrode of the driving transistor $T_{DR}$, a first electrode of the light-emitting transistor $T_{EM}$ can be connected to a second electrode of the driving transistor $T_{DR}$, and a scan signal SC can be applied to a gate electrode of the driving transistor $T_{DR}$. The scan signal SC applied to the gate electrode of the driving transistor $T_{DR}$ can be direct current power, and a fixed reference voltage can be applied for each frame. However, the embodiments of the present disclosure are not limited thereto.

The second electrode of the driving transistor $T_{DR}$ can be connected to the first electrode of the light-emitting transistor $T_{EM}$, the micro-LED ED can be connected to a second electrode of the light-emitting transistor $T_{EM}$, and a light emission signal EM can be applied to a gate electrode of the light-emitting transistor $T_{EM}$. The light emission signal EM applied to the gate electrode of the light-emitting transistor $T_{EM}$ can be a pulse width modulation signal that changes for each frame. However, the embodiments of the present disclosure are not limited thereto.

A first electrode of the micro-LED ED can be connected to the second electrode of the light-emitting transistor $T_{EM}$, and a second electrode of the micro-LED ED can be connected to the ground. For example, the first electrode can be an anode electrode, and the second electrode can be a cathode electrode. However, the embodiments of the present disclosure are not limited thereto.

The driving transistor $T_{DR}$ and the light-emitting transistor $T_{EM}$ can each be an n-type transistor or a p-type transistor.

The driving transistor $T_{DR}$ can be turned on by the scan signal SC applied from a timing controller T-CON to the micro-driver μDriver, and the light-emitting transistor $T_{EM}$ can be turned on by the light emission signal EM. Therefore, the drive current is applied to the micro-LED ED via the driving transistor $T_{DR}$ and the light-emitting transistor $T_{EM}$ by the high-potential power voltage VDD applied to the first electrode of the driving transistor $T_{D}$R, such that the micro-LED ED can emit light.

Figure 5:
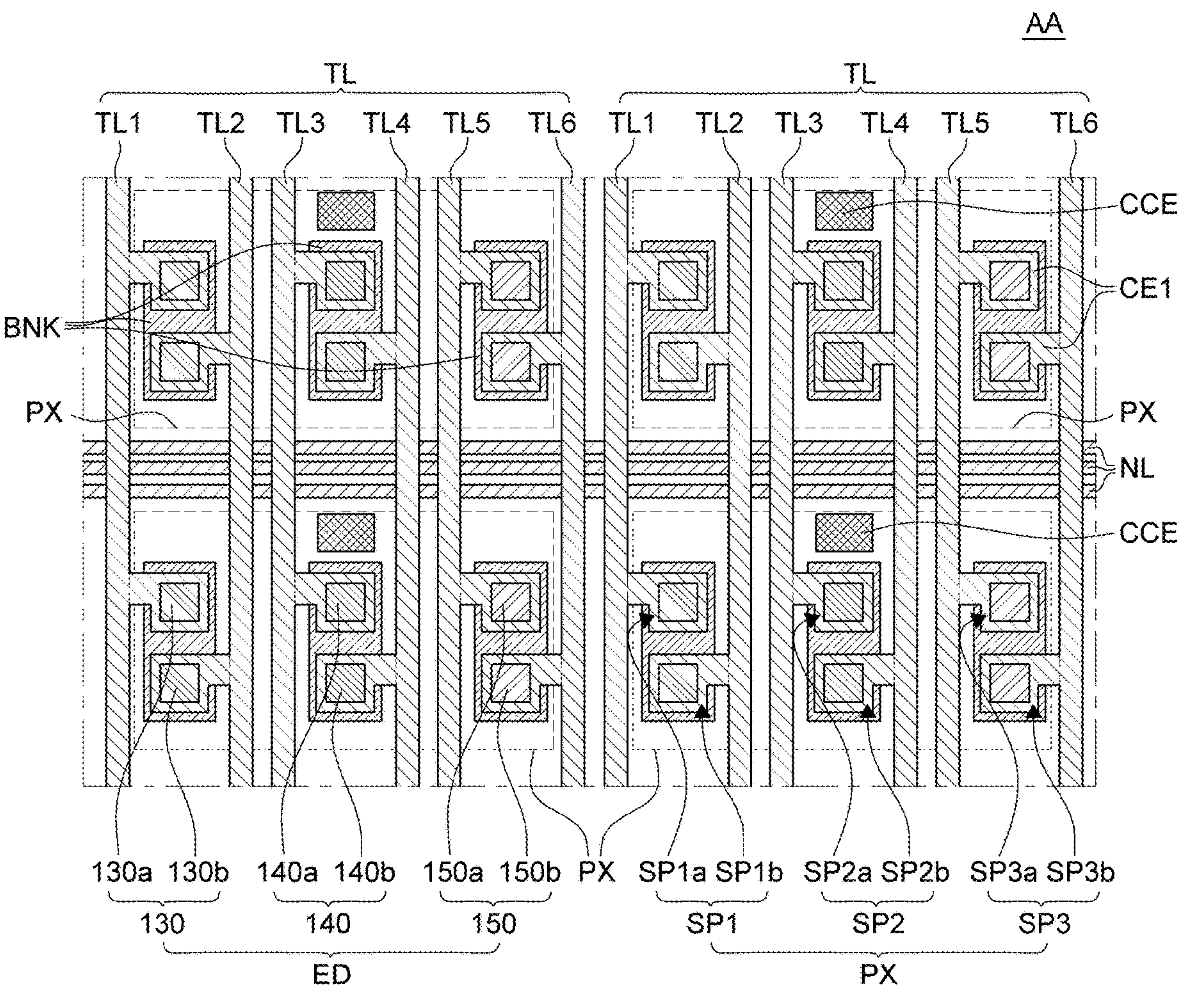
FIG. 5 is a top plan view of the display apparatus according to the embodiment of the present disclosure.
Figure 6:
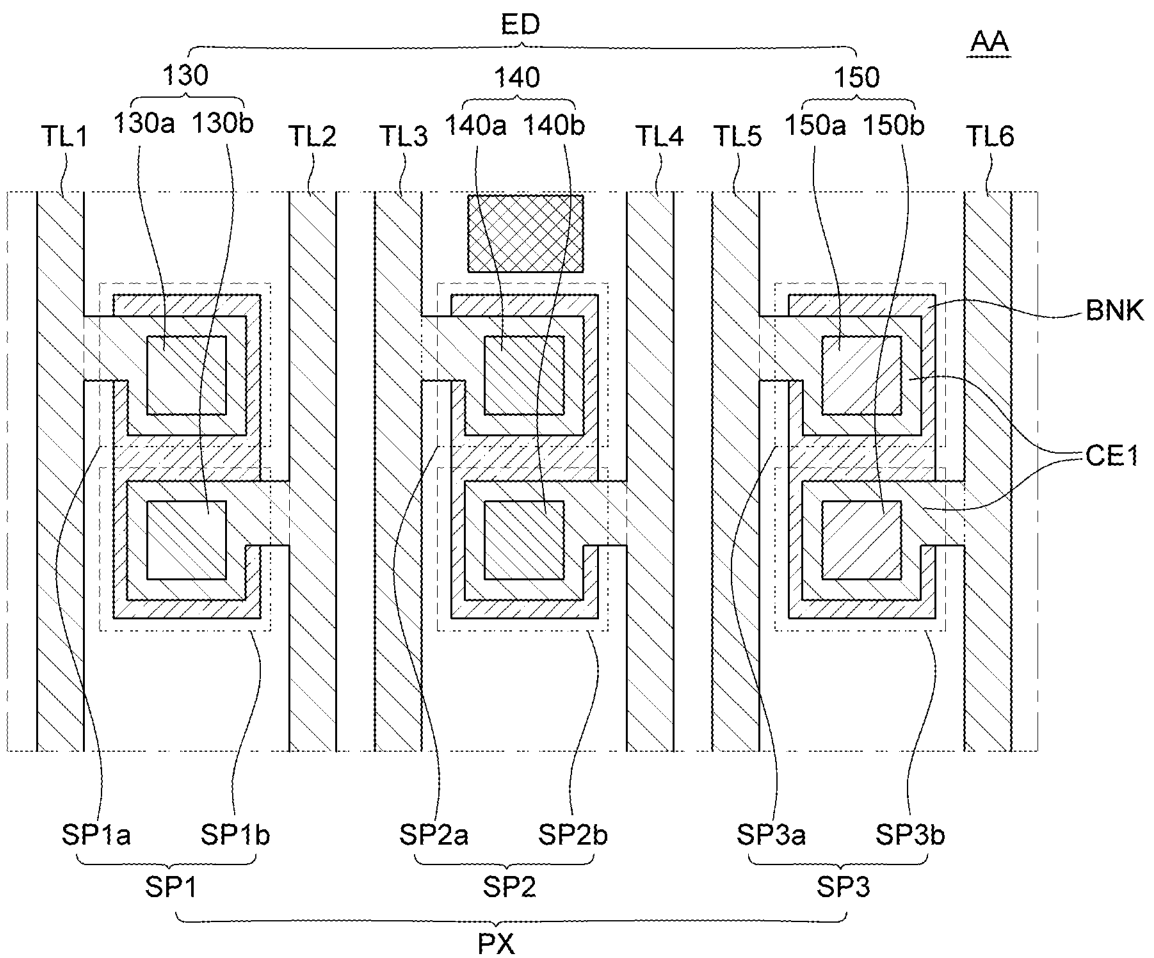
FIG. 6 is a top plan view of the display apparatus according to the embodiment of the present disclosure.
Figure 7:
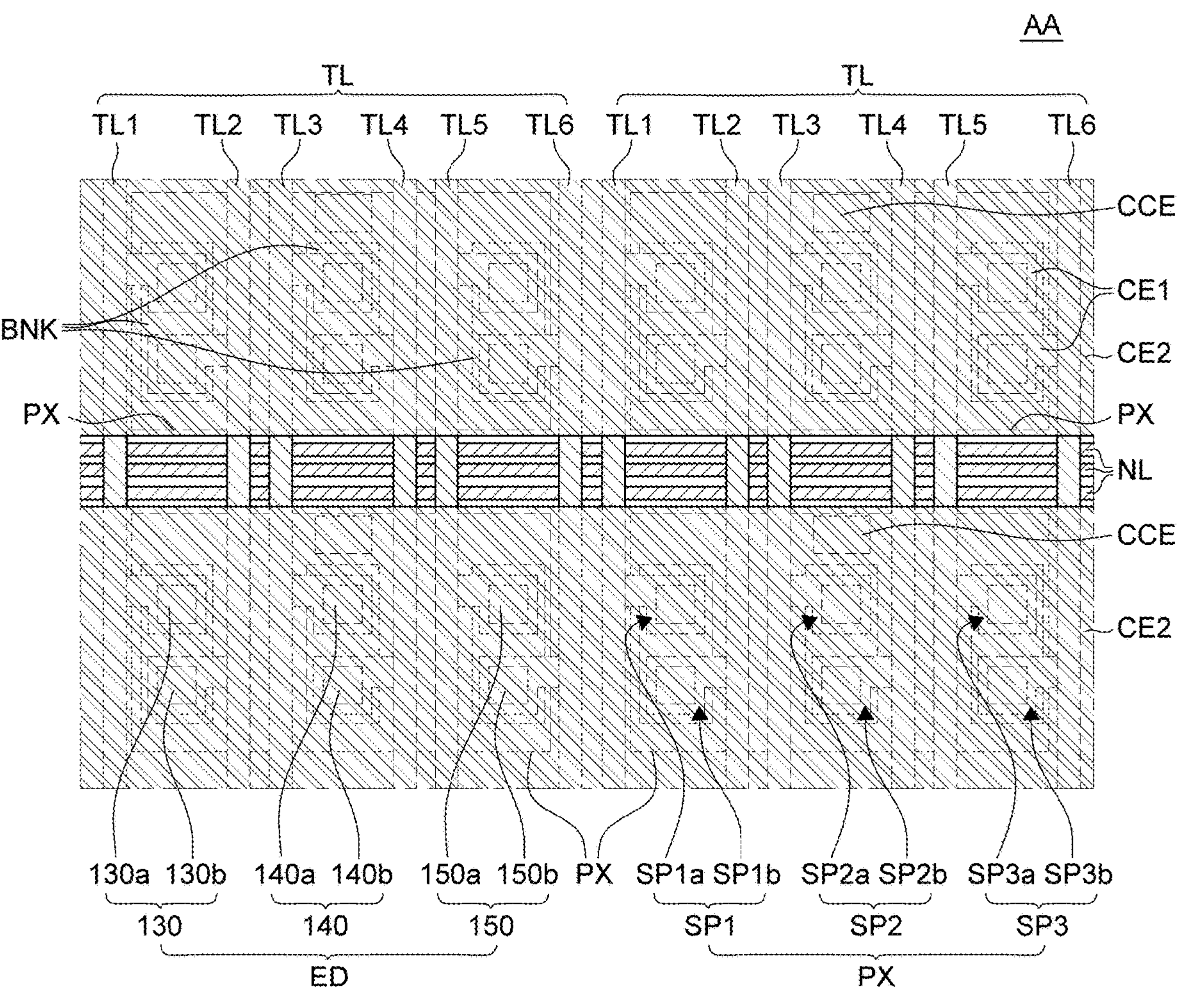
FIG. 7 is a top plan view of the display apparatus according to the embodiment of the present disclosure.

FIGS. 5 to 7 are top plan views of the display apparatus according to the embodiment of the present disclosure. For example, FIG. 5 is an enlarged top plan view of a display area including a plurality of pixels. For example, FIG. 6 is an enlarged top plan view of a display area including a single pixel. For example, FIG. 7 is an enlarged top plan view of a display area including a plurality of pixels. FIGS. 5 and 6 illustrate a plurality of signal lines TL, a plurality of communication lines NL, a plurality of first electrodes CE1, a plurality of banks BNK, and a plurality of micro-LEDs ED. However, the embodiments of the present disclosure are not limited thereto. FIG. 7 is an enlarged top plan view illustrating a state in which a plurality of second electrodes CE2 is additionally disposed in FIG. 5.

With reference to FIGS. 5 and 6, the plurality of pixels PX including the plurality of subpixels can be disposed in the display area AA. The plurality of subpixels can each include the micro-LED ED and emit light independently. The plurality of subpixels can be disposed in a plurality of rows and a plurality of columns while defining a matrix shape. However, the embodiments of the present disclosure are not limited thereto.

The plurality of subpixels can include the first subpixel SP1, the second subpixel SP2, and the third subpixel SP3. For example, any one of the first subpixel SP1, the second subpixel SP2, and the third subpixel SP3 can be a red subpixel, another subpixel can be a green subpixel, and the remaining subpixel can be a blue subpixel. The types of plurality of subpixels are illustrative. However, the embodiments of the present disclosure are not limited thereto.

The plurality of pixels PX can each include one or more first subpixels SP1, one or more second subpixels SP2, and one or more third subpixels SP3. For example, one pixel PX can include a pair of first subpixels SP1, a pair of second subpixels SP2, and a pair of third subpixels SP3. The pair of first subpixels SP1 can include a 1-1-th subpixel SP1*a* and a 1-2-th subpixel SP1*b*. The pair of second subpixels SP2 can include a 2-1-th subpixel SP2*a* and a 2-2-th subpixel SP2*b*. The pair of third subpixels SP3 can include a 3-1-th subpixel SP3*a* and a 3-2-th subpixel SP3*b*. For example, one pixel PX can include the 1-1-th subpixel SP1*a*, the 1-2-th subpixel SP1*b*, the 2-1-th subpixel SP2*a*, the 2-2-th subpixel SP2*b*, the 3-1-th subpixel SP3*a*, and the 3-2-th subpixel SP3*b*. However, the embodiments of the present disclosure are not limited thereto.

The plurality of subpixels constituting one pixel PX can be variously arranged. For example, in one pixel PX, the pair of first subpixels SP1 can be disposed in the same column, the pair of second subpixels SP2 can be disposed in the same column, and the pair of third subpixels SP3 can be disposed in the same column. The first subpixel SP1, the second subpixel SP2, and the third subpixel SP3 can be disposed in the same row. The number of and arrangement of the plurality of subpixels constituting one pixel PX are illustrative. However, the embodiments of the present disclosure are not limited thereto.

The plurality of signal lines TL can be disposed in areas between the plurality of subpixels. The plurality of signal lines TL can extend in the column direction between the plurality of subpixels. The plurality of signal lines TL can be lines configured to transmit an anode voltage from the drive circuit PD to the plurality of subpixels. For example, the plurality of signal lines TL can be electrically connected to the plurality of drive circuits PD and the first electrodes CE1 of the plurality of subpixels. The anode voltage outputted from the drive circuit PD can be transmitted to the first electrodes CE1 of the plurality of subpixels through the plurality of signal lines TL. For example, the first electrode CE1 can be an electrode electrically connected to an anode electrode 134 of the micro-LED ED. Therefore, the anode voltage from the signal line TL can be transmitted to the anode electrode 134 (see FIG. 9) of the micro-LED ED through the first electrode CE1.

Therefore, the structure of the display apparatus 1000 can be simplified by using the drive circuit PD into which a plurality of pixel circuits is integrated instead of forming a plurality of transistors and a plurality of storage capacitors in each of the plurality of subpixels. In addition, because the circuits respectively disposed in the plurality of subpixels are integrated into one drive circuit PD, the high-efficiency operation with low power consumption can be performed.

The plurality of signal lines TL can include first signal lines TL1, second signal lines TL2, third signal lines TL3, fourth signal lines TL4, fifth signal lines TL5, and sixth signal lines TL6. The first signal line TL1 and the second signal line TL2 can each be electrically connected to each of the pair of first subpixels SP1. The third signal line TL3 and the fourth signal line TL4 can each be electrically connected to each of the pair of second subpixels SP2. The fifth signal line TL5 and the sixth signal line TL6 can each be electrically connected to each of the pair of third subpixels SP3.

The first signal line TL1 can be disposed at one side of the pair of first subpixels SP1, and the second signal line TL2 can be disposed at the other side of the pair of first subpixels SP1. The first signal line TL1 can be electrically connected to one of the pair of first subpixels SP1, e.g., the first electrode CE1 of the 1-1-th subpixel SP1*a*. The second signal line TL2 can be electrically connected to the remaining one of the pair of first subpixels SP1, e.g., the first electrode CE1 of the 1-2-th subpixel SP1*b*.

The third signal line TL3 can be disposed at one side of the pair of second subpixels SP2, and the fourth signal line TL4 can be disposed at the other side of the pair of second subpixels SP2. For example, the third signal line TL3 can be disposed adjacent to the second signal line TL2. The third signal line TL3 can be electrically connected to one of the pair of second subpixels SP2, e.g., the first electrode CE1 of the 2-1-th subpixel SP2*a*. The fourth signal line TL4 can be electrically connected to the remaining one of the pair of second subpixels SP2, e.g., the first electrode CE1 of the 2-2-th subpixel SP2*b*.

The fifth signal line TL5 can be disposed at one side of the pair of third subpixels SP3, and the sixth signal line TL6 can be disposed at the other side of the pair of third subpixels SP3. For example, the fifth signal line TL5 can be disposed adjacent to the fourth signal line TL4. The sixth signal line TL6 can be disposed adjacent to the first signal line TL1 connected to the adjacent pixel PX. The fifth signal line TL5 can be electrically connected to one of the pair of third subpixels SP3, e.g., the first electrode CE1 of the 3-1-th subpixel SP3*a*. The sixth signal line TL6 can be electrically connected to the remaining one of the pair of third subpixels SP3, e.g., the first electrode CE1 of the 3-2-th subpixel SP3*b*.

The plurality of signal lines TL can be made of an electrically conductive material. For example, the plurality of signal lines TL can be made of an electrically conductive material such as titanium (Ti), aluminum (Al), copper (Cu), molybdenum (Mo), nickel (Ni), chromium (Cr), indium tin oxide (ITO), indium zinc oxide (IZO), or indium gallium zinc oxide (IGZO). However, the embodiments of the present disclosure are not limited thereto. In another example, the plurality of signal lines TL can have a multilayer structure made of an electrically conductive material. For example, the plurality of signal lines TL can have a multilayer structure made of titanium (Ti), aluminum (Al), titanium (Ti), and indium tin oxide (ITO). However, the embodiments of the present disclosure are not limited thereto.

The plurality of communication lines NL can be disposed in areas between the plurality of pixels PX. The plurality of communication lines NL can be disposed to extend in the row direction in the areas between the plurality of pixels PX. The plurality of communication lines NL can be disposed in the areas between the plurality of second electrodes CE2 and may not overlap the plurality of second electrodes CE2. For example, the plurality of communication lines NL can be lines used for short-range communication such as near field communication (NFC). The plurality of communication lines NL can serve as antennas. For example, the plurality of communication lines NL can be a plurality of connection lines and the like. However, the embodiments of the present disclosure are not limited thereto.

According to the present disclosure, the bank BNK can be disposed in each of the plurality of subpixels. The plurality of banks BNK can have structures on which the plurality of micro-LEDs ED is seated. The plurality of banks BNK can guide positions of the plurality of micro-LEDs ED during the process of transferring the plurality of micro-LEDs ED to the display apparatus 1000. The plurality of micro-LEDs ED can be transferred onto the plurality of banks BNK during the process of transferring the plurality of micro-LEDs ED. The plurality of banks BNK can be bank patterns, structures, or the like. However, the embodiments of the present disclosure are not limited thereto.

The bank BNK of the first subpixel SP1, the bank BNK of the second subpixel SP2, and the bank BNK of the third subpixel SP3 can be disposed to be spaced apart from one another. The bank BNK of the first subpixel SP1, the bank BNK of the second subpixel SP2, and the bank BNK of the third subpixel SP3 can be configured to be separated from one another. Therefore, the banks BNK of the first subpixel SP1, the second subpixel SP2, and the third subpixel SP3, to which different types of micro-LEDs ED are transferred, can be easily identified.

The bank BNK of the 1-1-th subpixel SP1*a* and the bank BNK of the 1-2-th subpixel SP1*b* can be connected to each other, spaced apart from each other, or separated from each other. For example, the bank BNK of the 1-1-th subpixel SP1*a* and the bank BNK of the 1-2-th subpixel SP1*b*, on which the micro-LEDs ED of the same type are disposed, can be connected to each other, spaced apart from each other, or separated from each other in consideration of designs such as transfer process requirements. Further, the bank BNK of the 2-1-th subpixel SP2*a* and the bank BNK of the 2-2-th subpixel SP2*b* can be connected to each other, spaced apart from each other, or separated from each other. The bank BNK of the 3-1-th subpixel SP3*a* and the bank BNK of the 3-2-th subpixel SP3*b* can be connected to each other, spaced apart from each other, or separated from each other. Therefore, the banks BNK of the pair of first subpixels SP1, the banks BNK of the pair of second subpixels SP2, and the banks BNK of the pair of third subpixels SP3 can be variously formed. However, the embodiments of the present disclosure are not limited thereto.

For example, the plurality of banks BNK can be made of an organic insulating material. The plurality of banks BNK can each be configured as a single layer or multilayer made of an organic insulating material. For example, the plurality of banks BNK can be made of photoresist, polyimide (PI), an acrylic material, or the like. However, the embodiments of the present disclosure are not limited thereto.

The first electrode CE1 can be disposed in each of the plurality of subpixels. The first electrode CE1 can be disposed on the bank BNK. The first electrode CE1 can be electrically connected to one of the plurality of signal lines TL. At least a part of the first electrode CE1 can extend to the outside of the bank BNK and be electrically connected to the signal line TL closest to the first electrode CE1. For example, a part of the first electrode CE1 of the 1-1-th subpixel SP1*a* can extend to one side area of the 1-1-th subpixel SP1*a* and be electrically connected to the first signal line TL1, and a part of the first electrode CE1 of the 1-2-th subpixel SP1*b* can extend to the other side area of the 1-2-th subpixel SP1*b* and be electrically connected to the second signal line TL2. A part of the first electrode CE1 of the 2-1-th subpixel SP2*a* can extend to one side area of the 2-1-th subpixel SP2*a* and be electrically connected to the third signal line TL3, and a part of the first electrode CE1 of the 2-2-th subpixel SP2*b* can extend to the other side area of the 2-2-th subpixel SP2*b* and be electrically connected to the fourth signal line TL4. A part of the first electrode CE1 of the 3-1-th subpixel SP3*a* can extend to one side area of the 3-1-th subpixel SP3*a* and be electrically connected to the fifth signal line TL5, and a part of the first electrode CE1 of the 3-2-th subpixel SP3*b* can extend to the other side area of the 3-2-th subpixel SP3*b* and be electrically connected to the sixth signal line TL6.

The first electrode CE1 can be electrically connected to the anode electrode 134 of the micro-LED ED and transmit the anode voltage from the drive circuit PD to the micro-LED ED through the signal line TL. Different voltages can be applied to the first electrode CE1 of each of the plurality of subpixels in accordance with the displayed images. For example, different voltages can be applied to the first electrode CE1 of each of the plurality of subpixels. Therefore, the first electrode CE1 can be a pixel electrode. However, the embodiments of the present disclosure are not limited thereto.

The first electrode CE1 can be made of an electrically conductive material. For example, the first electrode CE1 can be integrated with the plurality of signal lines TL. For example, the first electrode CE1 can be made of the same electrically conductive material as the plurality of signal lines TL. However, the embodiments of the present disclosure are not limited thereto. For example, the first electrode CE1 can be made of an electrically conductive material such as titanium (Ti), aluminum (Al), copper (Cu), molybdenum (Mo), nickel (Ni), chromium (Cr), indium tin oxide (ITO), indium zinc oxide (IZO), or indium gallium zinc oxide (IGZO). However, the embodiments of the present disclosure are not limited thereto. In another example, the first electrode CE1 can have a multilayer structure made of an electrically conductive material. For example, the plurality of first electrodes CE1 can each have a multilayer structure made of titanium (Ti), aluminum (Al), titanium (Ti), and indium tin oxide (ITO). However, the embodiments of the present disclosure are not limited thereto.

The micro-LED ED can be disposed in each of the plurality of subpixels. The plurality of micro-LEDs ED can be any one of a light-emitting diode (LED) or a micro-light-emitting diode (micro-LED). However, the embodiments of the present disclosure are not limited thereto. The plurality of micro-LEDs ED can be disposed on the bank BNK and the first electrode CE1. The plurality of micro-LEDs ED can be disposed on the first electrode CE1 and electrically connected to the first electrode CE1. Therefore, the micro-LED ED can emit light by receiving the anode voltage from the drive circuit PD through the signal line TL and the first electrode CE1.

The plurality of micro-LEDs ED can include first micro-LEDs 130, second micro-LEDs 140, and third micro-LEDs 150. The first micro-LED 130 can be disposed in the first subpixel SP1. The second micro-LED 140 can be disposed in the second subpixel SP2. The third micro-LED 150 can be disposed in the third subpixel SP3. For example, any one of the first micro-LED 130, the second micro-LED 140, and the third micro-LED 150 can be a red micro-LED, another micro-LED can be a green micro-LED, the other micro-LED can be a blue micro-LED. However, the embodiments of the present disclosure are not limited thereto. Therefore, light beams with various colors including the white color can be implemented by combining red light, green light, and blue light emitted from the plurality of micro-LEDs ED. The types of micro-LEDs ED are illustrative. However, the embodiments of the present disclosure are not limited thereto.

The first micro-LEDs 130 can include a 1-1-th micro-LED 130*a* disposed in the 1-1-th subpixel SP1*a*, and a 1-2-th micro-LED 130*b* disposed in the 1-2-th subpixel SP1*b*. The second micro-LEDs 140 can include a 2-1-th micro-LED 140*a* disposed in the 2-1-th subpixel SP2*a*, and a 2-2-th micro-LED 140*b* disposed in the 2-2-th subpixel SP2*b*. The third micro-LEDs 150 can include a 3-1-th micro-LED 150*a* disposed in the 3-1-th subpixel SP3*a*, and a 3-2-th micro-LED 150*b* disposed in the 3-2-th subpixel SP3*b*.

With reference to FIGS. 5, 6, and 7 together, the second electrode CE2 can be disposed in each of the plurality of subpixels. The second electrode CE2 can be disposed on the micro-LED ED. The second electrodes CE2 can be electrically connected to the drive circuit PD through a plurality of contact electrodes CCE.

For example, the second electrode CE2 can be electrically connected to a cathode electrode 135 (see FIG. 9) of the micro-LED ED and transmit a cathode voltage from the drive circuit PD to the micro-LED ED. The same cathode voltage can be applied to the second electrodes CE2 of the plurality of subpixels. For example, the same voltage can be applied to the second electrode CE2 and the cathode electrode 135 of the micro-LED ED in each of the plurality of subpixels. Therefore, the second electrode CE2 can be a common electrode. However, the embodiments of the present disclosure are not limited thereto.

At least some of the plurality of subpixels can share the second electrode CE2. At least some of the second electrodes CE2 of the plurality of subpixels can be electrically connected to one another. Because the same voltage is applied to the second electrodes CE2, at least some of the subpixels can use and share the second electrode CE2. For example, the second electrodes CE2 of at least some pixels PX of the plurality of pixels PX disposed in the same row can be connected to each other. For example, one second electrode CE2 can be disposed in a plurality of pixels PX. One second electrode CE2 can be disposed for every n subpixels.

For example, some of the second electrodes CE2 of the plurality of subpixels can be disposed to be spaced apart or separated from one another. For example, the second electrodes CE2 connected to the pixels PX disposed in an n-th row and the second electrodes CE2 connected to the pixels PX disposed in an (n+1)th row can be disposed to be spaced apart or separated from one another. For example, the plurality of second electrodes CE2 can be disposed to be spaced apart from one another with the plurality of communication lines NL interposed therebetween and extending in the row direction. Therefore, the number of subpixels can be larger than the number of second electrodes CE2. In another example, all the second electrodes CE2 in the plurality of subpixels can be connected to one another, and only one second electrode CE2 can be disposed on the substrate 110. However, the embodiments of the present disclosure are not limited thereto.

The plurality of second electrodes CE2 can be made of a transparent electrically conductive material. However, the embodiments of the present disclosure are not limited thereto. The plurality of second electrodes CE2 can be made of a transparent electrically conductive material, and the light emitted from the micro-LED ED can be directed toward an upper side of the second electrode CE2. For example, the second electrode CE2 can be made of a transparent electrically conductive material such as indium tin oxide (ITO), indium zinc oxide (IZO), or indium gallium zinc oxide (IGZO). However, the embodiments of the present disclosure are not limited thereto.

The plurality of contact electrodes CCE can be disposed on the substrate 110. For example, the plurality of contact electrodes CCE can be disposed to be spaced apart from the plurality of banks BNK and the plurality of signal lines TL. The plurality of second electrodes CE2 can each overlap at least one contact electrode CCE. For example, one second electrode CE2 can overlap the plurality of contact electrodes CCE.

For example, the plurality of contact electrodes CCE can be electrically connected to the plurality of second electrodes CE2. The plurality of contact electrodes CCE can be disposed between the substrate 110 and the plurality of second electrodes CE2 and transmit the cathode voltage from the drive circuit PD to the second electrode CE2.

For example, the display apparatus 1000 can be manufactured by forming a plurality of micro-LEDs on a wafer and transferring the micro-LED to the substrate 110 of the display apparatus 1000. Various types of defects can occur during the process of transferring the plurality of micro-LEDs ED having fine sizes to the substrate 110. For example, a non-transfer defect, which is caused when the micro-LEDs ED are not transferred, can occur in some of the subpixels, and a defect, in which the micro-LEDs ED are transferred while deviating from exact positions, can occur because of alignment errors in some of the subpixels. In addition, the transferred micro-LED ED can be defective even though the transfer process is normally performed. Therefore, the plurality of micro-LEDs ED of the same type can be transferred to one subpixel in consideration of defects occurring during the process of transferring the plurality of micro-LEDs ED. A lighting inspection can be performed on the plurality of micro-LEDs ED, and only one micro-LED ED, which is finally determined as being normal, can be used.

For example, both the 1-1-th micro-LED 130*a* and the 1-2-th micro-LED 130*b* are transferred to one pixel PX, and whether the 1-1-th micro-LED 130*a* and the 1-2-th micro-LED 130*b* are defective can be inspected. If both the 1-1-th micro-LED 130*a* and the 1-2-th micro-LED 130*b* are determined as being normal, only the 1-1-th micro-LED 130*a* can be used, and the 1-2-th micro-LED 130*b* may not be used. In another example, in case that only the 1-2-th micro-LED 130*b* between the 1-1-th micro-LED 130*a* and the 1-2-th micro-LED 130*b* is determined as being normal, the 1-1-th micro-LED 130*a* may not be used, and only the 1-2-th micro-LED 130*b* can be used. Therefore, only one micro-LED ED can be finally used even though the plurality of micro-LEDs ED of the same type are transferred to one pixel PX.

Therefore, any one of the pair of micro-LEDs ED can be a main (main or primary) micro-LED ED, and the other of the pair of micro-LEDs ED can be a redundancy micro-LED ED. The redundancy micro-LED ED can be an extra micro-LED ED transferred to prepare for a defect of the main micro-LED ED. When the main micro-LED ED is defective, the redundancy micro-LED ED can be used instead of the main micro-LED ED. Therefore, both the main micro-LED ED and the redundancy micro-LED ED are transferred to one pixel PX, which can minimize a deterioration in display quality caused by defects of the main micro-LED ED and the redundancy micro-LED ED.

For example, the 1-1-th micro-LED 130*a*, the 2-1-th micro-LED 140*a*, and the 3-1-th micro-LED 150*a* transferred to one pixel PX can be used as the main micro-LEDs ED, and the 1-2-th micro-LED 130*b*, the 2-2-th micro-LED 140*b*, and the 3-2-th micro-LED 150*b* can be used as the redundancy micro-LEDs ED.

Figure 8:
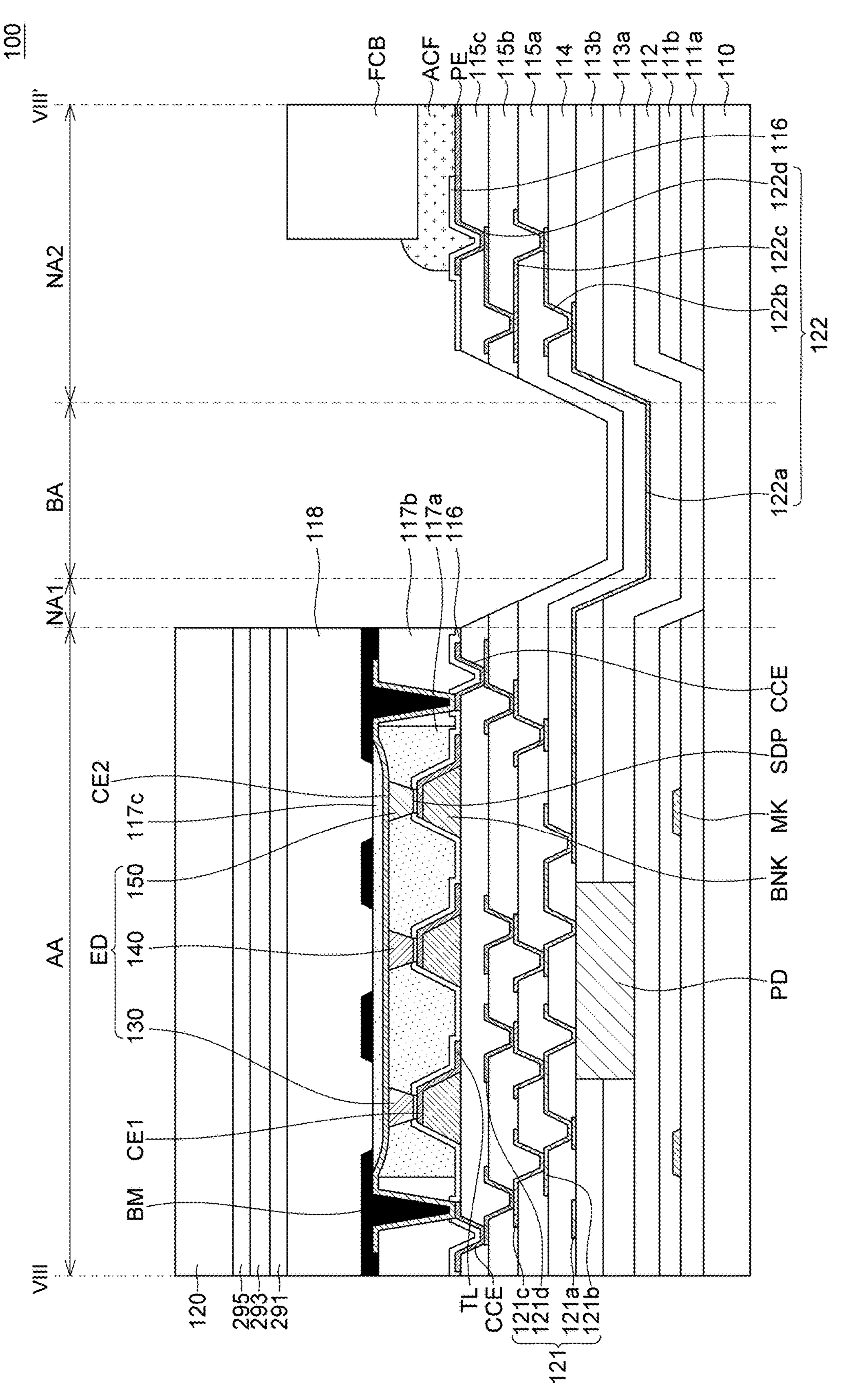
FIG. 8 is a cross-sectional view of the display apparatus according to the embodiment of the present disclosure.
Figure 9:
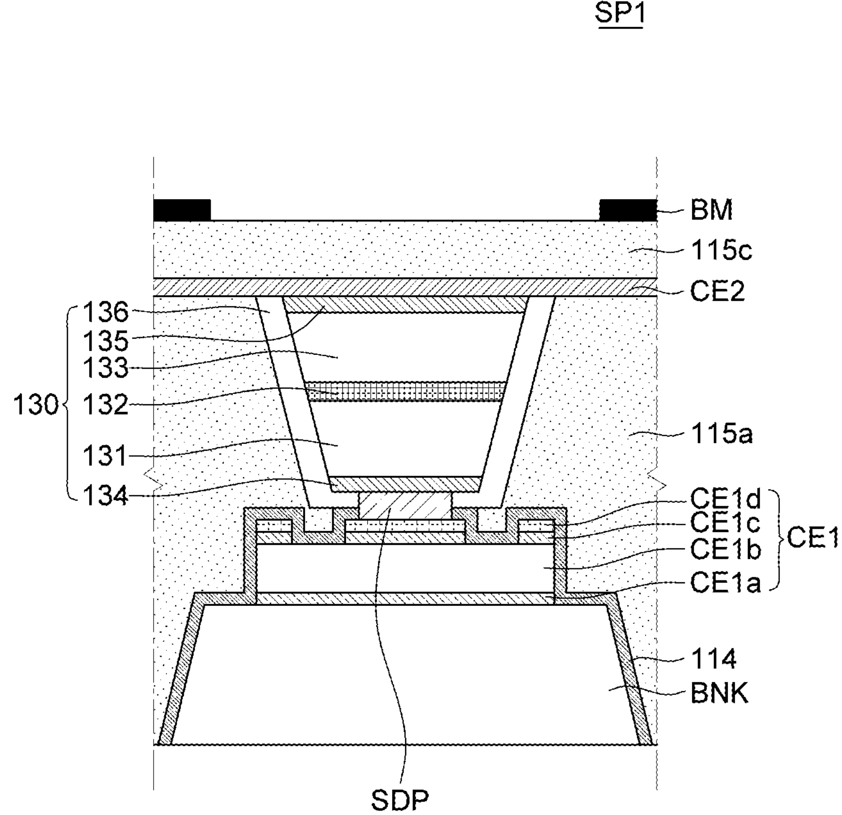
FIG. 9 is a cross-sectional view of the display apparatus according to the embodiment of the present disclosure.

FIG. 8 is a cross-sectional view taken along line VIII-VIII' in FIG. 3. FIG. 9 is a cross-sectional view of the display apparatus according to the embodiment of the present disclosure.

Particularly, FIG. 8 is a cross-sectional view of the display apparatus according to the embodiment of the present disclosure. For example, FIG. 8 is a cross-sectional view of the display area AA, the first non-display area NA1, the bending area BA, and the second non-display area NA2. For example, FIG. 9 is an enlarged cross-sectional view of the first subpixel. Meanwhile, for the convenience of illustration, FIG. 3 illustrates that the cutting line VIII-VIII', the drive line VL, and the link line LL do not overlap one another. However, the cutting line VIII-VIII' in FIG. 3 indicates the same position as the adjacent drive line VL and the adjacent link line LL.

With reference to FIG. 8, a first buffer layer 111*a* and a second buffer layer 111*b* can be disposed in the remaining area of the substrate 110, except for the bending area BA.

The first buffer layer 111*a* and the second buffer layer 111*b* can be disposed in the display area AA, the first non-display area NA1, and the second non-display area NA2. The first buffer layer 111*a* and the second buffer layer 111*b* can reduce the permeation of moisture or impurities through the substrate 110. The first buffer layer 111*a* and the second buffer layer 111*b* can be made of an inorganic insulating material. For example, the first buffer layer 111*a* and the second buffer layer 111*b* can each be configured as a single layer or multilayer made of silicon oxide (SiOx) or silicon nitride (SiNx). However, the embodiments of the present disclosure are not limited thereto.

For example, the first buffer layer 111*a* and the second buffer layer 111*b* disposed in the bending area BA can be partially removed. A top surface of the substrate 110 positioned in the bending area BA can be exposed from the first buffer layer 111*a* and the second buffer layer 111*b*. The first buffer layer 111*a* and the second buffer layer 111*b*, which are made of an inorganic insulating material, are removed from the bending area BA, which can minimize the occurrence of a crack in the first buffer layer 111*a* and the second buffer layer 111*b* that can be caused when the bending area BA is bent.

A plurality of alignment keys MK can be disposed between the first buffer layer 111*a* and the second buffer layer 111*b*. The plurality of alignment keys MK can be configured to identify a position of the drive circuit PD during the process of manufacturing the display apparatus 1000. For example, the plurality of alignment keys MK can be configured to align the position of the drive circuit PD transferred onto a bonding layer 112. In another example, the plurality of alignment keys MK can be excluded.

The bonding layer 112 can be disposed on the second buffer layer 111*b*. The bonding layer 112 can be disposed in the display area AA, the first non-display area NA1, the bending area BA, and the second non-display area NA2. In another example, at least a part of the bonding layer 112 can be removed from the non-display area NA including the bending area BA. For example, the bonding layer 112 can be made of any one of polymer (adhesive polymer), epoxy resin, UV-curable resin, polyimide, acrylate, urethane, and polydimethylsiloxane (PDMS). However, the embodiments of the present disclosure are not limited thereto.

The drive circuit PD can be disposed on the bonding layer 112 in the display area AA. In case that the drive circuit PD is implemented as an operation driver, the operation driver can be mounted on the bonding layer 112 by the transfer process. However, the embodiments of the present disclosure are not limited thereto.

A first protective layer 113*a* and a second protective layer 113*b* can be disposed on the bonding layer 112 and the drive circuit PD. The first protective layer 113*a* and the second protective layer 113*b* can be disposed to surround a side surface of the drive circuit PD. However, the embodiments of the present disclosure are not limited thereto. For example, the second protective layer 113*b* can be disposed to cover at least a part of a top surface of the drive circuit PD. For example, at least one of the first protective layer 113*a* and the second protective layer 113*b* disposed on the bending area BA can be excluded. For example, the first protective layer 113*a* can be entirely disposed in the display area AA and the non-display area NA, and the second protective layer 113*b* can be partially disposed in the display area AA, the first non-display area NA1, and the second non-display area NA2. For example, a part of the second protective layer 113*b* disposed in the bending area BA can be removed. However, the embodiments of the present disclosure are not limited thereto.

The first protective layer 113*a* and the second protective layer 113*b* can each be made of an organic insulating material. However, the embodiments of the present disclosure are not limited thereto. For example, the first protective layer 113*a* and the second protective layer 113*b* can each be made of photoresist, polyimide (PI), or a photo acrylic material. However, the embodiments of the present disclosure are not limited thereto. For example, the first protective layer 113*a* and the second protective layer 113*b* can each be an overcoating layer or an insulation layer. However, the embodiments of the present disclosure are not limited thereto.

According to the present disclosure, a plurality of first connection lines 121 can be disposed on the second protective layer 113*b* in the display area AA. The plurality of first connection lines 121 can be lines configured to electrically connect the drive circuit PD to other constituent elements. For example, the drive circuit PD can be electrically connected to the plurality of signal lines TL, the plurality of contact electrodes CCE, and the like through the plurality of first connection lines 121. For example, the plurality of first connection lines 121 can include 1-1-th connection lines 121*a,* 1-2-th connection lines 121*b,* 1-3-th connection lines 121*c*, and 1-4-th connection lines 121*d*. However, the embodiments of the present disclosure are not limited thereto.

For example, the plurality of 1-1-th connection lines 121*a* can be disposed on the second protective layer 113*b*. The plurality of 1-1-th connection lines 121*a* can be electrically connected to the drive circuit PD. The plurality of 1-1-th connection lines 121*a* can transmit a voltage, which is outputted from the drive circuit PD, to the first electrode CE1 or the second electrode CE2.

For example, a third protective layer 114 can be disposed on the second protective layer 113*b*. The third protective layer 114 can be entirely disposed in the display area AA and the non-display area NA. In the bending area BA, the third protective layer 114 can cover or surround a side surface of the second protective layer 113*b* and a top surface of the first protective layer 113*a*. The third protective layer 114 can be made of an organic insulating material. For example, the third protective layer 114 can be made of photoresist, polyimide (PI), or a photo acrylic material. However, the embodiments of the present disclosure are not limited thereto. For example, the first protective layer 113*a*, the second protective layer 113*b*, and the third protective layer 114 can be made of the same material. However, the embodiments of the present disclosure are not limited thereto. The embodiments of the present disclosure are not limited thereto.

The plurality of 1-2-th connection lines 121*b* can be disposed on the third protective layer 114. The plurality of 1-2-th connection lines 121*b* can be connected indirectly or directly to the drive circuit PD. For example, a part of the 1-2-th connection line 121*b* can be connected directly to the drive circuit PD through a contact hole of the third protective layer 114. Another part of the 1-2-th connection line 121*b* can be electrically connected to the 1-1-th connection line 121*a* through the contact hole of the third protective layer 114. However, the embodiments of the present disclosure are not limited thereto. The voltage outputted from the drive circuit PD can be transmitted to the first electrode CE1 or the second electrode CE2 through the plurality of 1-2-th connection lines 121*b* and other connection lines.

A first insulation layer 115*a* can be disposed on the plurality of 1-2-th connection lines 121*b*. The first insulation layer 115*a* can be entirely disposed in the display area AA and the non-display area NA. However, the embodiments of the present disclosure are not limited thereto. The first insulation layer 115*a* can be made of an organic insulating material. However, the embodiments of the present disclosure are not limited thereto. For example, the first insulation layer 115*a* can be made of photoresist, polyimide (PI), or a photo acrylic material. However, the embodiments of the present disclosure are not limited thereto.

The plurality of 1-3-th connection lines 121*c* can be disposed on the first insulation layer 115*a*. The plurality of 1-3-th connection lines 121*c* can be electrically connected to the plurality of 1-2-th connection lines 121*b*. For example, the 1-3-th connection line 121*c* can be electrically connected to the 1-2-th connection line 121*b* through a contact hole of the first insulation layer 115*a*.

A second insulation layer 115*b* can be disposed on the plurality of 1-3-th connection lines 121*c*. The second insulation layer 115*b* can be disposed in the remaining area, except for the bending area BA. However, the embodiments of the present disclosure are not limited thereto. The second insulation layer 115*b* can be disposed in the display area AA, the first non-display area NA1, and the second non-display area NA2. However, the embodiments of the present disclosure are not limited thereto. For example, a part of the second insulation layer 115*b* disposed in the bending area BA can be removed. The second insulation layer 115*b* can be made of an organic insulating material. However, the embodiments of the present disclosure are not limited thereto. For example, the second insulation layer 115*b* can be made of photoresist, polyimide (PI), or a photo acrylic material. However, the embodiments of the present disclosure are not limited thereto.

The plurality of 1-4-th connection lines 121*d* can be disposed on the second insulation layer 115*b*. The plurality of 1-4-th connection lines 121*d* can be electrically connected to the plurality of 1-3-th connection lines 121*c*. For example, the 1-4-th connection line 121*d* can be electrically connected to the 1-3-th connection line 121*c* through the contact hole of the second insulation layer 115*b*.

According to the present disclosure, a plurality of second connection lines 122 can be disposed on the second protective layer 113*b* in the non-display area NA. The plurality of second connection lines 122 can be lines configured to transmit the signals, which are transmitted to the pad part PAD from the flexible circuit board (or flexible film) FCB and the printed circuit board 160 (see FIG. 1), to the drive circuit PD in the display area AA. For example, the plurality of second connection lines 122 can be electrically connected to the plurality of pad electrodes PE and receive the signals from the flexible circuit board (or flexible film) FCB and the printed circuit board.

For example, the plurality of second connection lines 122 can extend from the pad part PAD toward the display area AA and transmit signals to the lines in the display area AA. In this case, the plurality of second connection lines 122 can serve as the link lines LL. The plurality of second connection lines 122 can include 2-1-th connection lines 122*a*, 2-2-th connection lines 122*b*, 2-3-th connection lines 122*c*, and 2-4-th connection lines 122*d*.

The plurality of 2-1-th connection lines 122*a* can be disposed on the second protective layer 113*b*. The plurality of 2-1-th connection lines 122*a* can extend from the second non-display area NA2 to the bending area BA and the first non-display area NA1. The plurality of 2-1-th connection lines 122*a* can transmit the signals, which are transmitted to the pad part PAD from the flexible circuit board (or flexible film) FCB and the printed circuit board 160, to the drive circuit PD in the display area AA.

The plurality of 2-2-th connection lines 122*b* can be disposed on the third protective layer 114. The plurality of 2-2-th connection lines 122*b* can be disposed in the second non-display area NA2. The 2-2-th connection line 122*b* can be electrically connected to the 2-1-th connection line 122*a* through the contact hole of the third protective layer 114. Therefore, the signals can be transmitted from the flexible circuit board (or flexible film) FCB and the printed circuit board to the 2-1-th connection line 122*a* through the 2-2-th connection line 122*b*.

The 2-3-th connection line 122*c* can be disposed on the first insulation layer 115*a*. The 2-3-th connection line 122*c* can be disposed in the second non-display area NA2. The 2-3-th connection line 122*c* can be electrically connected to the 2-2-th connection line 122*b* through the contact hole of the first insulation layer 115*a*. Therefore, the signals can be transmitted from the flexible circuit board (or flexible film) FCB and the printed circuit board to the 2-1-th connection line 122*a* through the 2-3-th connection line 122*c* and the 2-2-th connection line 122*b*.

The 2-4-th connection line 122*d* can be disposed on the second insulation layer 115*b*. The 2-4-th connection line 122*d* can be disposed in the second non-display area NA2. The 2-4-th connection line 122*d* can be electrically connected to the 2-3-th connection line 122*c* through the contact hole of the second insulation layer 115*b*. Therefore, the signals can be transmitted from the flexible circuit board (or flexible film) FCB and the printed circuit board 160 to the 2-1-th connection line 122*a* through the 2-4-th connection line 122*d*, the 2-3-th connection line 122*c*, and the 2-2-th connection line 122*b*.

The plurality of first connection lines 121 and the plurality of second connection lines 122 can be made of any one of electrically conductive materials with excellent flexibility or various electrically conductive materials used for the display area AA. For example, the second connection line 122 partially disposed in the bending area BA can be made of an electrically conductive material, such as gold (Au), silver (Ag), or aluminum (Al), that is excellent in flexibility. However, the embodiments of the present disclosure are not limited thereto. In another example, the plurality of first connection lines 121 and the plurality of second connection lines 122 can be made of molybdenum (Mo), chromium (Cr), titanium (Ti), nickel (Ni), neodymium (Nd), copper (Cu), and an alloy of silver (Ag) and magnesium (Mg), or an alloy thereof. However, the embodiments of the present disclosure are not limited thereto.

A third insulation layer 115*c* can be disposed on the plurality of first connection lines 121 and the plurality of second connection lines 122. The third insulation layer 115*c* can be disposed in the remaining area, except for the bending area BA. However, the embodiments of the present disclosure are not limited thereto. The third insulation layer 115*c* can be disposed in the display area AA, the first non-display area NA1, and the second non-display area NA2. A part of the third insulation layer 115*c* disposed in the bending area BA can be removed. The third insulation layer 115*c* can be made of an organic insulating material. However, the embodiments of the present disclosure are not limited thereto. For example, the third insulation layer 115*c* can be made of photoresist, polyimide (PI), or a photo acrylic material. However, the embodiments of the present disclosure are not limited thereto.

The plurality of banks BNK can be disposed on the third insulation layer 115*c* in the display area AA. The plurality of banks BNK can be disposed to overlap the plurality of subpixels. One or more micro-LEDs ED of the same type can be disposed above the plurality of banks BNK.

The plurality of signal lines TL can be disposed on the third insulation layer 115*c* in the display area AA. The plurality of signal lines TL can be disposed in areas between the plurality of banks BNK. For example, the plurality of signal lines TL can be disposed adjacent to any one of the plurality of banks BNK.

The plurality of contact electrodes CCE can be disposed on the third insulation layer 115*c* in the display area AA. The plurality of contact electrodes CCE can supply the cathode voltage from the drive circuit PD to the second electrode CE2.

The first electrode CE1 can be disposed on the bank BNK. For example, the first electrode CE1 can be disposed to extend from the adjacent signal line TL to the upper side of the bank BNK. The first electrode CE1 can be disposed on the top surface of the bank BNK and the side surface of the bank BNK. For example, the first electrode CE1 can be disposed to extend from the signal line TL on the top surface of the third insulation layer 115*c* to the side surface of the bank BNK and the top surface of the bank BNK.

With reference to FIG. 9, the first electrode CE1 can include a plurality of conductive layers. For example, the first electrode CE1 can include a first conductive layer CE1*a*, a second conductive layer CE1*b*, a third conductive layer CE1*c*, and a fourth conductive layer CE1*d*. However, the embodiments of the present disclosure are not limited thereto.

The first conductive layer CE1*a* can be disposed on the bank BNK. The second conductive layer CE1*b* can be disposed on the first conductive layer CE1*a*. The third conductive layer CE1*c* can be disposed on the second conductive layer CE1*b*. The fourth conductive layer CE1*d* can be disposed on the third conductive layer CE1*c*. For example, the first conductive layer CE1*a*, the second conductive layer CE1*b*, the third conductive layer CE1*c*, and the fourth conductive layer CE1*d* can each be made of titanium (Ti), molybdenum (Mo), aluminum (Al), titanium (Ti), or indium tin oxide (ITO). However, the embodiments of the present disclosure are not limited thereto.

According to the present disclosure, among the plurality of conductive layers constituting the first electrode CE1, some conductive layers with high reflection efficiency can include alignment keys for aligning the micro-LEDs ED, and/or reflective plates. For example, among the plurality of conductive layers of the first electrode CE1, the second conductive layer CE1*b* can include a reflective material. For example, the second conductive layer CE1*b* can include aluminum (Al). However, the embodiments of the present disclosure are not limited thereto. Therefore, the second conductive layer CE1*b* can be configured as a reflective plate. In addition, with the high reflection efficiency of the second conductive layer CE1*b*, the second conductive layer CE1*b* can be easily identified during the manufacturing process. Therefore, the position or transfer position of the micro-LED ED can be aligned with respect to the second conductive layer CE1*b*.

For example, in order to configure the second conductive layer CE1*b* as a reflective plate, the third conductive layer CE1*c* and the fourth conductive layer CE1*d*, which cover the second conductive layer CE1*b*, can be partially removed or etched. For example, the third conductive layer CE1*c* and the fourth conductive layer CE1*d* disposed on the bank BNK can be partially removed or etched, such that a top surface of the second conductive layer CE1*b* can be exposed. For example, central portions and rim portions (or edge portions) of the third conductive layer CE1*c* and the fourth conductive layer CE1*d* where solder patterns SDP are disposed can be maintained, and the remaining portions excluding the above-mentioned portions can be removed. For example, the rim portion (or edge portion) of the third conductive layer CE1*c* made of titanium (Ti) and the rim portion (or edge portion) of the fourth conductive layer CE1*d* made of indium tin oxide (ITO) may not be etched. Therefore, it is possible to inhibit the other conductive layers of the first electrode CE1 from being corroded by a tetramethyl ammonium hydroxide (TMAH) solution used for a mask process for the first electrode CE1.

According to the present disclosure, the first conductive layer CE1*a* and the third conductive layer CE1*c* can include titanium (Ti) or molybdenum (Mo). The second conductive layer CE1*b* can include aluminum (Al). The fourth conductive layer CE1*d* can include a transparent conductive oxide layer made of indium tin oxide (ITO) or indium zinc oxide (IZO) having high bondability to the solder pattern SDP and having corrosion resistance and acid resistance. However, the embodiments of the present disclosure are not limited thereto.

The first conductive layer CE1*a*, the second conductive layer CE1*b*, the third conductive layer CE1*c*, and the fourth conductive layer CE1*d* can be sequentially deposited and then patterned by a photolithography process and an etching process. However, the embodiments of the present disclosure are not limited thereto.

According to the present disclosure, the signal line TL, the contact electrode CCE, and the pad electrode PE disposed on the same layer as the first electrode CE1 can each be configured as a multilayer made of an electrically conductive material. However, the embodiments of the present disclosure are not limited thereto. For example, the signal line TL, the contact electrode CCE, and the pad electrode PE can each be configured as a multilayer made of indium tin oxide (ITO), titanium (Ti), aluminum (Al), and titanium (Ti). However, the embodiments of the present disclosure are not limited thereto.

According to the present disclosure, the solder pattern SDP can be disposed on the first electrode CE1 in each of the plurality of subpixels. The solder pattern SDP can electrically connect the first electrode CE1 and the micro-LED ED by bonding the micro-LED ED to the first electrode CE1. For example, the first electrode CE1 and the anode electrode 134 of the micro-LED ED can be electrically connected by eutectic bonding using the solder pattern SDP. However, the embodiments of the present disclosure are not limited thereto.

For example, in case that the solder pattern SDP is made of indium (In) and the anode electrode 134 of the micro-LED ED is made of gold (Au), the solder pattern SDP and the anode electrode 134 can be joined by applying heat and pressure during the process of transferring the micro-LED ED. The micro-LED ED can be joined to the solder pattern SDP and the first electrode CE1 by eutectic bonding without a separate bonding material. For example, the solder pattern SDP can be made of indium (In), tin (Sn), or an alloy thereof. However, the embodiments of the present disclosure are not limited thereto. For example, the solder pattern SDP can be a bonding pad or a joining pad. However, the embodiments of the present disclosure are not limited thereto.

According to the present disclosure, a passivation layer 116 can be disposed on the plurality of signal lines TL, the plurality of first electrodes CE1, the plurality of contact electrodes CCE, and the third insulation layer 115*c*. For example, the passivation layer 116 can be disposed in the display area AA, the first non-display area NA1, and the second non-display area NA2. A part of the passivation layer 116 disposed in the bending area BA can be removed. A part of the passivation layer 116, which covers the plurality of pad electrodes PE in the second non-display area NA2, can be removed. The passivation layer 116 is disposed to cover the remaining area excluding the areas in which the bending area BA, the plurality of pad electrodes PE, and the solder pattern SDP are disposed, and as a result, it is possible to reduce the permeation of moisture or impurities introduced into the micro-LED ED. For example, the passivation layer 116 can be configured as a single layer or multilayer made of silicon oxide (SiOx) or silicon nitride (SiNx). However, the embodiments of the present disclosure are not limited thereto. For example, the passivation layer 116 can be a protective layer, an insulation layer, or the like. However, the embodiments of the present disclosure are not limited thereto. For example, the passivation layer 116 can include a hole through which the solder pattern SDP is exposed.

In each of the plurality of subpixels, the micro-LED ED can be disposed on the solder pattern SDP. The first micro-LED 130 can be disposed in the first subpixel SP1. The second micro-LED 140 can be disposed in the second subpixel SP2. The third micro-LED 150 can be disposed in the third subpixel SP3.

The micro-LED ED can be formed on a silicon wafer by a method such as metal-organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or sputtering. However, the embodiments of the present disclosure are not limited thereto.

With reference to FIG. 9, the first micro-LED 130 can include the anode electrode 134, a first semiconductor layer 131, an active layer 132, a second semiconductor layer 133, the cathode electrode 135, and an encapsulation film 136. However, the embodiments of the present disclosure are not limited thereto. For example, the first micro-LED 130 may not include the encapsulation film 136.

The first semiconductor layer 131 can be disposed on the solder pattern SDP. The second semiconductor layer 133 can be disposed on the first semiconductor layer 131.

For example, one of the first semiconductor layer 131 and the second semiconductor layer 133 can be implemented as a III-V group or II-VI group compound semiconductor and doped with impurities (or dopant). For example, one of the first semiconductor layer 131 and the second semiconductor layer 133 can be a semiconductor layer doped with n-type impurities, and the other of the first semiconductor layer 131 and the second semiconductor layer 133 can be a semiconductor layer doped with p-type impurities. However, the embodiments of the present disclosure are not limited thereto. For example, one of or both the first semiconductor layer 131 and the second semiconductor layer 133 can be layers made by doping a material such as gallium nitride (GaN), gallium phosphide (GaP), gallium arsenide phosphide (GaAsP), aluminum gallium indium phosphide (AlGaInP), indium aluminum phosphide (InAlP), aluminum gallium nitride (AlGaN), aluminum indium nitride (AlInN), aluminum indium gallium nitride (AlInGaN), aluminum gallium arsenide (AlGaAs), or gallium arsenide (GaAs) with n-type or p-type impurities. However, the embodiments of the present disclosure are not limited thereto. For example, the n-type impurity can be silicon (Si), germanium (Ge), selenium (Se), carbon (C), tellurium (Te), tin (Sn), or the like. However, the embodiments of the present disclosure are not limited thereto. For example, the p-type impurity can be magnesium (Mg), zinc (Zn), calcium (Ca), strontium (Sr), barium BA, beryllium (Be), or the like. However, the embodiments of the present disclosure are not limited thereto.

For example, the first semiconductor layer 131 and the second semiconductor layer 133 can be respectively a nitride semiconductor containing n-type impurities and a nitride semiconductor containing p-type impurities. However, the embodiments of the present disclosure are not limited thereto. For example, the first semiconductor layer 131 can be a nitride semiconductor containing p-type impurities, and the second semiconductor layer 133 can be a nitride semiconductor containing n-type impurities. However, the embodiments of the present disclosure are not limited thereto.

The active layer 132 can be disposed between the first semiconductor layer 131 and the second semiconductor layer 133. The active layer 132 can emit light by receiving positive holes and electrons from the first semiconductor layer 131 and the second semiconductor layer 133. For example, the active layer 132 can have any one of a single well structure, a multi-well structure, a single quantum well structure, a multi-quantum well (MQW) structure, a quantum dot structure, and a quantum line structure. However, the embodiments of the present disclosure are not limited thereto. For example, the active layer 132 can be made of indium gallium nitride (InGaN), gallium nitride (GaN), or the like. However, the embodiments of the present disclosure are not limited thereto.

In another example, the active layer 132 can include a multi-quantum well (MQW) structure having a well layer, and a barrier layer having a higher band gap than the well layer. For example, the active layer 132 can configure an InGaN layer as the well layer and configure an AlGaN layer as the barrier layer. However, the embodiments of the present disclosure are not limited thereto.

The anode electrode 134 can be disposed between the first semiconductor layer 131 and the solder pattern SDP. For example, the anode electrode 134 can electrically connect the first semiconductor layer 131 and the first electrode CE1. The anode voltage outputted from the drive circuit PD can be applied to the first semiconductor layer 131 through the signal line TL, the first electrode CE1, and the anode electrode 134. For example, the anode electrode 134 can be made of an electrically conductive material that can be bonded to the solder pattern SDP by eutectic bonding. However, the embodiments of the present disclosure are not limited thereto. For example, the anode electrode 134 can be made of gold (Au), tin (Sn), tungsten (W), silicon (Si), silver (Ag), titanium (Ti), iridium (Ir), chromium (Cr), indium (In), zinc (Zn), lead (Pb), nickel (Ni), platinum (Pt), copper (Cu), or an alloy thereof. However, the embodiments of the present disclosure are not limited thereto.

The cathode electrode 135 can be disposed on the second semiconductor layer 133. For example, the cathode electrode 135 can electrically connect the second semiconductor layer 133 and the second electrode CE2. The cathode voltage outputted from the drive circuit PD can be applied to the second semiconductor layer 133 through the contact electrode CCE, the second electrode CE2, and the cathode electrode 135. The cathode electrode 135 can be made of a transparent electrically conductive material so that the light emitted from the micro-LED ED can propagate to the upper side of the micro-LED ED. However, the embodiments of the present disclosure are not limited thereto. For example, the cathode electrode 135 can be made of a material such as indium tin oxide (ITO), indium zinc oxide (IZO), or indium gallium zinc oxide (IGZO). However, the embodiments of the present disclosure are not limited thereto.

The encapsulation film 136 can be at least partially disposed on the first semiconductor layer 131, the active layer 132, the second semiconductor layer 133, the anode electrode 134, and the cathode electrode 135. For example, the encapsulation film 136 can at least partially surround the first semiconductor layer 131, the active layer 132, the second semiconductor layer 133, the anode electrode 134, and the cathode electrode 135.

For example, the encapsulation film 136 can protect the first semiconductor layer 131, the active layer 132, and the second semiconductor layer 133. For example, the encapsulation film 136 can be disposed on a side surface of the first semiconductor layer 131, a side surface of the active layer 132, and a side surface of the second semiconductor layer 133.

For example, the encapsulation film 136 can be disposed on at least a part of the anode electrode 134 and at least a part of the cathode electrode 135, e.g., an edge portion (or edge portion or one side) of the anode electrode 134 and an edge portion (or edge portion or one side) of the cathode electrode 135. At least a part of the anode electrode 134 can be exposed from the encapsulation film 136, such that the anode electrode 134 and the solder pattern SDP can be connected. For example, at least a part of the cathode electrode 135 can be exposed from the encapsulation film 136, such that the cathode electrode 135 and the second electrode CE2 can be connected. For example, the encapsulation film 136 can be made of an insulating material such as silicon nitride (SiNx) or silicon oxide (SiOx). However, the embodiments of the present disclosure are not limited thereto.

In another example, the encapsulation film 136 can have a structure in which a reflective material is dispersed in a resin layer. However, the embodiments of the present disclosure are not limited thereto. For example, the encapsulation film 136 can be manufactured as a reflector having various structures. However, the embodiments of the present disclosure are not limited thereto. The light emitted from the active layer 132 is reflected upward by the encapsulation film 136, which can improve the light extraction efficiency. For example, the encapsulation film 136 can be a reflective layer. However, the embodiments of the present disclosure are not limited thereto.

According to the present disclosure, the micro-LED ED has been described as having a vertical structure. However, the embodiments of the present disclosure are not limited thereto. For example, the micro-LED ED can have a lateral structure or a flip chip structure.

The first micro-LED 130 has been described with reference to FIG. 9. The second micro-LED 140 and the third micro-LED 150 can have substantially the same structure as the first micro-LED 130. For example, the first semiconductor layer 131, the active layer 132, the second semiconductor layer 133, the anode electrode 134, the cathode electrode 135, and the encapsulation film 136 of the first micro-LED 130 can be substantially identical to those of the second micro-LED 140 and the third micro-LED 150.

According to the present disclosure, first optical layers 117*a* can be disposed to surround the plurality of micro-LEDs ED in the display area AA. For example, the first optical layers 117*a* can be disposed to cover the plurality of micro-LEDs ED and the bank BNK in the areas of the plurality of subpixels. For example, the first optical layer 117*a* can cover the bank BNK, a part of the passivation layer 116, and the portions between the plurality of micro-LEDs ED. The first optical layers 117*a* can be disposed between the plurality of micro-LEDs ED included in one pixel PX and between the plurality of banks BNK or cover the plurality of micro-LEDs ED and the plurality of banks BNK. For example, the first optical layers 117*a* can extend in a first (row) direction and be disposed to be spaced apart from each other in a second (column) direction. For example, the first optical layer 117*a* can be disposed between the passivation layer 116 and the second electrode CE2 and surround a lateral portion of the micro-LED ED and a lateral portion of the bank BNK. However, the embodiments of the present disclosure are not limited thereto. For example, the first optical layer 117*a* can be a diffusion layer, a sidewall diffusion layer, or the like. However, the embodiments of the present disclosure are not limited thereto.

The first optical layer 117*a* can include an organic insulating material in which fine particles are dispersed. However, the embodiments of the present disclosure are not limited thereto. For example, the first optical layer 117*a* can be made of siloxane in which fine metal particles such as titanium dioxide ($TiO_2$) particles are dispersed. However, the embodiments of the present disclosure are not limited thereto. The light emitted from the plurality of micro-LEDs ED can be scattered by the fine particles dispersed in the first optical layer 117*a*, and the light can be discharged to the outside of the display apparatus 1000. Therefore, the first optical layer 117*a* can improve the efficiency in extracting light emitted from the plurality of micro-LEDs ED.

For example, the first optical layer 117*a* can be respectively disposed in the plurality of pixels PX or disposed together with some of the pixels PX disposed in the same row. However, the embodiments of the present disclosure are not limited thereto. For example, the first optical layer 117*a* can be disposed in each of the plurality of pixels PX, or the plurality of pixels PX can share one first optical layer 117*a*. In another example, the plurality of subpixels can each separately include the first optical layer 117*a*. However, the embodiments of the present disclosure are not limited thereto.

According to the present disclosure, a second optical layer 117*b* can be disposed on the passivation layer 116 in the display area AA. For example, the second optical layer 117*b* can be disposed to surround the first optical layer 117*a*. For example, the second optical layer 117*b* can adjoin a side surface of the first optical layer 117*a*. For example, the second optical layer 117*b* can be disposed in an area between the plurality of pixels PX. However, the embodiments of the present disclosure are not limited thereto. For example, the second optical layer 117*b* can be a diffusion layer, a diffusion layer window, a window diffusion layer, or the like. However, the embodiments of the present disclosure are not limited thereto.

The second optical layer 117*b* can be made of an organic insulating material. However, the embodiments of the present disclosure are not limited thereto. The second optical layer 117*b* can be made of the same material as the first optical layer 117*a*. However, the embodiments of the present disclosure are not limited thereto. For example, the first optical layer 117*a* can include fine particles, and the second optical layer 117*b* can include no fine particle. For example, the second optical layer 117*b* can be made of siloxane. However, the embodiments of the present disclosure are not limited thereto.

For example, a thickness of the first optical layer 117*a* can be smaller than a thickness of the second optical layer 117*b*. However, the embodiments of the present disclosure are not limited thereto. Therefore, when viewed in a plan view, an area, in which the first optical layer 117*a* is disposed, can include a concave portion recessed inward from a top surface of the second optical layer 117*b*.

According to the present disclosure, the second electrode CE2 can be disposed on the first optical layer 117*a* and the second optical layer 117*b*. For example, the second electrode CE2 can be electrically connected to the plurality of contact electrodes CCE through the contact hole of the second optical layer 117*b*. For example, the second electrode CE2 can be disposed on the plurality of micro-LEDs ED. For example, the second electrode CE2 can include a transparent conductive oxide made of indium tin oxide (ITO), indium zinc oxide (IZO), or the like. However, the embodiments of the present disclosure are not limited thereto. For example, the second electrode CE2 can be disposed to be in contact with the cathode electrode 135. For example, the second electrode CE2 can overlap the first optical layer 117*a*. For example, the second electrode CE2 can cover an outer flat surface of the first optical layer 117*a*.

The second electrode CE2 can continuously extend in a first direction of the substrate 110. Therefore, the second electrode CE2 can be connected in common to the plurality of pixels PX arranged in the first direction of the substrate 110. For example, the second electrode CE2 can be connected in common to the plurality of pixels PX.

According to the present disclosure, the second electrode CE2 can continuously extend on the first optical layer 117*a*, the second optical layer 117*b*, and the micro-LED ED. The area, in which the first optical layer 117*a* is disposed, can include the concave portion recessed inward from the top surface of the second optical layer 117*b*. Therefore, because a first portion of the second electrode CE2 disposed on the first optical layer 117*a* is disposed along the concave portion, the first portion of the second electrode CE2 can be disposed at a position lower than a second portion of the second electrode CE2 disposed on the second optical layer 117*b*.

A third optical layer 117*c* can be disposed on the second electrode CE2. The third optical layer 117*c* can be disposed to overlap the plurality of micro-LEDs ED and the first optical layer 117*a*. Because the third optical layer 117*c* is disposed above the second electrode CE2 and the plurality of micro-LEDs ED, it is possible to suppress a Mura that can occur in some of the plurality of micro-LEDs ED. For example, when the plurality of micro-LEDs ED are transferred onto the substrate 110 of the display apparatus 1000, there can occur an area in which intervals between the plurality of micro-LEDs ED are not uniform because of a process deviation or the like. In case that the intervals between the plurality of micro-LEDs ED are not uniform, light-emitting areas of the plurality of micro-LEDs ED can be disposed non-uniformly, and a user can visually recognize a Mura. Therefore, the third optical layer 117*c*, which is configured to uniformly diffuse light, is provided above the plurality of micro-LEDs ED, which can reduce a situation in which the light emitted from some of the micro-LEDs ED is visually recognized as a Mura. Therefore, the light emitted from the plurality of micro-LEDs ED can be uniformly diffused by the third optical layer 117*c* and extracted to the outside of the display apparatus 1000, which can improve the luminance uniformity of the display apparatus 1000.

The third optical layer 117*c* can be made of an organic insulating material in which fine particles are dispersed. However, the embodiments of the present disclosure are not limited thereto. For example, the third optical layer 117*c* can be made of siloxane in which fine metal particles such as titanium dioxide ($TiO_2$) particles are dispersed. However, the embodiments of the present disclosure are not limited thereto. For example, the third optical layer 117*c* can be made of the same material as the first optical layer 117*a*. However, the embodiments of the present disclosure are not limited thereto. For example, the third optical layer 117*c* can be a diffusion layer or a top diffusion layer. However, the embodiments of the present disclosure are not limited thereto.

According to the present disclosure, the light emitted from the plurality of micro-LEDs ED can be scattered by the fine particles dispersed in the third optical layer 117*c*, and the light can be discharged to the outside of the display apparatus 1000. The third optical layer 117*c* can uniformly mix the light beams emitted from the plurality of micro-LEDs ED, which can further improve the luminance uniformity of the display apparatus 1000. Further, the light extraction efficiency of the display apparatus 1000 can be improved by the light scattered by the plurality of fine particles, such that the display apparatus 1000 can operate with low power consumption.

The black matrix BM can be disposed on the second electrode CE2, the first optical layer 117*a*, the second optical layer 117*b*, and the third optical layer 117*c* in the display area AA. For example, the contact hole of the second optical layer 117*b* can be filled with the black matrix BM. Because the black matrix BM is configured to cover the display area AA, it is possible to reduce a color mixture and external light reflection of the light emitted from the plurality of subpixels. For example, the black matrix BM is disposed even in the contact hole through which the second electrode CE2 and the contact electrode CCE are connected, which can suppress a leak of light between the plurality of adjacent pixels.

For example, the black matrix BM can be made of an opaque material. However, the embodiments of the present disclosure are not limited thereto. For example, the black matrix BM can be made of an organic insulating material to which a black pigment or a black dye is added. However, the embodiments of the present disclosure are not limited thereto.

A cover layer 118 can be disposed on the black matrix BM in the display area AA. The cover layer 118 can protect components disposed below the cover layer 118. For example, the cover layer 118 can be made of an organic insulating material. However, the embodiments of the present disclosure are not limited thereto. For example, the cover layer 118 can be made of photoresist, polyimide (PI), or a photo acrylic material. However, the embodiments of the present disclosure are not limited thereto. For example, the cover layer 118 can be an overcoating layer, an insulation layer, or the like. However, the embodiments of the present disclosure are not limited thereto.

The polarizing layer 293 can be disposed on the cover layer 118 by means of a first bonding layer 291. The cover member 120 can be disposed on the polarizing layer 293 by means of a second bonding layer 295. For example, the first bonding layer 291 and the second bonding layer 295 can each include an optically clear adhesive (OCA), an optically clear resin (OCR), a pressure-sensitive adhesive (PSA), or the like. However, the embodiments of the present disclosure are not limited thereto.

According to the present disclosure, the plurality of pad electrodes PE can be disposed on the third insulation layer 115*c* in the second non-display area NA2. For example, the plurality of pad electrodes PE can be at least partially exposed from the passivation layer 116. For example, the plurality of pad electrodes PE can be electrically connected to the 2-4-th connection line 122*d* through the contact hole of the third insulation layer 115*c*.

A bonding layer ACF can be disposed on the plurality of pad electrodes PE. The bonding layer ACF can be a bonding layer made by dispersing conductive balls in an insulating material. However, the embodiments of the present disclosure are not limited thereto. In case that heat or pressure is applied to the bonding layer ACF, the conductive balls are electrically connected in a portion to which heat or pressure is applied, such that the bonding layer ACF can have conductive properties. The bonding layer ACF can be disposed between the plurality of pad electrodes PE and the flexible circuit board (or flexible film) FCB and attach or bond the flexible circuit board (or flexible film) FCB to the plurality of pad electrodes PE. For example, the bonding layer ACF can be an anisotropic conductive film (ACF). However, the embodiments of the present disclosure are not limited thereto.

The flexible circuit board (or flexible film) FCB can be disposed on the bonding layer ACF. The flexible circuit board (or flexible film) FCB can be electrically connected to the plurality of pad electrodes PE through the bonding layer ACF. Therefore, the signals outputted from the flexible circuit board (or flexible film) FCB and the printed circuit board 160 can be transmitted to the drive circuit PD in the display area AA through the plurality of pad electrodes PE, the 2-4-th connection line 122*d*, the 2-3-th connection line 122*c*, the 2-2-th connection line 122*b*, and the 2-1-th connection line 122*a*.

Figure 10:
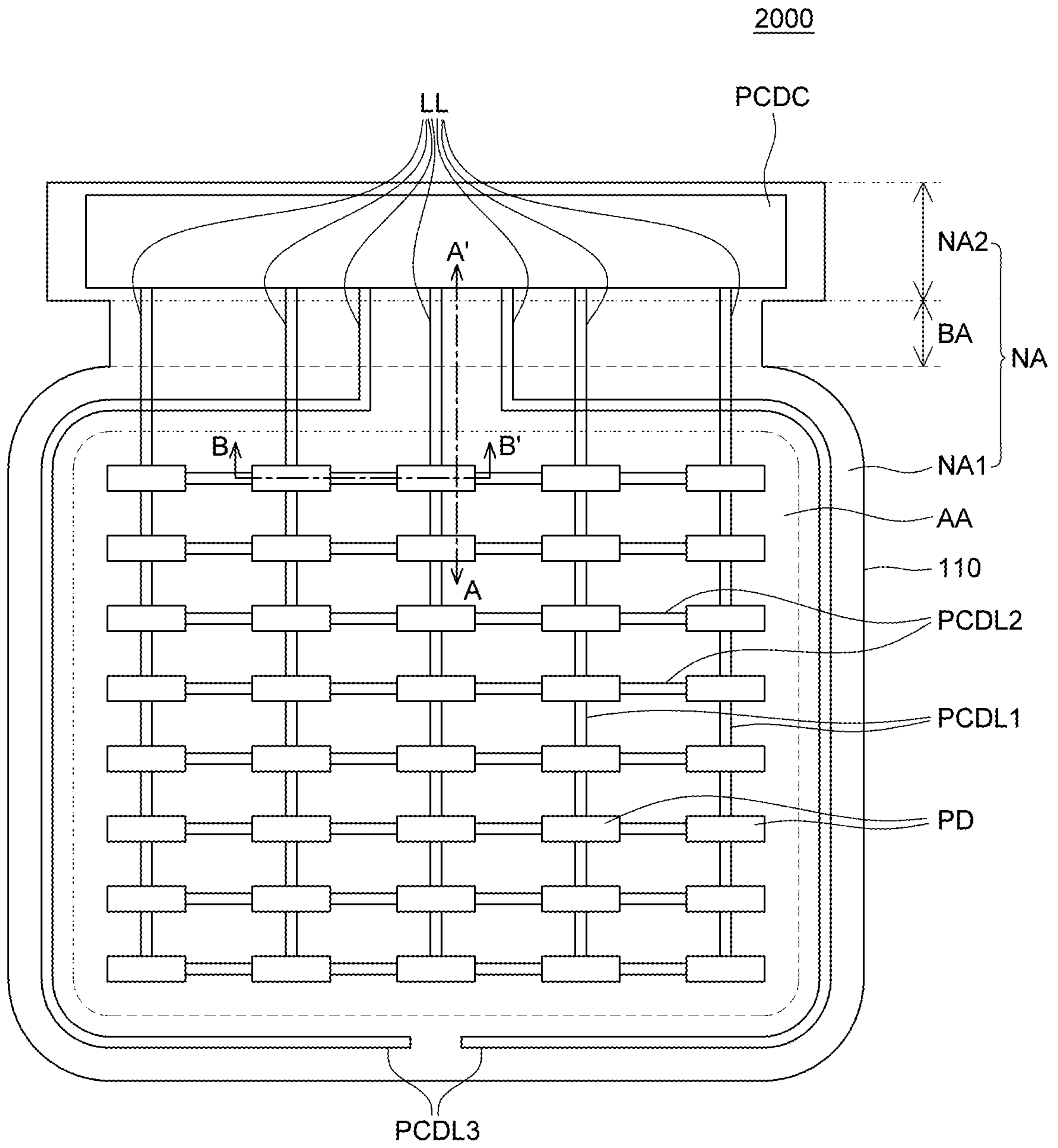
FIG. 10 is a top plan view of a display apparatus according to another embodiment of the present disclosure.
Figure 11:
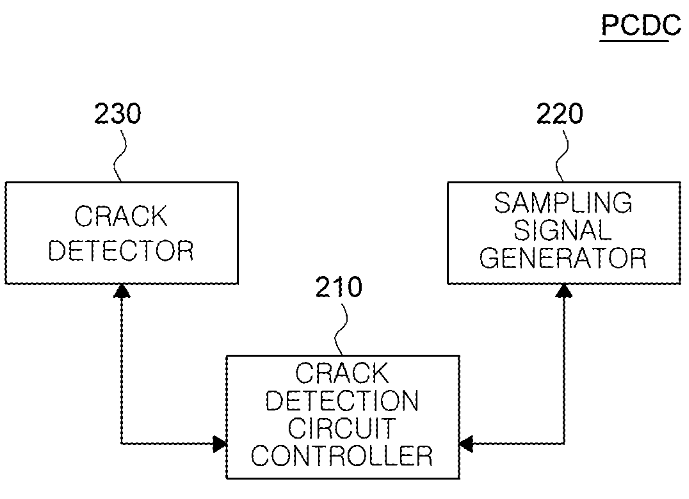
FIG. 11 is a functional block diagram for explaining a crack detection circuit of the display apparatus according to another embodiment of the present disclosure.
Figure 12:
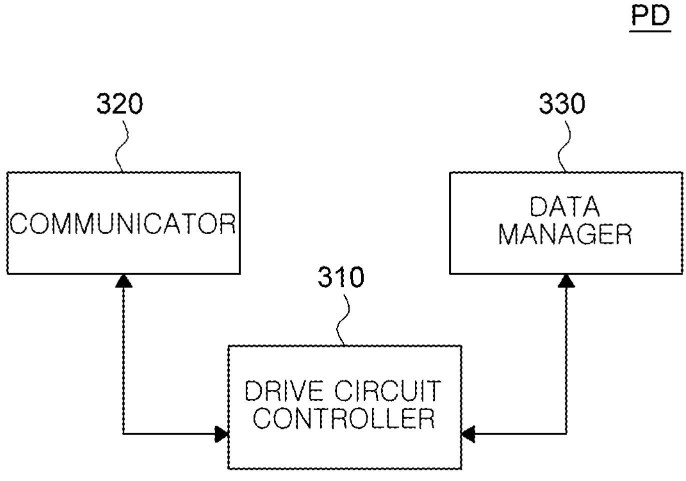
FIG. 12 is a functional block diagram for explaining a drive circuit of the display apparatus according to another embodiment of the present disclosure.
Figure 13A:
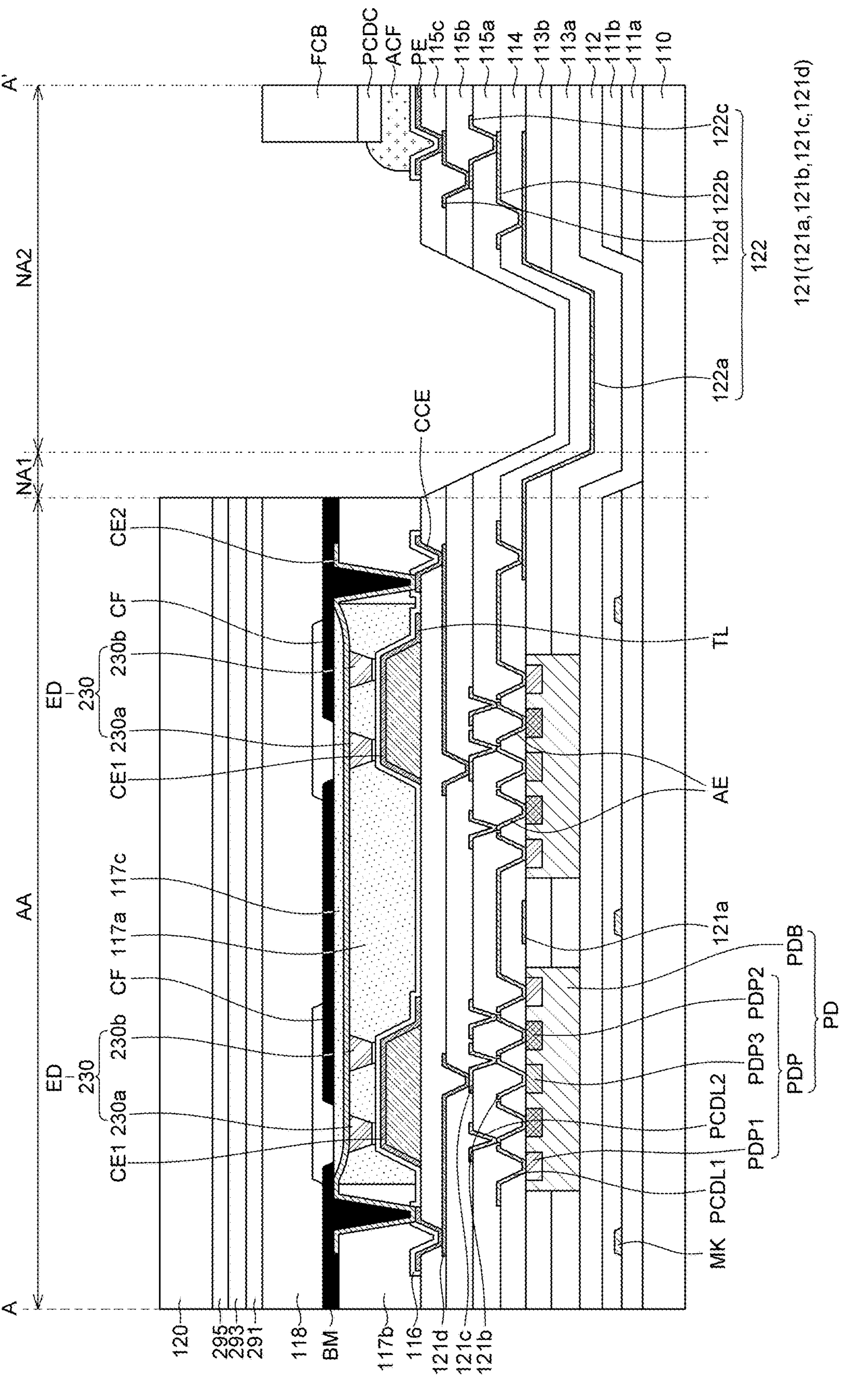
FIG. 13A is a cross-sectional view taken along line A-A' in FIG. 10.
Figure 13B:
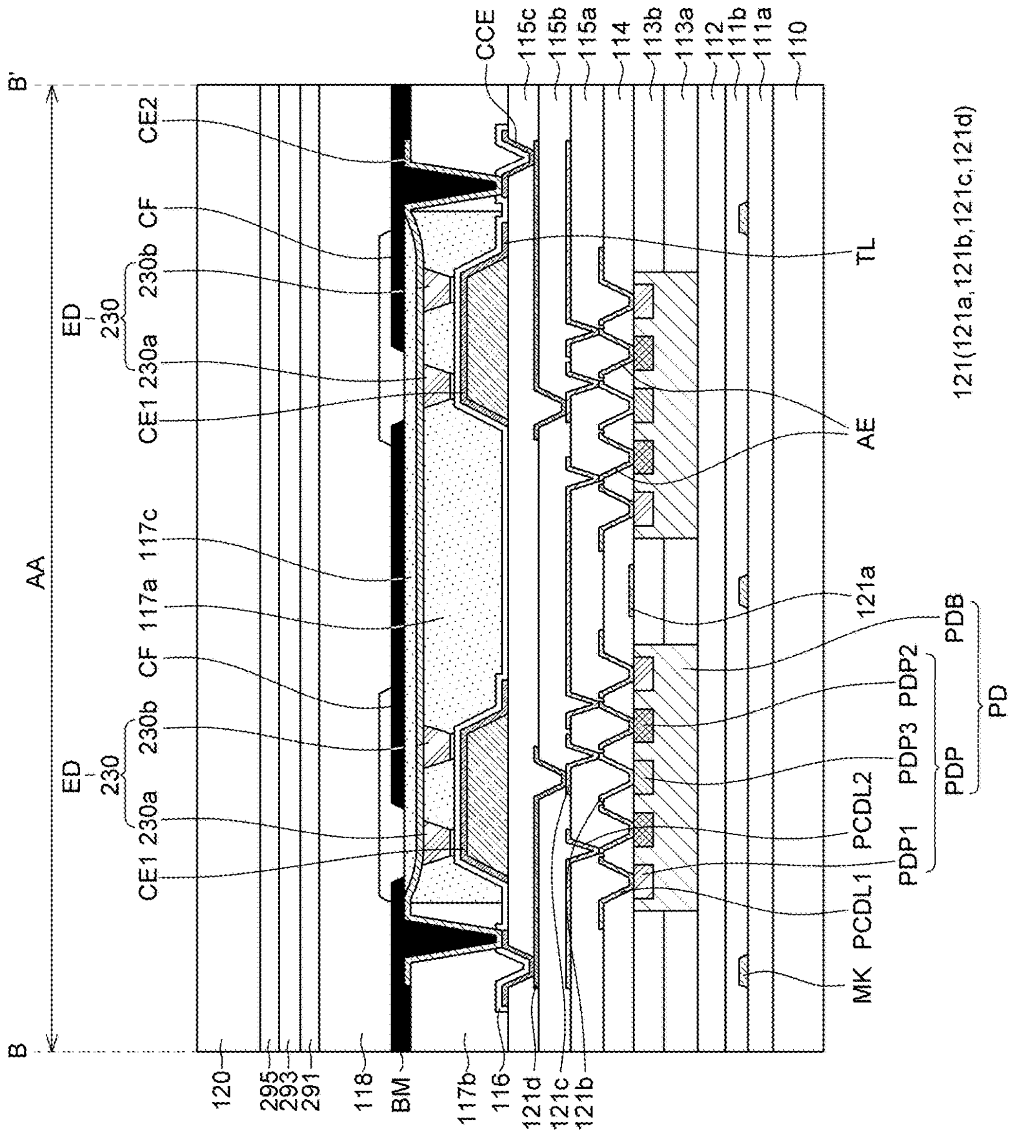
FIG. 13B is a cross-sectional view taken along line B-B' in FIG. 10.

FIG. 10 is a top plan view of a display apparatus according to another embodiment of the present disclosure. FIG. 11 is a functional block diagram for explaining a crack detection circuit of the display apparatus according to another embodiment of the present disclosure. FIG. 12 is a functional block diagram for explaining a drive circuit of the display apparatus according to another embodiment of the present disclosure. FIG. 13A is a cross-sectional view taken along line A-A' in FIG. 10. FIG. 13B is a cross-sectional view taken along line B-B' in FIG. 10. Meanwhile, for convenience of illustration, FIG. 10 illustrates that the cutting line A-A' and a first crack detection line PCDL1 do not overlap each other. However, the cutting line A-A' in FIG. 10 indicates the same position as the adjacent first crack detection line PCDL1. A display apparatus 2000 in FIGS. 10 to 13B is substantially identical in configuration to the display apparatus 1000 in FIGS. 1 to 9, except for a crack detection circuit PCDC, a plurality of crack detection lines PCDL, the drive circuit PD, the micro-LED ED, and the color filter CF. Therefore, repeated descriptions of the identical components will be omitted or may be briefly provided.

With reference to FIGS. 10 and 13A, the crack detection circuit PCDC can be disposed in the second non-display area NA2. For example, the crack detection circuit PCDC can be disposed on the flexible circuit board FCB.

The crack detection circuit PCDC can detect whether the plurality of crack detection lines PCDL are cracked. Specifically, the crack detection circuit PCDC can receive crack data of the first crack detection line PCDL1 and a second crack detection line PCDL2 from the plurality of drive circuits PD. Therefore, the crack detection circuit PCDC can read out the crack data and detect whether the first crack detection line PCDL1 and the second crack detection line are cracked. For example, the crack detection circuit PCDC can be connected to the plurality of drive circuits PD through the first crack detection line PCDL1. However, the present disclosure is not limited thereto.

With reference to FIG. 11 together, the crack detection circuit PCDC can include a crack detection circuit controller 210, a sampling signal generator 220, and a crack detector 230.

The crack detection circuit controller 210 can control the signal generation of the sampling signal generator 220. Specifically, the crack detection circuit controller 210 can instruct the sampling signal generator 220 to generate a sampling signal for scanning the crack data of the drive circuit PD in a predetermined direction.

In addition, the crack detection circuit controller 210 can control crack readout of the crack detector 230. Specifically, the crack detection circuit controller 210 can instruct the crack detector 230 so that the crack detector 230 combines the crack data received from the drive circuit PD and recognizes information on the cracked line.

The sampling signal generator 220 can generate the sampling signal for scanning the crack data of the drive circuit PD in a predetermined direction in response to the instruction of the crack detection circuit controller 210.

The crack detector 230 can combine the crack data received from the drive circuit PD and detect whether the first crack detection line PCDL1 and the second crack detection line PCDL2 to be described below are cracked.

Meanwhile, the crack detection circuit PCDC can also be referred to as a crack detection driver or a timing controller. However, the present disclosure is not limited thereto.

With reference back to FIG. 10, the crack detection circuit PCDC can detect whether a third crack detection line PCDL3 is cracked in response to feedback on a crack detection signal applied to the third crack detection line PCDL3 from the crack detection circuit PCDC. For example, the crack detection circuit PCDC can determine whether the third crack detection line PCDL3 is cracked depending on whether the crack detection signal transmitted to the third crack detection line PCDL3 is received by the crack detection circuit PCDC again.

For example, methods of detecting cracks in the first crack detection line PCDL1, the second crack detection line PCDL2, and the third crack detection line PCDL3 by the crack detection circuit PCDC can be different from one another. However, the present disclosure is not limited thereto.

The plurality of crack detection lines PCDL can be disposed in the display area AA and the non-display area NA. The plurality of crack detection lines PCDL can include the first crack detection lines PCDL1 and the second crack detection lines PCDL2 disposed in the display area AA, and the third crack detection lines PCDL3 disposed in the non-display area NA.

The first crack detection line PCDL1 can be disposed while extending in a first direction, e.g., the column direction in the display area AA. The first crack detection line PCDL1 can electrically connect the plurality of drive circuits PD disposed in the column direction. Therefore, the first crack detection line PCDL1 can allow the plurality of drive circuits PD, which are disposed in the column direction, to communicate with one another through the first crack detection line PCDL1. Therefore, it is possible to identify whether the drive circuits PD, which are adjacent to one another in the column direction, communicate with one another and detect whether the first crack detection line PCDL1 is cracked.

The second crack detection line PCDL2 can be disposed while extending in a second direction, e.g., the row direction in the display area AA. Therefore, the second crack detection line PCDL2 can be disposed to intersect the first crack detection line PCDL1. The second crack detection line PCDL2 can electrically connect the plurality of drive circuits PD disposed in the second direction. Therefore, the second crack detection line PCDL2 can allow the plurality of drive circuits PD, which are disposed in the second direction, to communicate with one another through the second crack detection line PCDL2. Therefore, it is possible to identify whether the drive circuits PD, which are adjacent to one another in the second direction, communicate with one another and detect whether the second crack detection line PCDL2 is cracked.

The third crack detection line PCDL3 can be disposed in the non-display area NA and surround at least apart of the display area AA. For example, the third crack detection line PCDL3 can be disposed at an outermost periphery of the first non-display area NA1 and detect whether the non-display area NA is cracked.

The first crack detection line PCDL1, the second crack detection line PCDL2, and the third crack detection line PCDL3 disposed in the non-display area NA can each have a loop shape. Therefore, one end of each of the crack detection lines PCDL can receive the sampling signal from the crack detection circuit PCDC, and the other end of each of the crack detection lines PCDL can output the crack data to the crack detection circuit PCDC. However, the present disclosure is not limited thereto.

Meanwhile, the plurality of first crack detection lines PCDL1 and the plurality of third crack detection lines PCDL3 can be electrically connected to the crack detection circuit PCDC through the link lines LL disposed in the second non-display area NA2. However, the present disclosure is not limited thereto.

The plurality of drive circuits PD can be disposed in the display area AA. For example, FIG. 10 illustrates that the plurality of drive circuits PD is disposed in the form of a matrix with eight rows and five columns. However, the present disclosure is not limited thereto. The plurality of drive circuits PD can be disposed in various shapes.

The plurality of drive circuits PD can operate the micro-LEDs ED of the plurality of subpixels and output the crack data determined depending on whether the first crack detection line PCDL1 and the second crack detection line PCDL2 are disconnected. For example, the plurality of drive circuits PD can each apply a communication identification signal through the first crack detection line PCDL1 and the second crack detection line PCDL2 and identify whether the plurality of drive circuits PD communicate with the adjacent drive circuits PD. Therefore, the plurality of drive circuits PD can determine whether the first crack detection line PCDL1 and the second crack detection line PCDL2 are disconnected, i.e., cracked on the basis of whether the plurality of drive circuits PD communicate with the adjacent drive circuits PD. For example, the plurality of drive circuits PD can output a result of communication with the adjacent drive circuits PD as the crack data of the first crack detection line PCDL1 and the second crack detection line PCDL2. For example, the plurality of drive circuits PD can output the crack data in the form of a data packet. However, the present disclosure is not limited thereto.

Meanwhile, the plurality of drive circuits PD can transmit the crack data of the first crack detection line PCDL1 and the second crack detection line PCDL2 to the crack detection circuit PCDC.

Specifically, with reference to FIG. 12 together, the drive circuit PD can include a drive circuit controller 310, a communicator 320, and a data manager 330.

The drive circuit controller 310 can instruct the communicator 320 so that the communicator 320 generates a communication identification signal on the basis of the sampling signal of the crack detection circuit PCDC.

The drive circuit controller 310 can control the crack data output of the data manager 330. Specifically, the drive circuit controller 310 can control the data manager 330 so that the data manager 330 can output the communication result, which is provided from the communicator 320, as the crack data of the first crack detection line PCDL1 and the second crack detection line PCDL2.

In response to the instruction of the drive circuit controller 310, the communicator 320 can generate the communication identification signal and transmit and receive the communication identification signal to and from the adjacent drive circuit PD through the first crack detection line PCDL1 or the second crack detection line PCDL2, thereby identifying whether the first crack detection line PCDL1 or the second crack detection line PCDL2 communicates with the adjacent drive circuit PD.

Specifically, the communicator 320 can identify whether the corresponding drive circuit PD communicates with at least any one of the drive circuit, which is closest to the corresponding drive circuit PD among the drive circuits disposed in the same column, and the drive circuit that is closest to the corresponding drive circuit PD among the drive circuits disposed in the same row.

The data manager 330 can output the communication result between the adjacent drive circuits PD as the crack data on the basis of the data related to whether the adjacent drive circuits PD communicate with one another received from the communicator 320. Specifically, the crack data can be initialized to 0 before the data manager 330 receives the communication result from the communicator 320. In this case, the data manager 330 can read out the communication result between the adjacent drive circuits PD received from the communicator 320, output the crack data as 1 in case that the communication is possible, and output the crack data as 0 directly in case that the communication is not possible (e.g., impossible).

Meanwhile, the crack detection method will be described in detail with reference to FIGS. 14 to 16E to be described below.

With reference to FIG. 13A, the drive circuit PD can include a plurality of circuit pads PDP disposed on one surface of a body PDB.

The body PDB of the drive circuit PD can be configured to mount various types of components and can be a semiconductor substrate or the like on which various types of components are disposed. However, the present disclosure is not limited thereto.

The plurality of circuit pads PDP can include a first circuit pad PDP1, a second circuit pad PDP2, and a third circuit pad PDP3.

The first circuit pad PDP1 can transmit and receive various signals to and from the first circuit pad PDP1 of the adjacent drive circuit PD. Specifically, the first circuit pads PDP1 of the drive circuits PD adjacent to each other in the column direction can be electrically connected to each other through the first crack detection line PCDL1. Therefore, the first circuit pads PDP1 of the drive circuits PD adjacent to each other in the column direction can transmit and receive various signals through the first crack detection line PCDL1.

For example, the first circuit pads PDP1 of the adjacent drive circuits PD can transmit and receive, through the first crack detection line PCDL1, the communication identification signal generated by the communicator, the sampling signal applied through the crack detection circuit PCDC, and the crack data outputted from the data manager. However, the present disclosure is not limited thereto.

The second circuit pad PDP2 can transmit and receive various signals to and from the second circuit pad PDP2 of the adjacent drive circuit PD. Specifically, the second circuit pads PDP2 of the drive circuits PD adjacent to each other in the row direction can be electrically connected to each other through the second crack detection line PCDL2. Therefore, the second circuit pads PDP2 of the drive circuits PD adjacent to each other in the row direction can transmit and receive various signals through the second crack detection line PCDL2.

For example, the first circuit pads PDP2 of the adjacent drive circuits PD can transmit and receive, through the second crack detection line PCDL2, the communication identification signal generated by the communicator, the sampling signal applied through the crack detection circuit PCDC, and the crack data outputted from the data manager. However, the present disclosure is not limited thereto.

Meanwhile, the second crack detection line PCDL2, which connects the plurality of second circuit pads PDP2, may not be connected directly to the crack detection circuit PCDC. Therefore, the second circuit pad PDP2 can copy a signal applied to the first circuit pad PDP1 through the first crack detection line PCDL1 from the crack detection circuit PCDC and transmit the signal to the second circuit pad PDP2 of the drive circuit PD. However, the present disclosure is not limited thereto.

The third circuit pad PDP3 can be a circuit pad for operating the plurality of micro-LEDs ED. For example, the number of third circuit pads PDP3 can be determined depending on the type of micro-LED ED. For example, in case that all the plurality of micro-LEDs ED are the same types of micro-LEDs ED, e.g., white micro-LEDs ED, only one type of third circuit pad PDP3 can be disposed. On the contrary, in case that the micro-LEDs ED includes a red micro-LED, a green micro-LED, and a blue micro-LED, at least three types of third circuit pads PDP3 can be disposed.

For example, in the display apparatus 2000 according to another embodiment of the present disclosure, the micro-LED ED can be a white micro-LED. Therefore, only one third circuit pad PDP3 is illustrated. However, the present disclosure is not limited thereto. The number of third circuit pads PDP3 can be determined depending on the type of micro-LED ED.

Meanwhile, the third circuit pad PDP3 can be electrically insulated from the first crack detection line PCDL1 and the second crack detection line PCDL2. However, the present disclosure is not limited thereto.

The first crack detection line PCDL1 can be disposed on the third protective layer 114. The first crack detection line can electrically connect the plurality of drive circuits PD disposed in the column direction. Specifically, the first crack detection line PCDL1 can be electrically connected to all the first circuit pads PDP1 of each of the drive circuits PD disposed in the column direction among the plurality of drive circuits PD. Therefore, the first circuit pads PDP1 of the adjacent drive circuits PD can be electrically connected by the first crack detection line PCDL1 and communicate with each other.

For example, the first crack detection line PCDL1 can be disposed on the same layer and made of the same material as the 1-2-th connection line 121*b* and the 2-2-th connection line 122*b*. However, the present disclosure is not limited thereto.

An auxiliary electrode AE can be disposed on the third protective layer 114. The auxiliary electrode AE can electrically connect the second circuit pad PDP2 of the drive circuit PD and the second crack detection line PCDL2. For example, the auxiliary electrode AE can be disposed on the same layer and made of the same material as the 1-2-th connection line 121*b* and the 2-2-th connection line 122*b*. However, the present disclosure is not limited thereto.

The second crack detection line PCDL2 can be disposed on the first insulation layer 115*a*. The second crack detection line PCDL2 can electrically connect the plurality of drive circuits PD disposed in the row direction. Specifically, the second crack detection line PCDL2 can be electrically connected to all the second circuit pads PDP2 of each of the drive circuits PD disposed in the row direction among the plurality of drive circuits PD. Therefore, the second circuit pads PDP2 of the adjacent drive circuits PD can be electrically connected by the second crack detection line PCDL2 and communicate with each other.

For example, the second crack detection line PCDL2 can be electrically connected to the second circuit pad PDP2 through the auxiliary electrode AE. However, the present disclosure is not limited thereto.

The second crack detection line PCDL2 can be disposed on the same layer and made of the same material as the 1-3-th connection line 121*c* and the 2-3-th connection line 122*c*. However, the present disclosure is not limited thereto.

The color filter CF can be disposed on the micro-LED ED exposed by the black matrix BM. The color filter CF can be disposed in the plurality of opening portions of the black matrix BM and disposed to completely cover the plurality of opening portions of the black matrix BM. The color filter CF can implement light beams with various colors from the light beams emitted from the plurality of micro-LEDs ED. The color filters CF, which transmit light beams with different wavelengths, can be respectively disposed in the plurality of subpixels.

Hereinafter, a method of detecting a crack in the display apparatus 2000 according to another embodiment of the present disclosure will be described in detail with reference to FIGS. 14 to 16E.

Figure 14:
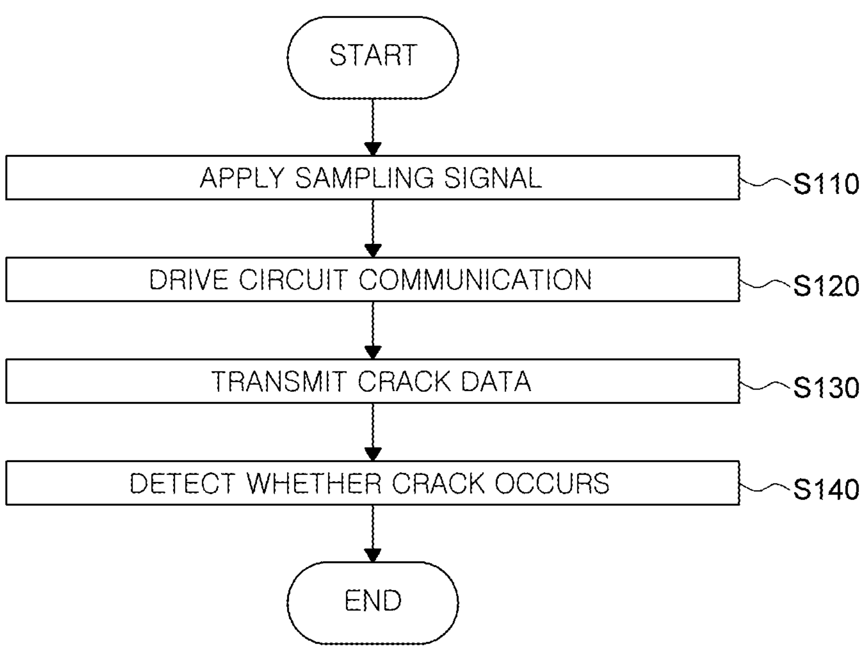
FIG. 14 is a flowchart for explaining a method of detecting a crack in the display apparatus according to another embodiment of the present disclosure.

FIG. 14 is a flowchart for explaining the method of detecting a crack in the display apparatus according to another embodiment of the present disclosure. FIGS. 15A to 15D are process diagrams for explaining the method of detecting a crack in the display apparatus according to another embodiment of the present disclosure. FIGS. 16A to 16E are process diagrams for explaining the method of detecting a crack in the display apparatus according to another embodiment of the present disclosure. Specifically, FIGS. 15A to 15D are views for explaining a method of scanning the crack data of the drive circuits disposed in the column direction, and FIGS. 16A to 16D are views for explaining a method of scanning the crack data of the drive circuits disposed in the row direction. FIG. 16E is a view for explaining a method of detecting whether a crack occurs by combining the crack data scanned in FIGS. 15A to 16D. Meanwhile, FIGS. 15A to 16E illustrate an example in which the second crack detection line PCDL2 between the drive circuit PD disposed in the fourth row and the second column and the drive circuit PD disposed in the fourth row and the third column is cracked and the first crack detection line PCDL1 between the drive circuit PD disposed in the fifth row and the third column and the drive circuit PD disposed in the sixth row and the third column is cracked.

With reference to FIG. 14, the method of detecting a crack in the display apparatus 2000 can include a sampling signal application step S110, a drive circuit communication step S120, a crack data transmission step S130, and a crack detection step S140.

Figure 15A:
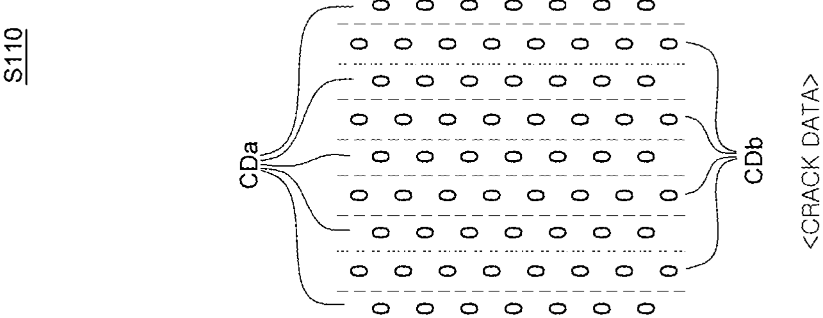
FIGS. 15A to 15D are process diagrams for explaining the method of detecting a crack in the display apparatus according to another embodiment of the present disclosure.
Figure 15A:
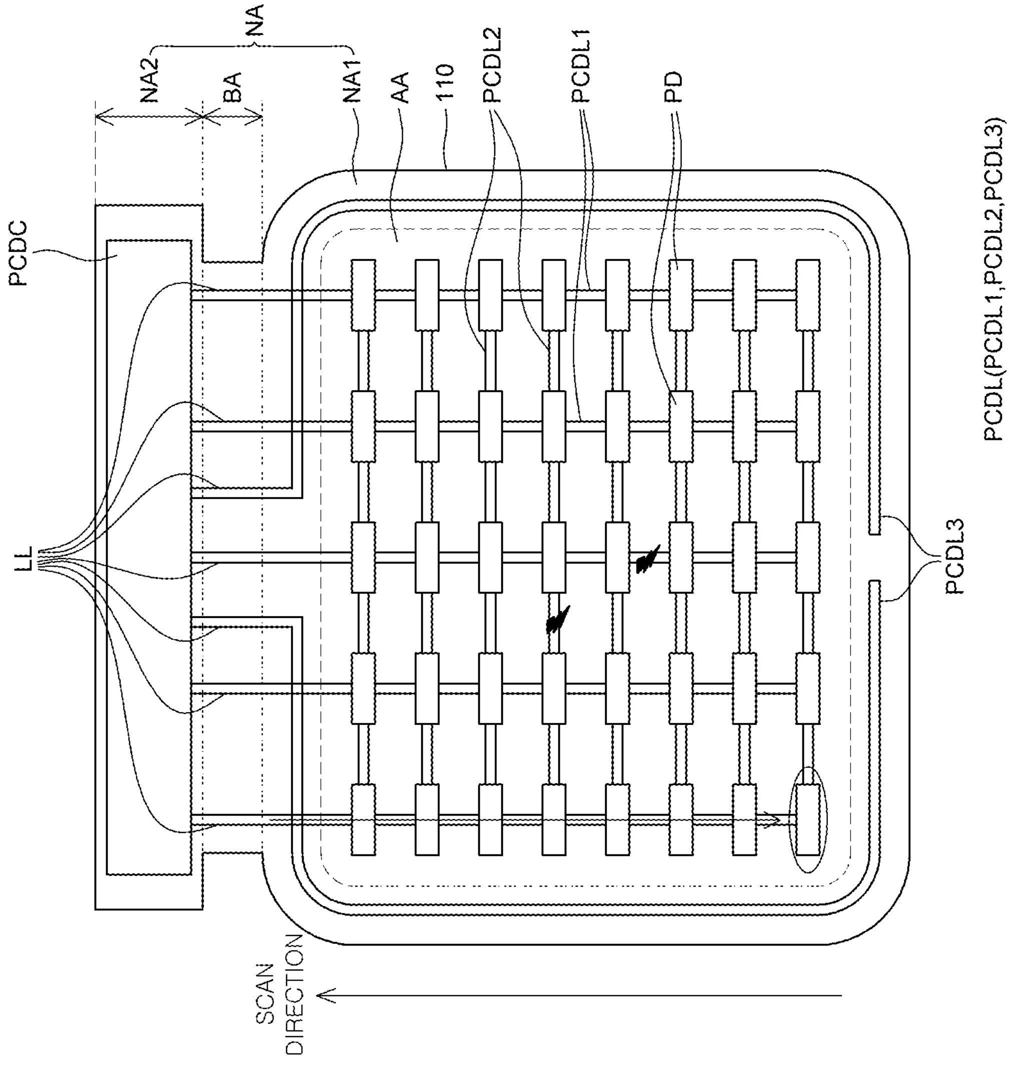

With reference to FIG. 15A, in the sampling signal application step S110, the sampling signal generated by the sampling signal generator 220 of the crack detection circuit PCDC can be applied to the plurality of drive circuits PD through the first crack detection line PCDL1.

In this case, the sampling signal can be a signal for scanning the crack data of the plurality of drive circuits PD disposed in the column direction. For example, the process of scanning the crack data of the drive circuits PD disposed in the column direction can be started sequentially from the crack data of the drive circuit PD disposed in the eighth row and the first column. For example, the scan direction can be a direction from the lower side to the upper side of the substrate 110. However, the present disclosure is not limited thereto.

For example, the crack data of the drive circuits PD can include first crack data CDa and second crack data CDb.

The first crack data CDa can be data determined depending on whether the adjacent drive circuits PD communicate with each other through the first crack detection line PCDL1, i.e., the first crack data CDa can be data related to whether the first crack detection line PCDL1 is disconnected.

The second crack data CDb can be data determined depending on whether the adjacent drive circuits PD communicate with each other through the second crack detection line PCDL2, i.e., the second crack data CDb can be data related to whether the second crack detection line PCDL2 is disconnected.

Meanwhile, both the first crack data CDa and the second crack data CDb can be initialized to 0 before the sampling signal is applied.

Figure 15B:
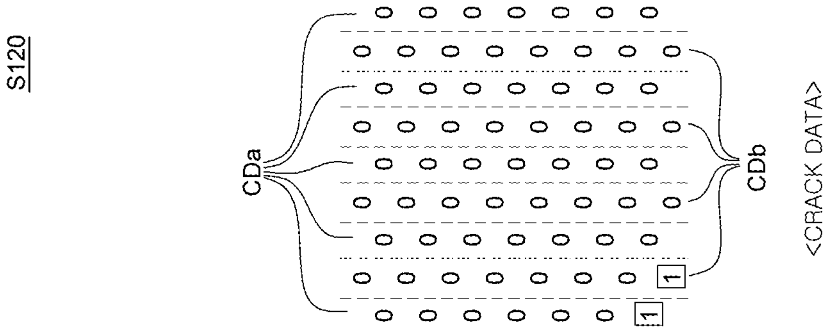
Figure 15B:
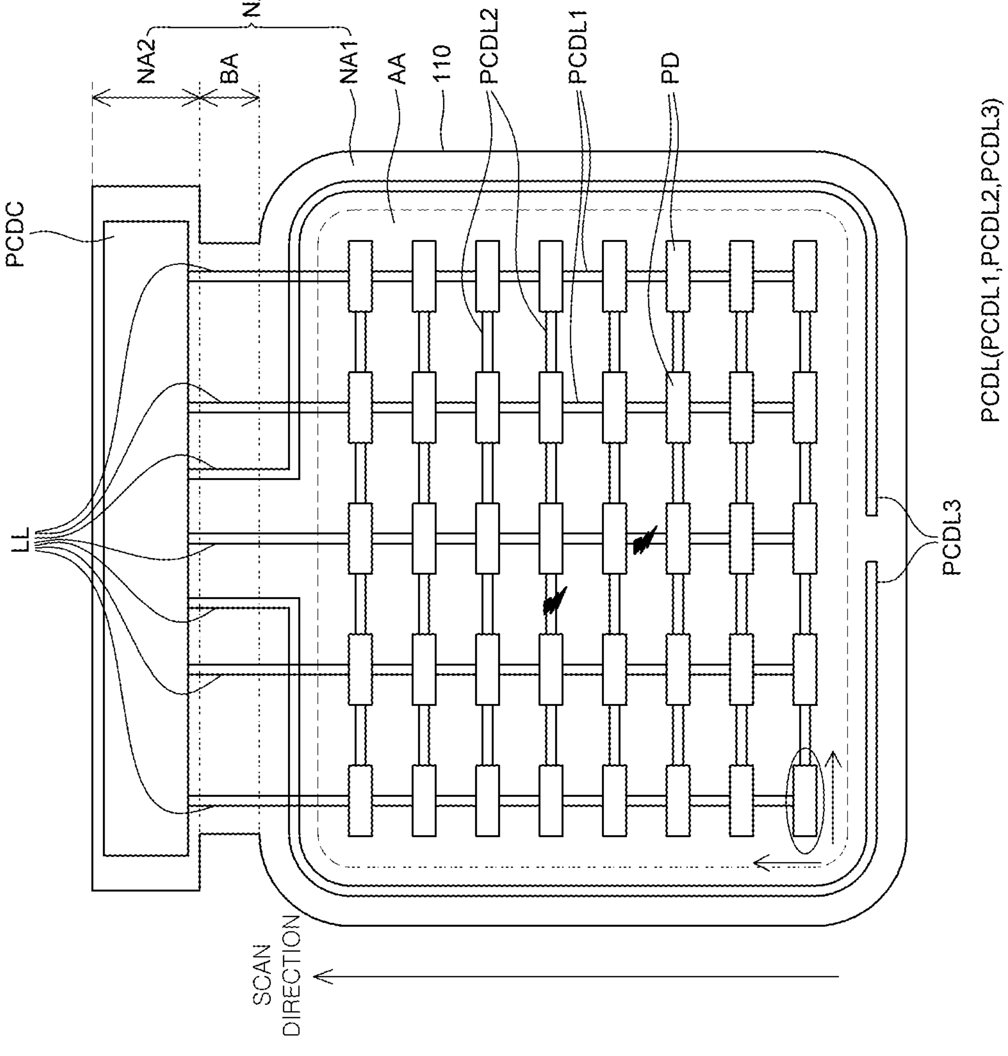

With reference to FIG. 15B, in the drive circuit communication step S120, whether the drive circuit PD, which receives the sampling signal, communicates with the adjacent drive circuit PD can be identified, and the communication result can be outputted as the crack data. For example, whether the first crack detection line PCDL1 and the second crack detection line PCDL2 are disconnected can be identified depending on whether the plurality of drive circuits PD communicate with the adjacent drive circuits PD, such that the plurality of drive circuits PD can output the communication result as the crack data of the first crack detection line PCDL1 and the second crack detection line PCDL2.

Specifically, the drive circuit PD, which receives the sampling signal, can identify whether the corresponding drive circuit PD communicates with at least any one of the drive circuits PD disposed in the same row and the same column as the corresponding drive circuit PD and closest to the corresponding drive circuit PD.

For example, in case that the drive circuit PD, which receives the sampling signal, is disposed in an x-th row and a y-th column, whether the first crack detection line PCDL1, which connects the drive circuit PD disposed in the x-th row and the y-th column and the drive circuit PD disposed in a (x−1)th row and the y-th column, is disconnected can be identified depending on whether the drive circuit PD disposed in the x-th row and the y-th column communicates with the drive circuit PD disposed in the (x−1)th row and the y-th column.

In addition, whether the second crack detection line PCDL2, which connects the drive circuit PD disposed in the x-th row and the y-th column and the drive circuit PD disposed in the x-th row and a (y+1)th column is disconnected can be identified depending on whether the drive circuit PD disposed in the x-th row and the y-th column communicates with the drive circuit PD disposed in the x-th row and the (y+1)th column.

For example, the drive circuit PD disposed in the eighth row and the first column can transmit and receive the communication identification signal to and from the drive circuit PD disposed in the seventh row and the first column through the first crack detection line PCDL1 and identify whether the first crack detection line PCDL1, which connects the drive circuit PD disposed in the eighth row and the first column and the drive circuit PD disposed in the seventh row and the first column, is disconnected. In this case, because the corresponding first crack detection line PCDL1 is not disconnected, the drive circuit PD can output the first crack data CDa as 1.

In addition, the drive circuit PD disposed in the eighth row and the first column can transmit and receive the communication identification signal to and from the drive circuit PD disposed in the eighth row and the second column through the second crack detection line PCDL2 and identify whether the second crack detection line PCDL2, which connects the drive circuit PD disposed in the eighth row and the first column and the drive circuit PD disposed in the eighth row and the second column, is disconnected. In this case, because the corresponding second crack detection line PCDL2 is not disconnected, the drive circuit PD can output the second crack data CDb as 1.

Meanwhile, FIG. 15B illustrates that whether the corresponding drive circuit PD communicates with the drive circuit PD, which is disposed at the right and upper side of the corresponding drive circuit PD among the drive circuits PD disposed to be closest to the corresponding drive circuit PD that receives the sampling signal, is identified, and the communication result is outputted as the crack data. However, this is provided for illustrative purposes only, and the present disclosure is not limited thereto.

Therefore, only whether the drive circuit, which is disposed at a rightmost end, i.e., disposed in the fifth column, i.e., a last column among the plurality of drive circuits PD, communicates with the drive circuit PD disposed above the corresponding drive circuit PD can be identified, and only the first crack data CDa can be outputted. However, the present disclosure is not limited thereto.

Likewise, only whether the drive circuit PD, which is disposed at an uppermost end, i.e., disposed in the first row among the plurality of drive circuits PD, communicates with the drive circuit PD disposed at the right side of the corresponding drive circuit PD can be identified, and only the second crack data CDb can be outputted. However, the present disclosure is not limited thereto.

Figure 15C:
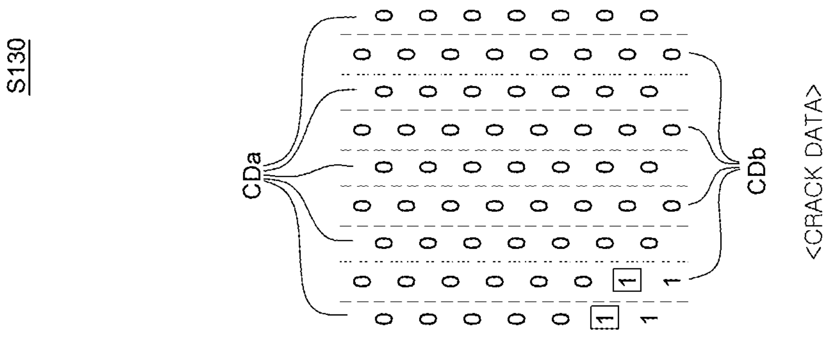
Figure 15C:
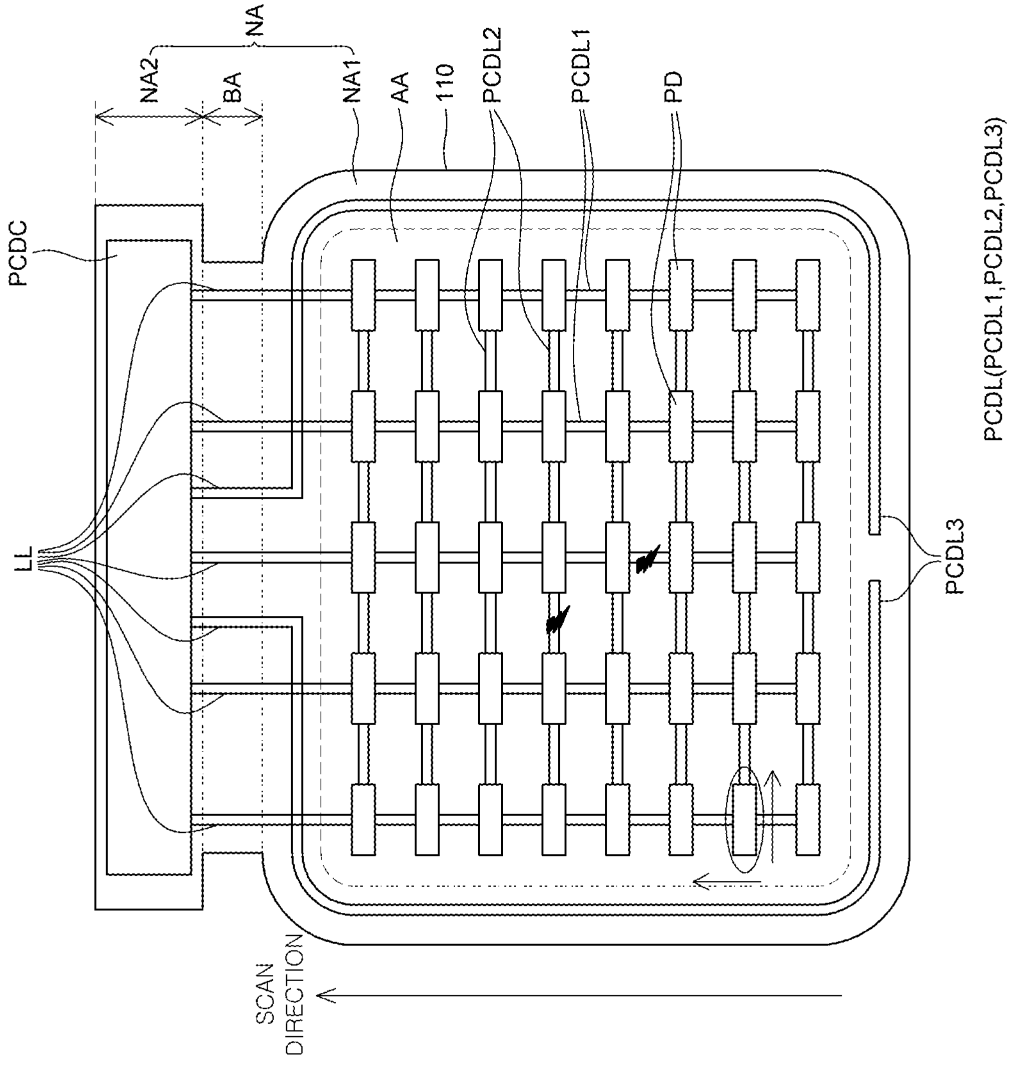

With reference to FIG. 15C, in the crack data transmission step S130, the crack data of the drive circuit PD, which is disposed in the eighth row and the first column, outputted in the drive circuit communication step S120 can be transmitted to the drive circuits PD disposed in the scan direction among the adjacent drive circuits PD. For example, the crack data of the drive circuit PD disposed in the eighth row and the first column can be transmitted to the drive circuit PD disposed in the seventh row and the first column through the first crack detection line PCDL1.

Meanwhile, likewise, whether the drive circuit PD disposed in the seventh row and the first column communicates with the adjacent drive circuit PD can also be identified, and the communication result can be outputted as the crack data.

Specifically, whether the first crack detection line PCDL1 is disconnected, which is determined depending on whether the drive circuit PD disposed in the seventh row and the first column communicates with the drive circuit PD disposed in the sixth row and the first column, can be outputted as the first crack data CDa. In this case, because the first crack detection line PCDL1, which connects the drive circuit PD disposed in the seventh row and the first column and the drive circuit PD disposed in the sixth row and the first column, is not disconnected, the drive circuit PD disposed in the seventh row and the first column can output the first crack data CDa as 1.

In addition, whether the second crack detection line PCDL2 is disconnected, which is determined depending on whether the drive circuit PD disposed in the seventh row and the first column communicates with the drive circuit PD disposed in the seventh row and the second column, can be outputted as the second crack data CDb. In this case, because the second crack detection line PCDL2, which connects the drive circuit PD disposed in the seventh row and the first column and the drive circuit PD disposed in the seventh row and the second column, is not disconnected, the drive circuit PD disposed in the seventh row and the first column can output the second crack data CDb as 1.

Figure 15D:
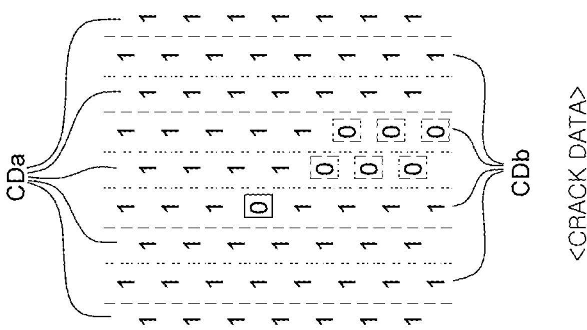
Figure 15D:
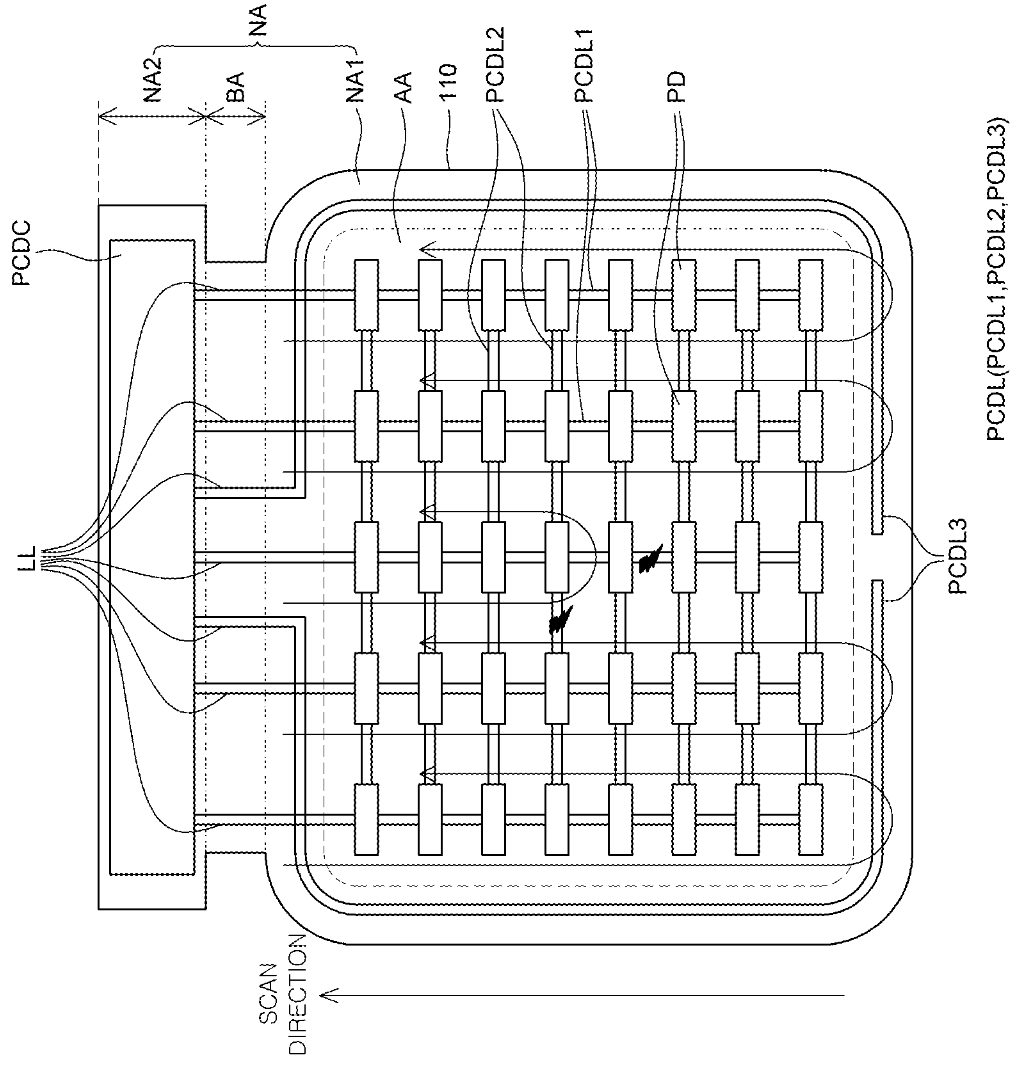

With reference to FIG. 15D, the above-mentioned steps described above with reference to FIGS. 15A to 15C can be repeatedly performed for the respective columns, such that the crack data of the drive circuits PD disposed in the respective columns can be transmitted to the crack detection circuit PCDC through the first crack detection line PCDL1.

For example, because the first crack detection line PCDL1 between the drive circuit PD disposed in the fifth row and the third column and the drive circuit PD disposed in the sixth row and the third column is cracked, the drive circuit disposed in the sixth row and the third column cannot receive the sampling signal from the drive circuit PD disposed in the fifth row and the third column. The drive circuit PD disposed in the seventh row and the third column and the drive circuit PD disposed in the eighth row and the third column cannot receive the sampling signal. As such, because the drive circuit communication step S120 is not performed on the drive circuit PD disposed in the sixth row and the third column, the drive circuit PD disposed in the seventh row and the third column, and the drive circuit PD disposed in the eighth row and the third column, the crack data of the corresponding drive circuits PD cannot be read out. Therefore, both the crack data CDa and CDb of the drive circuit PD disposed in the sixth row and the third column, the drive circuit PD disposed in the seventh row and the third column, and the drive circuit PD disposed in the eighth row and the third column can be indicated as 0.

Meanwhile, because the second crack detection line PCDL2 between the drive circuit PD disposed in the fourth row and the second column and the drive circuit PD disposed in the fourth row and the third column is cracked, the drive circuit PD disposed in the fourth row and the second column and the drive circuit PD disposed in the fourth row and the third column cannot communicate with each other through the second crack detection line PCDL2, such that the drive circuit PD disposed in the fourth row and the second column can output the second crack data CDb as 0 directly in the initialization state.

FIGS. 16A to 16D are views for explaining the steps of the crack detection method identical to that in FIGS. 15A to 15D, and the process diagrams in FIGS. 16A to 16D are different from the process diagrams in FIGS. 15A to 15D only in terms of the scan direction of the crack data.

Figure 16A:
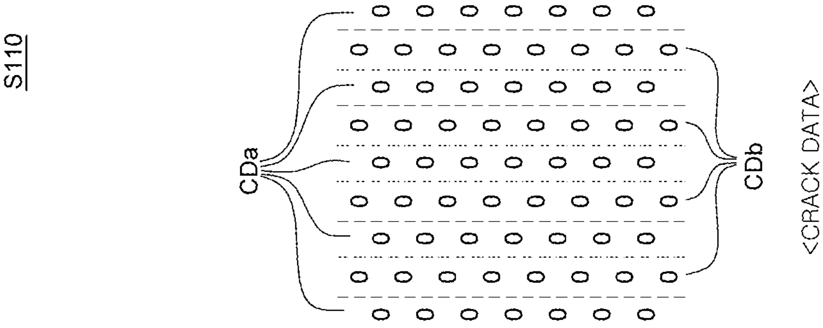
FIGS. 16A to 16E are process diagrams for explaining the method of detecting a crack in the display apparatus according to another embodiment of the present disclosure.
Figure 16A:
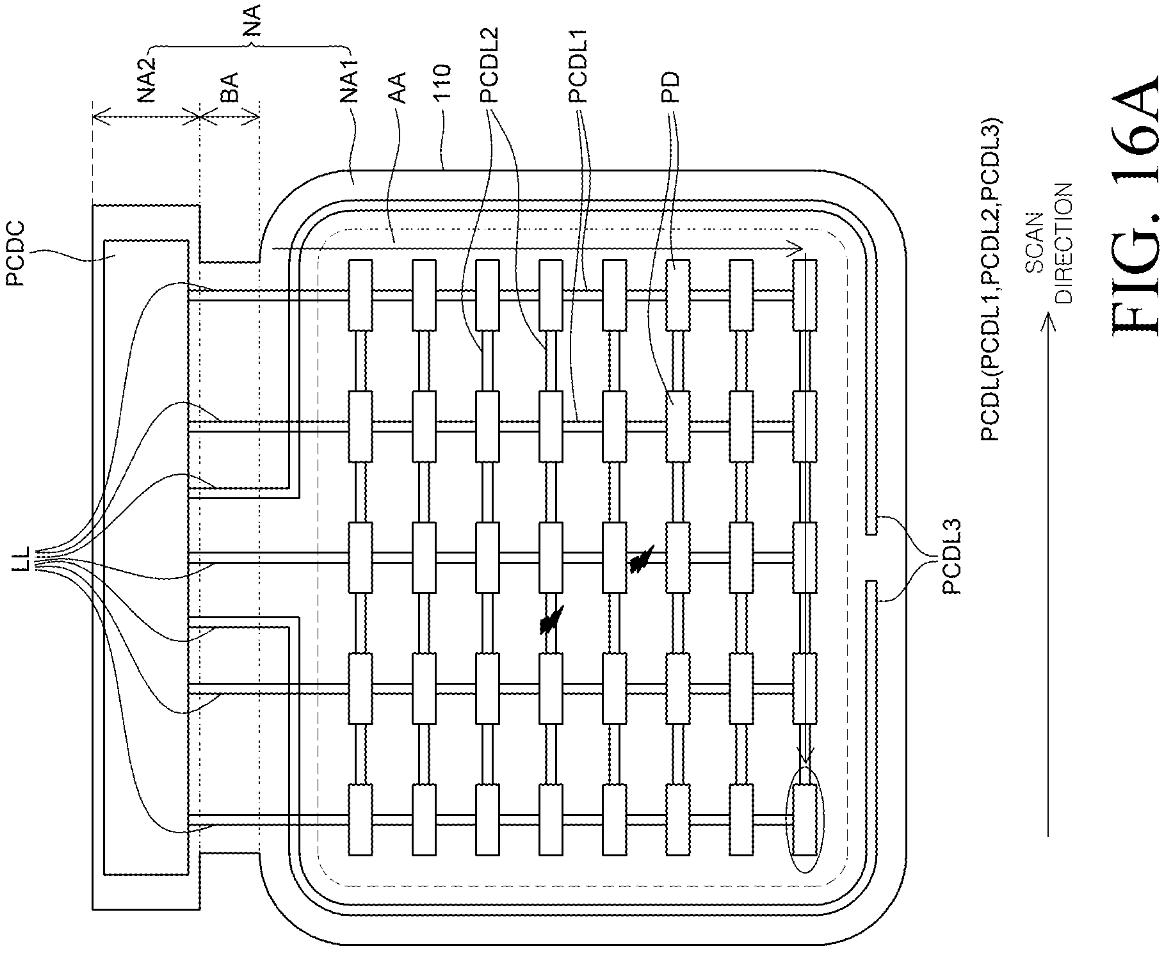

With reference to FIG. 16A, in the sampling signal application step S110, the sampling signal generated by the sampling signal generator 220 of the crack detection circuit PCDC can be applied to the plurality of drive circuits PD through the first crack detection line PCDL1 and the second crack detection line PCDL2.

In this case, the sampling signal can be a signal for scanning the crack data of the plurality of drive circuits PD disposed in the row direction. For example, the sampling signal can be applied through the first crack detection line PCDL1 disposed in the fifth column that is the last column. In this case, the second circuit pad PDP2 of the drive circuit PD disposed in the fifth column can copy the sampling signal applied through the first crack detection line PCDL1 and transmit the sampling signal to the drive circuit PD disposed in the row direction through the second crack detection line PCDL2.

Therefore, the process of scanning the crack data of the drive circuits PD disposed in the row direction can be started sequentially from the crack data of the drive circuit PD disposed in the eighth row and the first column. For example, the scan direction can be a direction from the left side to the right side of the substrate 110. However, the present disclosure is not limited thereto.

Figure 16B:
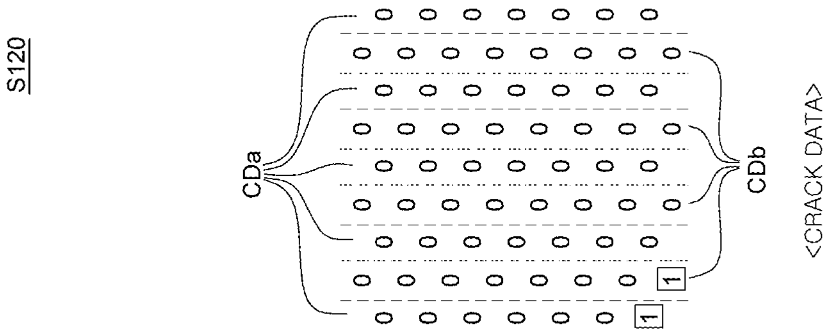
Figure 16B:
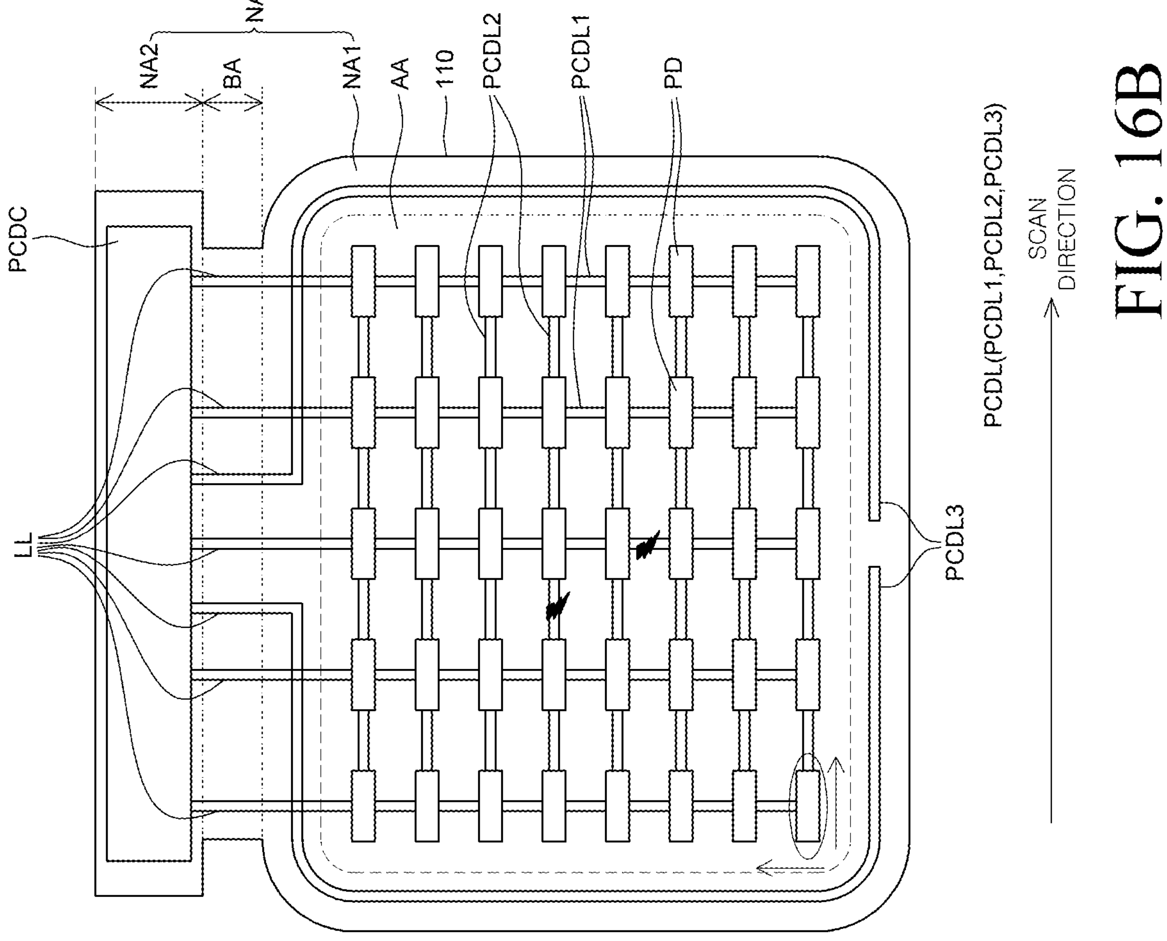

With reference to FIG. 16B, in the drive circuit communication step S120, whether the drive circuit PD, which receives the sampling signal, communicates with the adjacent drive circuit PD can be identified, and the communication result can be outputted as the crack data. For example, whether the first crack detection line PCDL1 and the second crack detection line PCDL2 are disconnected can be identified depending on whether the plurality of drive circuits PD communicate with the adjacent drive circuits PD, such that the plurality of drive circuits PD can output the communication result as the crack data of the first crack detection line PCDL1 and the second crack detection line PCDL2.

For example, the drive circuit PD disposed in the eighth row and the first column can transmit and receive the communication identification signal to and from the drive circuit PD disposed in the seventh row and the first column through the first crack detection line PCDL1 and identify whether the first crack detection line PCDL1, which connects the drive circuit PD disposed in the eighth row and the first column and the drive circuit PD disposed in the seventh row and the first column, is disconnected. In this case, because the corresponding first crack detection line PCDL1 is not disconnected, the drive circuit PD can output the first crack data CDa as 1.

In addition, the drive circuit PD disposed in the eighth row and the first column can transmit and receive the communication identification signal to and from the drive circuit PD disposed in the eighth row and the second column through the second crack detection line PCDL2 and identify whether the second crack detection line PCDL2, which connects the drive circuit PD disposed in the eighth row and the first column and the drive circuit PD disposed in the eighth row and the second column, is disconnected. In this case, because the corresponding second crack detection line PCDL2 is not disconnected, the drive circuit PD can output the second crack data CDb as 1.

Figure 16C:
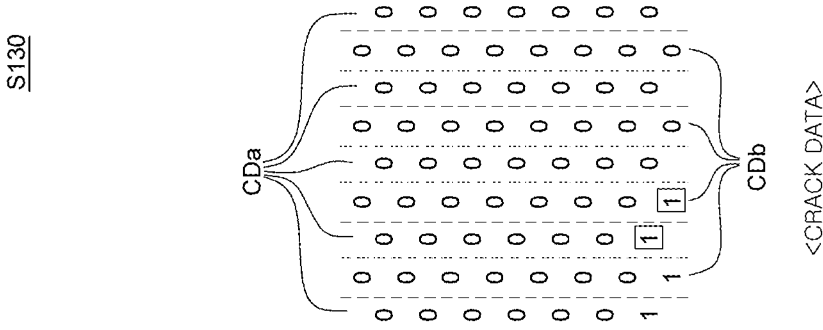
Figure 16C:
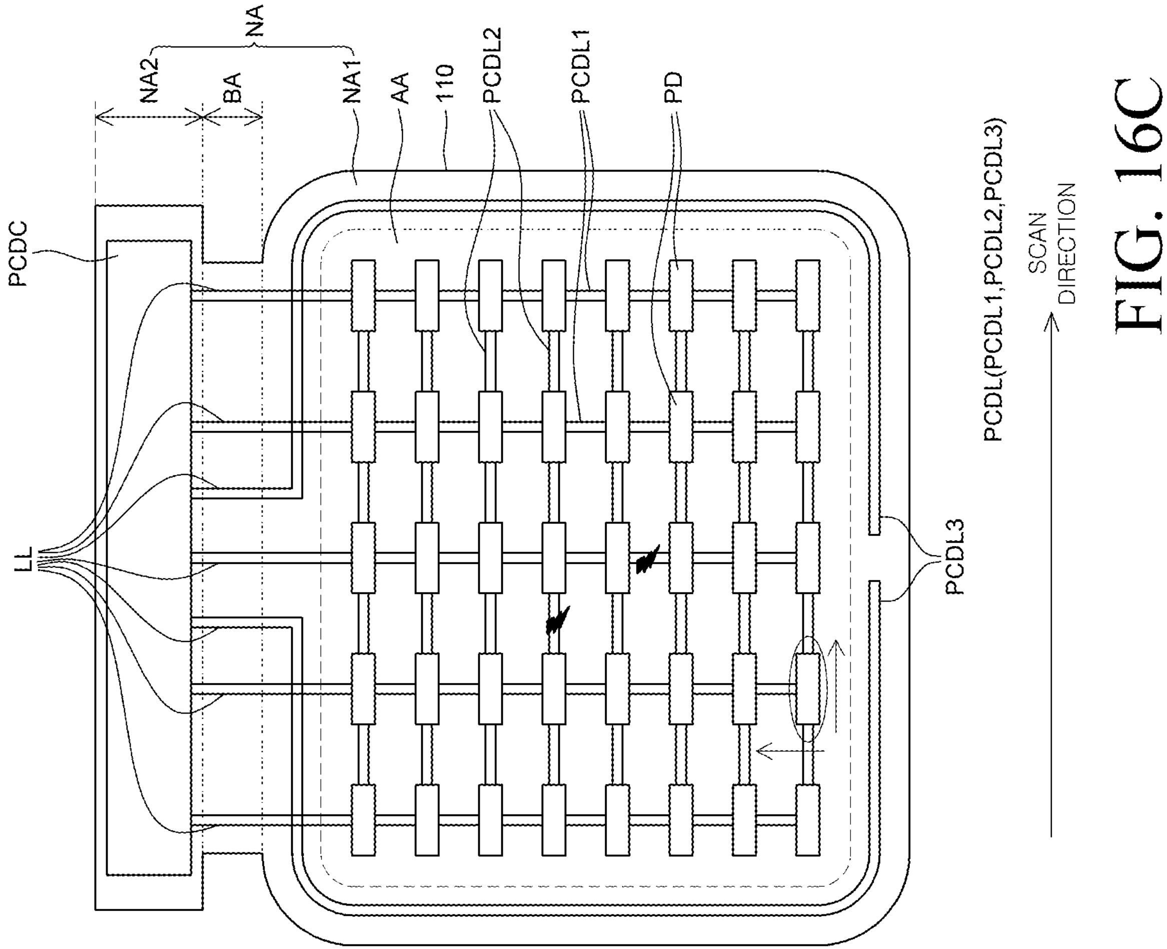

With reference to FIG. 16C, in the crack data transmission step S130, the crack data of the drive circuit PD, which is disposed in the eighth row and the first column, outputted in the drive circuit communication step S120 can be transmitted to the drive circuits PD disposed in the scan direction among the adjacent drive circuits PD. For example, the crack data of the drive circuit PD disposed in the eighth row and the first column can be transmitted to the drive circuit PD disposed in the eighth row and the second column through the second crack detection line PCDL2.

Meanwhile, likewise, whether the drive circuit PD disposed in the eighth row and the second column communicates with the adjacent drive circuit PD can also be identified, and the communication result can be outputted as the crack data.

Specifically, whether the first crack detection line PCDL1 is disconnected, which is determined depending on whether the drive circuit PD disposed in the eighth row and the second column communicates with the drive circuit PD disposed in the seventh row and the second column, can be outputted as the first crack data CDa. In this case, because the first crack detection line PCDL1, which connects the drive circuit PD disposed in the eighth row and the second column and the drive circuit PD disposed in the seventh row and the second column, is not disconnected, the drive circuit PD disposed in the eighth row and the second column can output the first crack data CDa as 1.

In addition, whether the second crack detection line PCDL2 is disconnected, which is determined depending on whether the drive circuit PD disposed in the eighth row and the second column communicates with the drive circuit PD disposed in the eighth row and the third column, can be outputted as the second crack data CDb. In this case, because the second crack detection line PCDL2, which connects the drive circuit PD disposed in the eighth row and the second column and the drive circuit PD disposed in the eighth row and the third column, is not disconnected, the drive circuit PD disposed in the eighth row and the second column can output the second crack data CDb as 1.

Figure 16D:
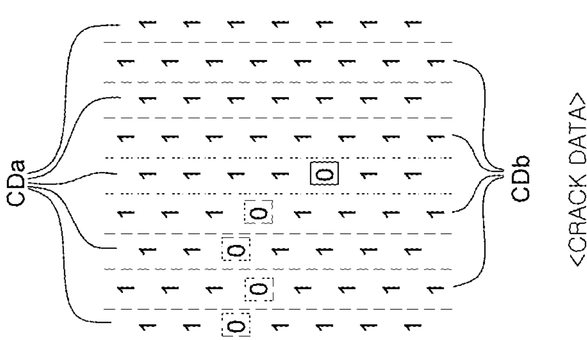
Figure 16D:
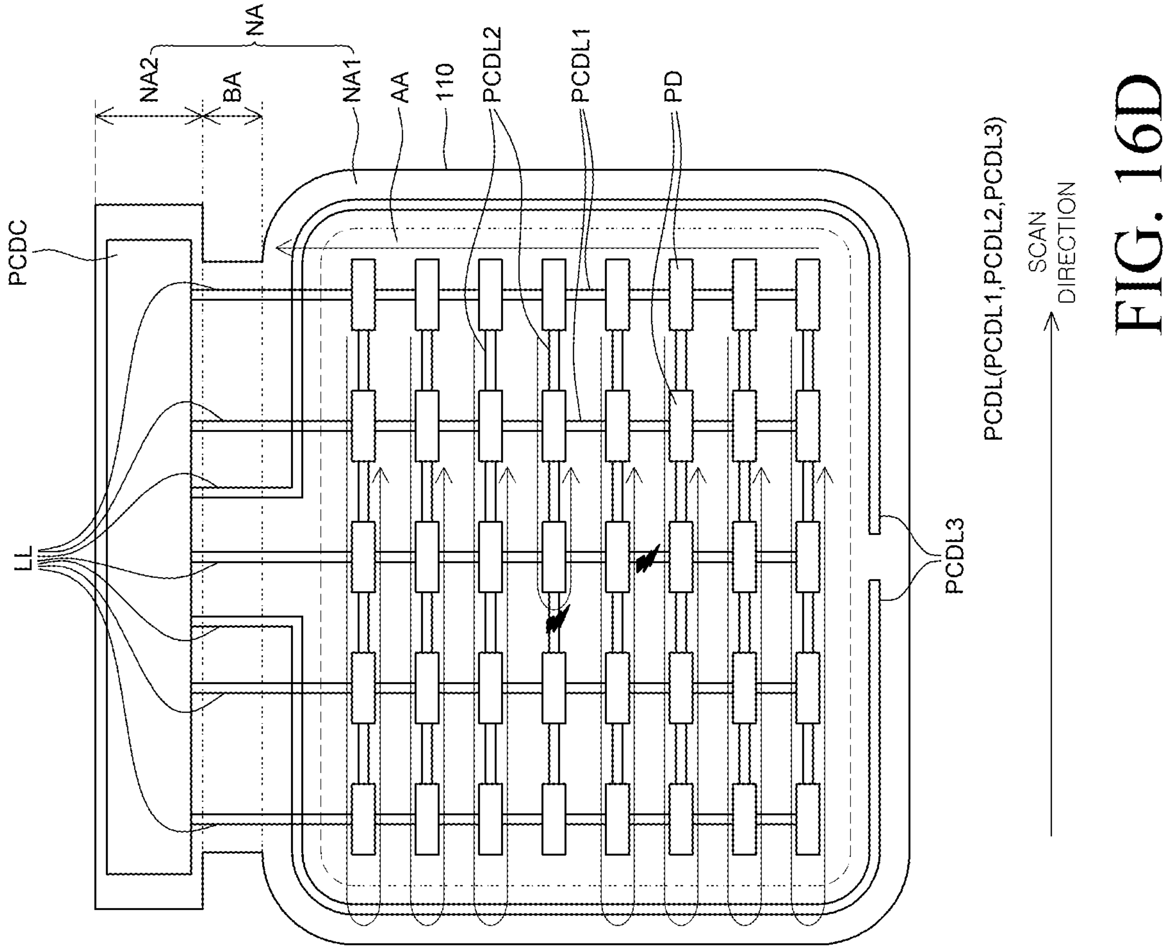
Figure 16E:
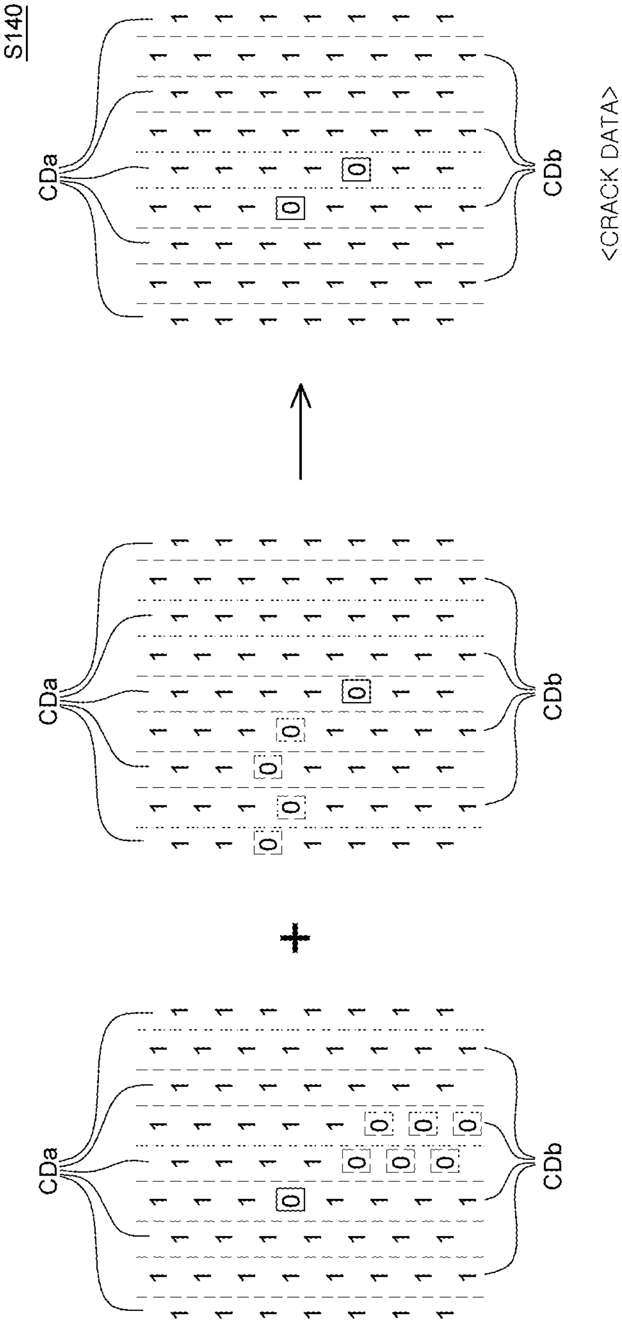
Figure 17:
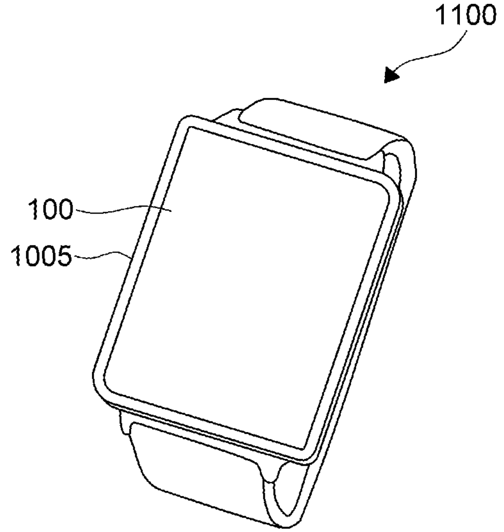
FIGS. 17 to 20 are views illustrating apparatuses to which the display apparatus according to the embodiments of the present disclosure are applied.
Figure 18:
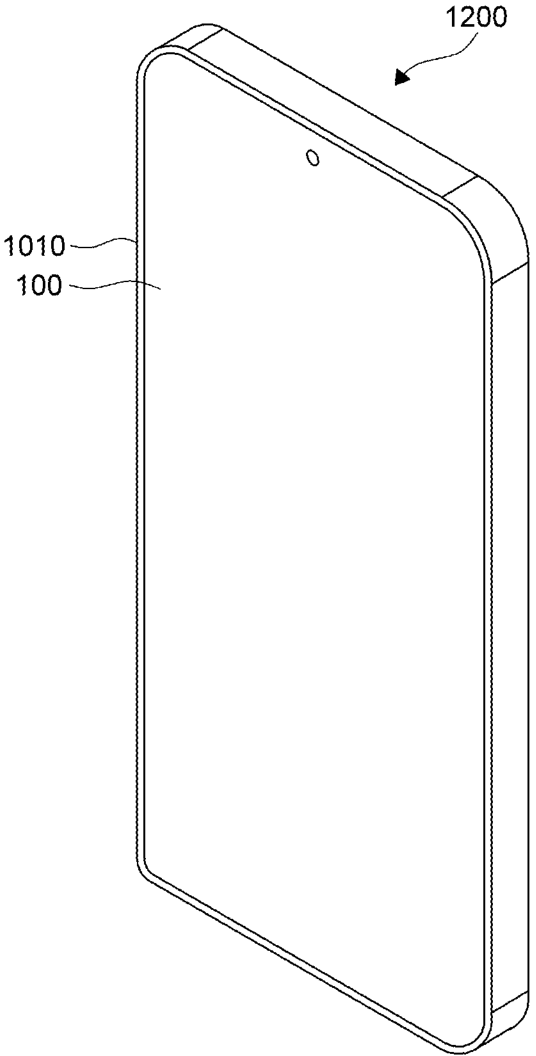
Figure 19:
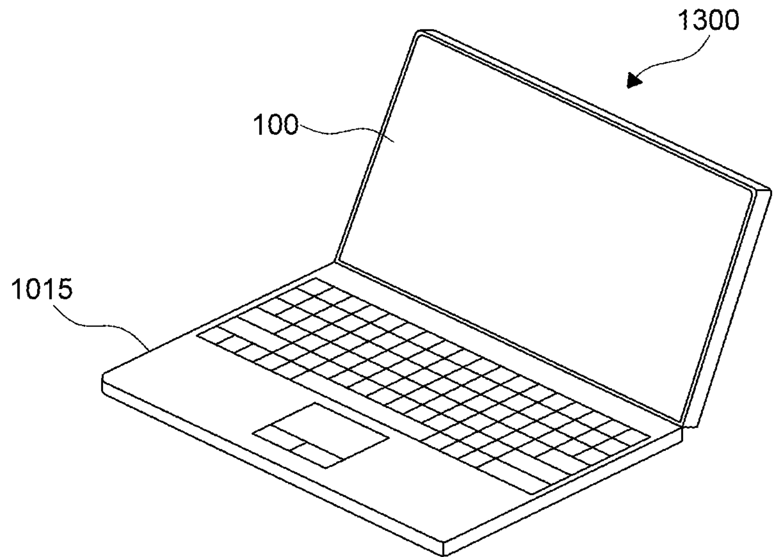
Figure 20:
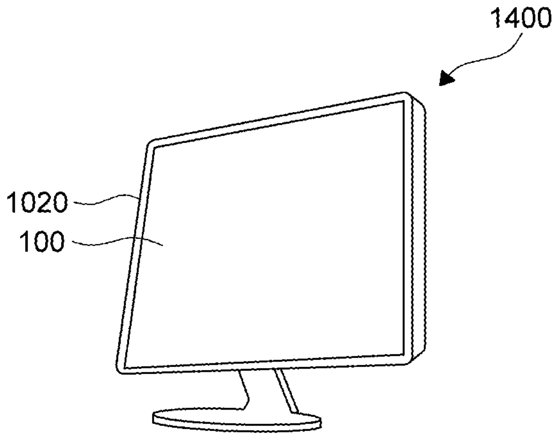

With reference to FIG. 16D, the above-mentioned steps described above with reference to FIGS. 16A to 16C can be repeatedly performed for the respective rows, such that the crack data of the drive circuits PD disposed in the respective rows can be transmitted to the crack detection circuit PCDC through the first crack detection line PCDL1.

For example, because the second crack detection line PCDL2 between the drive circuit PD disposed in the fourth row and the second column and the drive circuit PD disposed in the fourth row and the third column is cracked, the drive circuit PD disposed in the fourth row and the second column cannot receive the sampling signal from the drive circuit PD disposed in the fourth row and the third column. Therefore, the drive circuit PD disposed in the fourth row and the first column cannot receive the sampling signal. Therefore, because the drive circuit communication step S120 is not performed on the drive circuit PD disposed in the fourth row and the first column and the drive circuit PD disposed in the fourth row and the second column, the crack data of the corresponding drive circuits PD cannot be read out. Therefore, both the crack data CDa and CDb of the drive circuit PD disposed in the fourth row and the first column and the drive circuit PD disposed in the fourth row and the second column can be indicated as 0. Meanwhile, because the first crack detection line PCDL1 between the drive circuit PD disposed in the fifth row and the third column and the drive circuit PD disposed in the sixth row and the third column is cracked, the drive circuit PD disposed in the fifth row and the third column and the drive circuit PD disposed in the sixth row and the third column cannot communicate with each other through the first crack detection line PCDL1, such that the crack data CDa of the drive circuit PD disposed in the sixth row and the third column can be indicated as 0.

With reference to FIG. 16E, in the crack detection step S140, whether the first crack detection line PCDL1 and the second crack detection line PCDL2 are cracked can be determined by reading out the crack data by the crack detection circuit PCDC.

Specifically, in the crack detection step S140, the crack data of the display apparatus 2000 can be completely created by combining the crack data scanned in the column direction as illustrated in FIGS. 15A to 15D and the crack data scanned in the row direction as illustrated in FIGS. 16A to 16D.

Therefore, it is possible to recognize the crack data of the drive circuit PD that cannot receive the sampling signal in the scan direction. For example, the crack data of the drive circuit PD disposed in the sixth row and the third column, the drive circuit PD disposed in the seventh row and the third column, and the drive circuit PD disposed in the eighth row and the third column, which are not detected by the scan in the column direction, can be recognized by means of the crack data detected by the scan in the row direction.

Likewise, the crack data of the drive circuit PD disposed in the fourth row and the first column and the drive circuit PD disposed in the fourth row and the second column, which are not detected by the scan in the row direction, can be recognized by means of the crack data detected by the scan in the column direction.

Therefore, the crack detection circuit PCDC can combine and read out the crack data scanned in the different directions, thereby recognizing whether the first crack detection line PCDL1 and the second crack detection line PCDL2 are disconnected. For example, the crack detection circuit PCDC can read out the crack data, thereby detecting whether the first crack detection line PCDL1 and the second crack detection line PCDL2 disposed between the particular drive circuits PD are cracked. As can be seen from FIG. 16E, the crack data scanned along the column direction (the crack data on the left side of FIG. 16E) and the crack data scanned along the row direction (the crack data in the middle of FIG. 16E) are subjected to an "OR" operation. Only when the crack data of a specific drive circuit PD is 0 in both the crack data scanned along the column direction and the crack data scanned along the row direction, will it be indicated as 0 in the combined crack data (the crack data on the right side of FIG. 16E). In this case, on the basis of position information of the drive circuits PD, it is possible to recognize the positions of the cracked first crack detection line PCDL1 and the cracked second crack detection line PCDL2, which can improve the crack detectability. As shown in FIG. 16E, in the combined crack data, the position where the crack data CDa is 0 indicates that first crack detection line PCDL1 between the drive circuit PD disposed in the fifth row and third column and the drive circuit PD disposed in the sixth row and third column is cracked, and the position where the crack data CDb is 0 indicates that the second crack detection line PCDL2 between the drive circuit PD disposed in the fourth row and second column and the drive circuit PD disposed in the fourth row and third column is cracked.

The display apparatus can be cracked by an external impact or the like during the process of manufacturing the display apparatus. For example, because the non-display area disposed at the edge of the display apparatus is vulnerable to an external impact or the like, the non-display area can be easily cracked. In this case, the crack formed in the non-display area can propagate toward the display area. For this reason, impurities can permeate into the display area through the crack, which can degrade the reliability of the display apparatus.

Therefore, various methods can be used to detect a crack in the display apparatus. For example, the crack detection lines connected to the drive IC of the flexible circuit board can be disposed in the non-display area. Therefore, whether the crack detection line is cracked can be determined depending on the feedback of the signal applied to the crack detection line from the drive IC of the flexible circuit board. For example, whether a crack occurs can be determined depending on whether the signal applied to one end of the crack detection line from the drive IC of the flexible circuit board is outputted back to the drive IC of the flexible circuit board through the other end of the crack detection line. However, in this case, there is a limitation in that only whether the crack detection line is cracked can be detected, but a position at which a crack occurs cannot be detected.

Furthermore, there is a problem in that a crack occurring in the display area cannot be detected in case that the crack detection line is disposed only in the non-display area.

Therefore, in the display apparatus 2000 according to another embodiment of the present disclosure, at least some of the plurality of crack detection lines PCDL, e.g., the first crack detection line PCDL1 and the second crack detection line PCDL2 can be disposed in the display area AA. In this case, the first crack detection line PCDL1 and the second crack detection line PCDL2 can be electrically connected to the drive circuit PD. Therefore, in case that the first crack detection line PCDL1 and the second crack detection line PCDL2 are cracked, not only whether the crack occurs can be recognized, but also a position at which the crack occurs can be recognized on the basis of the position of the drive circuit PD. Specifically, the first crack detection line PCDL1 and the second crack detection line PCDL2 can electrically connect the adjacent drive circuits PD and serve as communication networks between the adjacent drive circuits PD. Therefore, whether the first crack detection line PCDL1 and the second crack detection line PCDL2, which connect the drive circuits PD, are disconnected, i.e., cracked can be recognized on the basis of whether the adjacent drive circuits PD communicate with each other. For example, the first crack detection line PCDL1 can electrically connect the plurality of drive circuits PD disposed in the column direction, and the second crack detection line PCDL2 can electrically connect the plurality of drive circuits PD disposed in the row direction. In this case, the drive circuit PD can determine whether the first crack detection line PCDL1 is cracked on the basis of the communication result between the drive circuits PD adjacent to each other in the column direction, and the drive circuit PD can output the determination result as the first crack data CDa. In addition, the drive circuit PD can determine whether the second crack detection line PCDL2 is cracked on the basis of the communication result between the drive circuits PD adjacent to each other in the row direction, and the drive circuit PD can output the determination result as the second crack data CDb. The above-mentioned crack data can be transmitted to the crack detection circuit PCDC disposed on the flexible circuit board FCB. Therefore, the crack detection circuit PCDC can read out the crack data, thereby detecting whether the first crack detection line PCDL1 and the second crack detection line PCDL2 disposed between the particular drive circuits PD are cracked. Therefore, on the basis of position information of the drive circuits PD, it is possible to recognize the positions of the cracked first crack detection line PCDL1 and the cracked second crack detection line PCDL2. Therefore, in the display apparatus 2000 according to another embodiment of the present disclosure, a crack occurring in the display area AA as well as the non-display area NA can be detected, and even a position at which a crack occurs can be easily recognized. For example, in the display apparatus 2000 according to another embodiment of the present disclosure, the crack detectability can be improved.

FIGS. 17 to 20 are views illustrating apparatuses to which the display apparatus according to the embodiments of the present disclosure are applied.

Referring to FIGS. 17 to 20, the display apparatus 1000 and 2000 according to the example embodiments of the present disclosure can be included in various apparatuses or electronic apparatuses. For example, various electronic apparatuses can include a wearable device 1100, a mobile device 1200, a laptop 1300, and a monitor, or TV 1400, but the example embodiments of the present disclosure are not limited thereto.

Each of the wearable device 1100, the mobile device 1200, the laptop 1300, and the monitor or the TV 1400 can include case parts 1005, 1010, 1015, and 1020 and the display panel 100 and the display apparatus 1000 and 2000 according to the example embodiments of the present disclosure described in FIGS. 1 to 16E.

For example, the display apparatus according to an example embodiment of the present disclosure can be applied to a mobile device, a video phone, a smart watch, a watch phone, a wearable apparatus, a foldable apparatus, a rollable apparatus, a bendable apparatus, a flexible apparatus, a curved apparatus, a sliding apparatus, a variable apparatus, an electronic notebook, an electronic book, a portable multimedia player (PMP), a personal digital assistant (PDA), an MP3 player, a mobile medical apparatus, a desktop PC, a laptop PC, a netbook computer, a workstation, a navigation system, a vehicle display apparatus, a theater display apparatus, a television, a wallpaper apparatus, a signage apparatus, a game console, a laptop, a monitor, a camera, a camcorder, home appliances, etc.

The example embodiments of the present disclosure can also be described as follows:

According to an aspect of the present disclosure, there is provided a display apparatus. The display apparatus includes a substrate including a display area, and a non-display area configured to surround the display area, a plurality of drive circuits disposed in the form of a matrix on the substrate in the display area, a plurality of insulation layers disposed on the plurality of drive circuits, a plurality of banks disposed on the plurality of insulation layers in the display area, a plurality of micro-LEDs disposed on the banks, a plurality of first crack detection lines disposed on the plurality of drive circuits in the display area and extending in a first direction and a plurality of second crack detection lines disposed on the plurality of drive circuits in the display area and extending in a second direction intersecting the first direction. The plurality of first crack detection lines electrically connects the plurality of drive circuits disposed in the first direction. The plurality of second crack detection lines electrically connects the plurality of drive circuits disposed in the second direction.

The plurality of drive circuits can include a plurality of circuit pads including a plurality of first circuit pads and a plurality of second circuit pads. The plurality of first crack detection lines can be electrically connected to the first circuit pads. The plurality of second crack detection lines can be electrically connected to the second circuit pads.

The plurality of circuit pads can further include one or more third circuit pads electrically connected to the plurality of micro-LEDs. The plurality of first crack detection lines and the plurality of second crack detection lines can be insulated from the third circuit pad.

The display apparatus can further include a first connection line, a second connection line on the first connection line, and a third connection line on the second connection line that connect the one or more third circuit pads and the plurality of micro-LEDs in the display area. The plurality of first crack detection lines can be disposed on the same layer and can be made of the same material as the second connection line. The plurality of second crack detection lines can be disposed on the same layer and can be made of the same material as the third connection line.

The display apparatus can further include a crack detection circuit disposed on the plurality of insulation layers in the non-display area and connected to the plurality of first crack detection lines. The crack detection circuit can include a crack detector configured to detect whether the plurality of first crack detection lines and the plurality of second crack detection lines is cracked.

The plurality of drive circuits each can output crack data determined depending on whether the plurality of first crack detection lines and the plurality of second crack detection lines is disconnected.

The plurality of drive circuits each can transmit the crack data to the adjacent drive circuit through the plurality of first crack detection lines and the plurality of second crack detection lines.

The plurality of first crack detection lines can transmit the crack data of the plurality of drive circuits to the crack detector of the crack detection circuit.

The display apparatus can further include a link line disposed on the plurality of insulation layers in the non-display area. The plurality of first crack detection lines can be connected to the crack detection circuit through the link line.

The display apparatus can further include a plurality of third crack detection lines disposed on the substrate in the non-display area and disposed along at least a part of the display area.

The plurality of first crack detection lines, the plurality of second crack detection lines, and the plurality of third crack detection lines each can have a loop shape.

The plurality of micro-LEDs each can include an anode electrode, a first semiconductor layer disposed on the anode electrode, an active layer disposed on the first semiconductor layer, a second semiconductor layer disposed on the active layer and a cathode electrode disposed on the second semiconductor layer.

The display apparatus can further include a first electrode disposed below the plurality of micro-LEDs and configured to electrically connect the plurality of drive circuits and the anode electrodes of the plurality of micro-LEDs and a solder pattern disposed between the first electrode and the anode electrode. The first electrode and the anode electrode can be electrically connected by eutectic bonding using the solder pattern.

According to another aspect of the present disclosure, there is provided a method of detecting a crack in a display apparatus. The method of detecting a crack in a display apparatus includes a sampling signal application step of transmitting a sampling signal of a crack detection circuit to a plurality of drive circuits disposed in a display area of a display panel, a drive circuit communication step of identifying whether the plurality of drive circuits, which receive the sampling signal, each communicate with the adjacent drive circuit connected by the crack detection line and outputting a communication result as crack data, a crack data transmission step of transmitting the crack data to the adjacent drive circuit disposed in at least any one of a row direction and a column direction and a crack detection step of transmitting the crack data to the crack detection circuit so that the crack detection circuit reads out the crack data and detects a crack occurring in the display area.

The plurality of drive circuits each can include a communicator configured to identify whether the drive circuit communicates with the adjacent drive circuit. The drive circuit communication step can include transmitting a communication identification signal, which is generated by the communicator, to the adjacent drive circuit through the crack detection line.

The drive circuit communication step can include identifying whether a corresponding drive circuit of the plurality of drive circuits communicate with at least one of the drive circuit disposed to be closest to the corresponding drive circuits in the same row and the same column.

The drive circuit communication step can include identifying whether a drive circuit disposed in an x-th row and a y-th column (here, x and y are natural numbers) among the plurality of drive circuits communicates with a drive circuit disposed in an (x−1)th row and the y-th column and communicates with a drive circuit disposed in the x-th row and a (y+1)th column.

The drive circuit communication step can include identifying only whether some of the drive circuits, which are disposed in a first row or a last row among the plurality of drive circuits, communicate with any one of the drive circuit disposed to be closest to the drive circuit in the same row and identifying only whether some of the drive circuit, which are disposed in a last column among the plurality of drive circuits, communicate with any one of the drive circuit disposed to be closest to the drive circuit on the same column.

The plurality of drive circuits each can include a data manager configured to output the communication result with the adjacent drive circuit as the crack data. The drive circuit communication step can include outputting, by the data manager, the crack data as 1 when the communication with the adjacent drive circuit is possible and outputting, by the data manager, the crack data as 0 when the communication with the adjacent drive circuit is not possible (e.g., impossible).

The crack detection circuit can include a crack detector configured to detect a crack occurring in the display area. The crack detection step can include reading out, by the crack detector, the crack data and detecting whether the crack detection line is cracked.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure.

What is claimed is:

1. A display apparatus comprising:

a substrate including a display area and a non-display area outside the display area;

a plurality of drive circuits disposed in a matrix form on the substrate in the display area;

a plurality of insulation layers disposed on the plurality of drive circuits;

a plurality of banks disposed on the plurality of insulation layers in the display area;

a plurality of micro-light emitting didoes (micro-LEDs) disposed on the plurality of banks;

a plurality of first crack detection lines disposed on the plurality of drive circuits in the display area and extending in a first direction; and a plurality of second crack detection lines disposed on the plurality of drive circuits in the display area and extending in a second direction intersecting the first direction, wherein the plurality of first crack detection lines electrically connects the plurality of drive circuits disposed in the first direction, and wherein the plurality of second crack detection lines electrically connects the plurality of drive circuits disposed in the second direction.

2. The display apparatus of claim 1, wherein the plurality of drive circuits includes a plurality of circuit pads including a plurality of first circuit pads and a plurality of second circuit pads, wherein the plurality of first crack detection lines is electrically connected to the plurality of first circuit pads, and wherein the plurality of second crack detection lines is electrically connected to the plurality of second circuit pads.

3. The display apparatus of claim 2, wherein the plurality of circuit pads further includes one or more third circuit pads electrically connected to the plurality of micro-LEDs, and wherein the plurality of first crack detection lines and the plurality of second crack detection lines are insulated from the one or more third circuit pads.

4. The display apparatus of claim 3, further comprising:

a first connection line, a second connection line on the first connection line, and a third connection line on the second connection line that connect the one or more third circuit pads and the plurality of micro-LEDs in the display area, wherein the plurality of first crack detection lines is disposed on a same layer and made of a same material as the second connection line, and wherein the plurality of second crack detection lines is disposed on a same layer and made of a same material as the third connection line.

5. The display apparatus of claim 1, further comprising:
a crack detection circuit disposed on the plurality of insulation layers in the non-display area and connected to the plurality of first crack detection lines,
wherein the crack detection circuit includes a crack detector configured to detect whether at least one of the plurality of first crack detection lines and the plurality of second crack detection lines is cracked.

6. The display apparatus of claim 5, wherein each of the plurality of drive circuits outputs crack data determined depending on whether the plurality of first crack detection lines and the plurality of second crack detection lines is disconnected.

7. The display apparatus of claim 6, wherein each of the plurality of drive circuits transmits the crack data to an adjacent drive circuit through the plurality of first crack detection lines and the plurality of second crack detection lines.

8. The display apparatus of claim 6, wherein the plurality of first crack detection lines transmits the crack data of the plurality of drive circuits to the crack detector of the crack detection circuit.

9. The display apparatus of claim 5, further comprising:
a link line disposed on the plurality of insulation layers in the non-display area,
wherein the plurality of first crack detection lines is connected to the crack detection circuit through the link line.

10. The display apparatus of claim 1, further comprising:
a plurality of third crack detection lines disposed on the substrate in the non-display area and disposed along at least a part of the display area.

11. The display apparatus of claim 10, wherein each of the plurality of first crack detection lines, the plurality of second crack detection lines, and the plurality of third crack detection lines has a loop shape.

12. The display apparatus of claim 1, wherein each of the plurality of micro-LEDs includes:
an anode electrode;
a first semiconductor layer disposed on the anode electrode;
an active layer disposed on the first semiconductor layer;
a second semiconductor layer disposed on the active layer; and
a cathode electrode disposed on the second semiconductor layer.

13. The display apparatus of claim 12, further comprising:
a first electrode disposed below the plurality of micro-LEDs and configured to electrically connect the plurality of drive circuits and the anode electrodes of the plurality of micro-LEDs; and
a solder pattern disposed between the first electrode and the anode electrode,
wherein the first electrode and the anode electrode are electrically connected by eutectic bonding using the solder pattern.

14. A method of detecting a crack in a display apparatus, the method comprising:
a sampling signal application step of transmitting a sampling signal of a crack detection circuit to a plurality of drive circuits disposed in a display area of a display panel;
a drive circuit communication step of identifying whether each of the plurality of drive circuits, which receive the sampling signal, communicates with an adjacent drive circuit connected by a crack detection line and outputting a communication result as crack data;
a crack data transmission step of transmitting the crack data to the adjacent drive circuit disposed in at least one of a row direction and a column direction; and
a crack detection step of transmitting the crack data to the crack detection circuit so that the crack detection circuit reads out the crack data and detects a crack occurring in the display area.

15. The method of claim 14, wherein each of the plurality of drive circuits includes a communicator configured to identify whether the drive circuit communicates with the adjacent drive circuit, and
wherein the drive circuit communication step includes transmitting a communication identification signal, which is generated by the communicator, to the adjacent drive circuit through the crack detection line.

16. The method of claim 14, wherein the drive circuit communication step includes:
identifying whether a corresponding drive circuit of the plurality of drive circuits communicates with at least one of the drive circuit disposed to be closest to the corresponding drive circuit in a same row and a same column.

17. The method of claim 16, wherein the drive circuit communication step includes:
identifying whether a drive circuit disposed in an x-th row and a y-th column among the plurality of drive circuits communicates with a drive circuit disposed in an (x−1)th row and the y-th column and communicates with a drive circuit disposed in the x-th row and a (y+1)th column, wherein x and y are natural numbers.

18. The method of claim 16, wherein the drive circuit communication step includes:
identifying only whether some of the drive circuits, which are disposed in a first row or a last row among the plurality of drive circuits, communicate with any one of the drive circuit disposed to be closest to the drive circuit in the same row; and
identifying only whether some of the drive circuits, which are disposed in a last column among the plurality of drive circuits, communicate with any one of the drive circuit disposed to be closest to the drive circuit in the same column.

19. The method of claim 14, wherein each of the plurality of drive circuits includes a data manager configured to output the communication result with the adjacent drive circuit as the crack data, and
wherein the drive circuit communication step includes:
outputting, by the data manager, the crack data as 1 when the communication with the adjacent drive circuit is possible; and
outputting, by the data manager, the crack data as 0 when the communication with the adjacent drive circuit is not possible.

20. The method of claim 14, wherein the crack detection circuit includes a crack detector configured to detect a crack occurring in the display area, and
wherein the crack detection step includes reading out, by the crack detector, the crack data and detecting whether the crack detection line is cracked.

* * * * *